(12) United States Patent
Toyoda et al.

(10) Patent No.: US 8,847,305 B2
(45) Date of Patent: Sep. 30, 2014

(54) SEMICONDUCTOR DEVICE AND MANUFACTURING METHOD THEREOF

(71) Applicant: Fuji Electric Co., Ltd., Kawasaki (JP)

(72) Inventors: Yoshiaki Toyoda, Matsumoto (JP); Akio Kitamura, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 20 days.

(21) Appl. No.: 13/717,038

(22) Filed: Dec. 17, 2012

(65) Prior Publication Data

US 2013/0126967 A1   May 23, 2013

Related U.S. Application Data

(63) Continuation of application No. PCT/JP2011/062550, filed on May 31, 2011.

(30) Foreign Application Priority Data

Jun. 17, 2010   (JP) ................................ 2010-138238

(51) Int. Cl.
| | |
|---|---|
| H01L 29/06 | (2006.01) |
| H01L 29/78 | (2006.01) |
| H01L 21/8234 | (2006.01) |
| H01L 27/088 | (2006.01) |
| H01L 21/761 | (2006.01) |
| H01L 29/66 | (2006.01) |
| H01L 29/08 | (2006.01) |
| H01L 29/10 | (2006.01) |

(52) U.S. Cl.
CPC .......... *H01L 21/761* (2013.01); *H01L 29/7802* (2013.01); *H01L 29/0634* (2013.01); *H01L 29/0878* (2013.01); *H01L 21/823481* (2013.01); *H01L 29/1095* (2013.01); *H01L 27/088* (2013.01); *H01L 29/7813* (2013.01); *H01L 29/66712* (2013.01); *H01L 21/823487* (2013.01)
USPC .... 257/329; 257/334; 257/500; 257/E29.262; 438/419

(58) Field of Classification Search
CPC . H01L 21/761; H01L 27/088; H01L 27/0634; H01L 27/66712
USPC ........... 257/334, 329, 500, E29.262; 438/419
See application file for complete search history.

(56) References Cited

U.S. PATENT DOCUMENTS 5,272,098 A * 12/1993 Smayling et al. ............. 438/268
5,525,824 A *  6/1996 Himi et al. .................... 257/370

(Continued)

FOREIGN PATENT DOCUMENTS

| JP | 07-169827 A |  7/1995 |
|---|---|---|
| JP | 07-321214 A | 12/1995 |

(Continued)

OTHER PUBLICATIONS

International Search Report issued Aug. 30, 2011 for parent PCT/JP2011/062550.

(Continued)

*Primary Examiner* — Allan R Wilson

(74) *Attorney, Agent, or Firm* — Rossi, Kimms & McDowell LLP

(57) ABSTRACT

A vertical super junction MOSFET and a lateral MOSFET are integrated on the same semiconductor substrate. The lateral MOSFET is electrically isolated from the vertical super junction MOSFET by an n-buried isolating layer and an n-diffused isolating layer. The lateral MOSFET is formed of a p-well region formed in an n⁻semiconductor layer bounded by the n-buried isolating layer and n-diffused isolating layer, an n-source region and n-drain region formed in the p-well region, and a gate electrode that covers a portion of the p-well region sandwiched by the n-source region and n-drain region. As the n-buried isolating layer is formed at the same time as an n-layer (3) of the vertical super junction MOSFET, it is possible to reduce cost. Also, it is possible to suppress parasitic action between the elements with the n-buried isolating layer.

6 Claims, 33 Drawing Sheets

(56) References Cited

U.S. PATENT DOCUMENTS

| | | | |
|---|---|---|---|
| 5,591,662 | A | 1/1997 | Zambrano |
| 6,551,909 | B1 | 4/2003 | Fujihira |
| 6,611,021 | B1 | 8/2003 | Onishi et al. |
| 6,683,347 | B1 | 1/2004 | Fujihira |
| 6,696,728 | B2 * | 2/2004 | Onishi et al. .................. 257/341 |
| 2005/0045922 | A1 | 3/2005 | Ahlers et al. |
| 2005/0116313 | A1 * | 6/2005 | Lee et al. ...................... 257/500 |
| 2005/0156235 | A1 | 7/2005 | Fujihira |
| 2006/0231915 | A1 * | 10/2006 | Hshieh et al. ................. 257/491 |
| 2007/0001194 | A1 | 1/2007 | Ono et al. |
| 2009/0079002 | A1 * | 3/2009 | Lee et al. ...................... 257/355 |
| 2012/0273875 | A1 * | 11/2012 | Yedinak et al. ............... 257/330 |

FOREIGN PATENT DOCUMENTS

| | | |
|---|---|---|
| JP | 08-204017 A | 8/1996 |
| JP | 2000-040822 A | 2/2000 |
| JP | 2000-286417 A | 10/2000 |
| JP | 2001-119022 A | 4/2001 |
| JP | 2007-012858 A | 1/2007 |
| JP | 3988262 B2 | 10/2007 |

OTHER PUBLICATIONS

Chinese Office Action in Chinese counterpart application No. CN201180029607.7, dated May 27, 2014. Partial English translation provided.

* cited by examiner

US 8,847,305 B2

SEMICONDUCTOR DEVICE AND MANUFACTURING METHOD THEREOF

BACKGROUND OF THE INVENTION

A. Field of the Invention

The present invention relates to a semiconductor device, and to a manufacturing method thereof.

B. Description of the Related Art

A vertical semiconductor element is such that current flows between an electrode provided on one main surface of a semiconductor substrate and an electrode provided on the main surface (the other main surface) on the side of the semiconductor substrate opposite to the one main surface. Because of this, in order to maintain a high breakdown voltage in the vertical semiconductor element, it is necessary to increase the thickness of a high resistance semiconductor layer existing between the electrodes. However, by increasing the thickness of the high resistance semiconductor layer existing between the electrodes, the on-state resistance increases. That is, there is a trade-off relationship between breakdown voltage and on-state resistance.

A semiconductor element with a super junction structure, wherein a pn-junction (a parallel pn-layer) in which an n-layer and a p-layer are repeatedly alternately disposed is formed in a drift layer, has been proposed as a way of improving the trade-off. The parallel pn-layer causes current to flow through the n-layer in an on-state, and withstands the breakdown voltage in an off-state by depleting the n-layer and p-layer. As a semiconductor element with a super junction structure is such that it is possible to increase the impurity concentration of the drift layer, it is possible to reduce the on-state resistance while maintaining a high breakdown voltage.

A method whereby embedding into a trench formed by selectively etching a semiconductor substrate is carried out by epitaxial growth has been proposed as a method of manufacturing a semiconductor element with a super junction structure. Also, a method whereby p-type and n-type buried regions cyclically formed in a depth direction by continuously carrying out ion implantation and epitaxial growth are thermally diffused and connected has been proposed as a simple method, with improved mass productivity, of manufacturing a semiconductor element with a super junction structure (for example, refer to Japanese Patent No. 3,988, 262).

Reducing the on-state resistance by employing a super junction structure in a vertical semiconductor element is one means of increasing the added value of the vertical semiconductor element. Meanwhile, a semiconductor element called an intelligent switching device, wherein a lateral semiconductor element or some kind of passive element is formed on the same semiconductor substrate as the vertical semiconductor element, has been proposed as another means of increasing the added value of the vertical semiconductor element.

Heretofore, a drive circuit, control circuit, protection circuit, and the like, of a vertical semiconductor element used in an output stage have been configured of external, discrete parts. As opposed to this, an intelligent switching device is such that these circuits are configured of a lateral semiconductor element and various kinds of passive element formed on the same semiconductor substrate as the vertical semiconductor element used in the output stage.

In this way, an intelligent switching device is such that each kind of circuit element is formed on the same semiconductor substrate as the vertical semiconductor element used in the output stage, without using external, discrete parts. Because of this, it is possible to realize the heretofore known functions at a reduced size and lower cost. Element isolating technology whereby each element is electrically isolated is included as important technology for realizing an intelligent switching device.

When forming a plurality of semiconductor elements on the same semiconductor substrate, as in an intelligent switching device, element isolating technology is used in order not to cause a parasitic action between elements. For example, dielectric isolating technology, pn-junction isolating technology, self-isolating technology, and the like, are commonly known as element isolating technologies.

FIG. 31 is a sectional view showing a configuration of a main portion of a heretofore known intelligent switching device using dielectric isolating technology. As shown in FIG. 31, the heretofore known intelligent switching device using dielectric isolating technology is such that a vertical semiconductor element 511 and a lateral semiconductor element 512 are formed on an $n^-$ epitaxial layer 504. The lateral semiconductor element 512 configures a drive circuit, a control circuit, and a protection circuit.

The vertical semiconductor element 511 and lateral semiconductor element 512 are isolated from each other by a silicon oxide film 502, a trench isolating region 505 in which a silicon oxide film is embedded, and a high concentration $n^+$ buried region 503, formed on an $n^+$ substrate 501. The silicon oxide film 502 and high concentration $n^+$ buried region 503 are formed between the $n^+$ substrate 501 and $n^-$ epitaxial layer 504. The trench isolating region 505 penetrates the $n^-$ epitaxial layer 504 and high concentration $n^+$ buried region 503, reaching the silicon oxide film 502. Element 509 is a p-well region of the vertical semiconductor element 511.

FIG. 32 is a sectional view showing a configuration of a main portion of a heretofore known intelligent switching device using pn-junction isolating technology. As shown in FIG. 32, the heretofore known intelligent switching device using pn-junction isolating technology is such that, in the same way as the intelligent switching device using dielectric isolating technology shown in FIG. 31, the vertical semiconductor element 511 and lateral semiconductor element 512 are integrated on the same substrate.

The vertical semiconductor element 511 and lateral semiconductor element 512 are isolated from each other by a $p^-$ layer 507 and high concentration $p^+$ region 508 formed on the $n^+$ substrate 501. The $p^-$ layer 507 is formed between the $n^+$ substrate 501 and $n^-$ epitaxial layer 504. The high concentration $p^+$ region 508 penetrates the $n^-$ epitaxial layer 504, coming into contact with the $p^-$ layer 507. Element 510 is a buried $n^+$ region that penetrates the $p^-$ layer 507, coming into contact with the $n^-$ epitaxial layer 504 and $n^+$ substrate 501.

FIG. 33 is a sectional view showing a configuration of a main portion of a heretofore known intelligent switching device using self-isolating technology. As shown in FIG. 33, the heretofore known intelligent switching device using self-isolating technology is such that, unlike the heretofore known intelligent switching device using pn-junction isolating technology shown in FIG. 32, the $p^-$ layer 507 and high concentration $p^+$ region 508 are not provided. The separation of the vertical semiconductor element 511 and lateral semiconductor element 512 is done by increasing the gap between the elements. In FIG. 33, only a main portion of the element cross-sectional structure is shown, and the fact that the gap between the elements is greater than in the intelligent switching device shown in FIG. 32 is omitted from the drawing.

By configuring an intelligent switching device using the heretofore described element isolating technology in this way, there is realized an intelligent switching device wherein parasitic action between elements formed on the same semiconductor substrate is suppressed, and malfunction and breakage is prevented.

Also, a semiconductor element such that the trade-off between on-state resistance and breakdown voltage is improved using a super junction structure is described in Japanese Patent No. 3,988,262. Also, a semiconductor element configured of a super junction structure, and in which the cell pitch at which the n-layer and p-layer of the super junction structure are repeated is reduced, is described in JP-A-2007-012858.

Also, a lateral MOSFET such that low on-state resistance and high breakdown voltage are balanced using a multi-resurf structure is described in JP-A-2000-286417. The multi-resurf structure can be seen as a super junction structure. That is, the description in JP-A-2000-286417 is of a semiconductor device such that a high breakdown voltage lateral semiconductor element using a super junction structure and a lateral semiconductor element configuring a control circuit IC bounded by an isolating structure are formed on the same semiconductor substrate.

The present invention is directed to overcoming or at least reducing the effects of one or more of the problems set forth above.

SUMMARY OF THE INVENTION

As heretofore described, the description has given as examples two means—devising a super junction structure and devising an intelligent switching device—as means of increasing the added value of a vertical semiconductor element. Also, not being limited to the intelligent switching devices shown in FIGS. 31 to 33, there have been a large number of proposals relating to the element structure, and manufacturing method thereof, of the two means.

However, for example, in Japanese Patent No. 3,988,262 and JP-A-2007-012858, there is no mention of using a vertical semiconductor element with a super junction structure in the output stage, and integrating a lateral semiconductor element for various kinds of circuit (for example, a control integrated circuit, and the like) on the same semiconductor substrate as the super junction structure vertical semiconductor element. Also, in JP-A-2000-286417, there is no mention of integrating a lateral semiconductor element on the same semiconductor substrate as a super junction structure vertical semiconductor element.

The invention, in order to eliminate the problems with the heretofore described heretofore known technology, provides a semiconductor device, and manufacturing method thereof, such that it is possible to suppress parasitic action between elements formed on the same semiconductor substrate. Also, the invention, in order to eliminate the problems with the heretofore described heretofore known technology, provides a semiconductor device, and manufacturing method thereof, such that it is possible to reduce cost.

In order to solve the heretofore described problems, a semiconductor device according to the invention is a semiconductor device having a first region in which a vertical semiconductor element is disposed and a second region in which a lateral semiconductor element electrically isolated from the vertical semiconductor element by an isolating structure is disposed, and has the following characteristics. The semiconductor device includes a first conductivity type first semiconductor layer, and a first conductivity type second semiconductor layer with an impurity concentration lower than that of the first semiconductor layer is provided on a surface of the first semiconductor layer. Further, a parallel pn-layer formed by a first conductivity type third semiconductor layer with an impurity concentration higher than that of the second semiconductor layer and a second conductivity type fourth semiconductor layer with an impurity concentration higher than that of the second semiconductor layer being alternately disposed in a horizontal direction with respect to a main surface of the second semiconductor layer is provided in the first region of the second semiconductor layer. Also, the isolating structure including a buried isolating layer having an impurity concentration the same as that of the third semiconductor layer or fourth semiconductor layer is provided in the second region of the second semiconductor layer.

Also, the semiconductor device according to the invention is such that, in the heretofore described aspect of the invention, the third semiconductor layer is a diffusion layer selectively provided in the second semiconductor layer. The fourth semiconductor layer is a diffusion layer selectively provided in the third semiconductor layer. The isolating structure is a diffusion layer having an impurity concentration the same as that of the third semiconductor layer or fourth semiconductor layer.

Also, the semiconductor device according to the invention is such that, in the heretofore described aspect of the invention, the third semiconductor layer and fourth semiconductor layer are diffusion layers selectively provided in the second semiconductor layer. The isolating structure is a diffusion layer having an impurity concentration the same as that of the third semiconductor layer or fourth semiconductor layer.

Also, the semiconductor device according to the invention is such that, in the heretofore described aspect of the invention, the third semiconductor layer and isolating structure are formed of the same epitaxial layer. The fourth semiconductor layer is a diffusion layer, selectively provided in the third semiconductor layer, with an impurity concentration higher than that of the third semiconductor layer.

Also, the semiconductor device according to the invention is characterized in that, in the heretofore described aspect of the invention, the vertical semiconductor element is an insulated gate field effect transistor having a planar gate structure or trench gate structure.

Also, the semiconductor device according to the invention is characterized in that, in the heretofore described aspect of the invention, an edge termination structure of the vertical super junction MOS transistor is provided on the outer side of the first region so as to surround the first region.

Also, in order to solve the heretofore described problems, a semiconductor device manufacturing method according to the invention is a method of manufacturing a semiconductor device having a first region in which a vertical semiconductor element is disposed and a second region in which a lateral semiconductor element electrically isolated from the vertical semiconductor element by an isolating structure is disposed, and has the following characteristics. Firstly, a first step of forming by epitaxial growth on a first semiconductor layer a first conductivity type first epitaxial layer with an impurity concentration lower than that of the first semiconductor layer, and a first ion implantation of a first conductivity type impurity throughout the whole of the first region of the first epitaxial layer (a second step) are carried out. Next, a second ion implantation of a second conductivity type impurity is selectively carried out into the first region of the first epitaxial layer into which the first ion implantation has been carried out (a third step). Next, after the third step, a first conductivity type second epitaxial layer having an impurity concentration the same as that of the first epitaxial layer is formed by epitaxial growth on the first epitaxial layer (a fourth step). Next, a third ion implantation of a first conductivity type impurity is carried out into a region of the second epitaxial layer directly above a place of the first ion implantation and into the second region distanced from the region directly above the place of the first ion implantation (a fifth step). Next, after the fifth step, a fourth ion implantation of a second conductivity type impurity is selectively carried out into a region of the second epitaxial layer directly above a place of the second ion implantation (a sixth step). Next, after the sixth step, a first conductivity type third epitaxial layer having an impurity concentration the same as that of the second epitaxial layer is formed by epitaxial growth on the second epitaxial layer (a seventh step). Next, the first conductivity type impurity and second conductivity type impurity ion implanted into the first epitaxial layer and second epitaxial layer are diffused by heat treatment, thereby forming a parallel pn-layer formed by the first conductivity type third semiconductor layer and second conductivity type fourth semiconductor layer connected from the first epitaxial layer to the third epitaxial layer being alternately disposed. At this time, along with the formation of the parallel pn-layer, a fifth semiconductor layer is formed connected across the second region of the second epitaxial layer and third epitaxial layer, thereby configuring the isolating structure (an eighth step).

Also, in order to solve the heretofore described problems, a semiconductor device manufacturing method according to the invention is a method of manufacturing a semiconductor device having a first region in which a vertical semiconductor element is disposed and a second region in which a lateral semiconductor element electrically isolated from the vertical semiconductor element by an isolating structure is disposed, and has the following characteristics. Firstly, there is formed by epitaxial growth on a first conductivity type first semiconductor layer a first conductivity type first epitaxial layer with an impurity concentration lower than that of the first semiconductor layer (a first step). Next, a first ion implantation of a first conductivity type impurity is selectively carried out throughout the whole of the first region of the first epitaxial layer (a second step). Next, a second ion implantation of a second conductivity type impurity is selectively carried out into a region of the first epitaxial layer sandwiched by places of the first ion implantation (a third step). Next, after the third step, a first conductivity type second epitaxial layer having an impurity concentration the same as that of the first epitaxial layer is formed by epitaxial growth on the first epitaxial layer (a fourth step). Next, a third ion implantation of a first conductivity type impurity is carried out into a region of the second epitaxial layer directly above a place of the first ion implantation and into the second region distanced from the region directly above the place of the first ion implantation (a fifth step). Next, after the fifth step, a fourth ion implantation of a second conductivity type impurity is carried out into a region of the second epitaxial layer directly above a place of the second ion implantation (a sixth step). Next, after the sixth step, a first conductivity type third epitaxial layer having an impurity concentration the same as that of the second epitaxial layer is formed by epitaxial growth on the second epitaxial layer (a seventh step). Next, the first conductivity type impurity and second conductivity type impurity ion implanted into the first epitaxial layer and second epitaxial layer are diffused by heat treatment, thereby forming a parallel pn-layer formed by the first conductivity type third semiconductor layer and second conductivity type fourth semiconductor layer connected from the first epitaxial layer to the third epitaxial layer being alternately disposed. At this time, along with the formation of the parallel pn-layer, a fifth semiconductor layer is formed connected across the second region of the second epitaxial layer and third epitaxial layer, thereby configuring the isolating structure (an eighth step).

Also, in order to solve the heretofore described problems, a semiconductor device manufacturing method according to the invention is a method of manufacturing a semiconductor device having a first region in which a vertical semiconductor element is disposed and a second region in which a lateral semiconductor element electrically isolated from the vertical semiconductor element by an isolating structure is disposed, and has the following characteristics. Firstly, there is formed by epitaxial growth on a first conductivity type first semiconductor layer a first conductivity type first epitaxial layer with an impurity concentration lower than that of the first semiconductor layer (a first step). Next, a first ion implantation of a first conductivity type impurity is selectively carried out into the first region of the first epitaxial layer (a second step). Next, a second ion implantation of a second conductivity type impurity is selectively carried out into the first region of the first epitaxial layer into which the first ion implantation has been carried out (a third step). Next, after the third step, a first conductivity type second epitaxial layer having an impurity concentration the same as that of the first epitaxial layer is formed by epitaxial growth on the first epitaxial layer (a fourth step). Next, a third ion implantation of a first conductivity type impurity is carried out into a region of the second epitaxial layer directly above a place of the first ion implantation (a fifth step). Next, after the fifth step, a fourth ion implantation of a second conductivity type impurity is carried out into a region of the second epitaxial layer directly above a place of the second ion implantation and into the second region distanced from the region directly above the place of the first ion implantation (a sixth step). Next, after the sixth step, a first conductivity type third epitaxial layer having an impurity concentration the same as that of the second epitaxial layer is formed by epitaxial growth on the second epitaxial layer (a seventh step). Next, the first conductivity type impurity and second conductivity type impurity ion implanted into the first epitaxial layer and second epitaxial layer are diffused by heat treatment, thereby forming a parallel pn-layer formed by the first conductivity type third semiconductor layer and second conductivity type fourth semiconductor layer connected from the first epitaxial layer to the third epitaxial layer being alternately disposed. At this time, along with the formation of the parallel pn-layer, a fifth semiconductor layer is formed connected across the second region of the second epitaxial layer and third epitaxial layer, thereby configuring the isolating structure (an eighth step).

Also, in order to solve the heretofore described problems, a semiconductor device manufacturing method according to the invention is a method of manufacturing a semiconductor device having a first region in which a vertical semiconductor element is disposed and a second region in which a lateral semiconductor element electrically isolated from the vertical semiconductor element by an isolating structure is disposed, and has the following characteristics. Firstly, there is formed by epitaxial growth on a first conductivity type first semiconductor layer a first conductivity type first epitaxial layer with an impurity concentration lower than that of the first semiconductor layer (a first step). Next, a first ion implantation of a first conductivity type impurity is selectively carried out into the first region of the first epitaxial layer (a second step). Next, a second ion implantation of a second conductivity type impurity is selectively carried out into a region of the first epitaxial layer sandwiched by places of the first ion implantation (a third step). Next, after the third step, a first conductivity type second epitaxial layer having an impurity concentration the same as that of the first epitaxial layer is formed by epitaxial growth on the first epitaxial layer (a fourth step). Next, a third ion implantation of a first conductivity type impurity is carried out into a region of the second epitaxial layer directly above a place of the first ion implantation (a fifth step). Next, after the fifth step, a fourth ion implantation of a second conductivity type impurity is carried out into a region of the second epitaxial layer directly above a place of the second ion implantation and into the second region distanced from the region directly above the place of the first ion implantation (a sixth step). Next, after the sixth step, a first conductivity type third epitaxial layer having an impurity concentration the same as that of the second epitaxial layer is formed by epitaxial growth on the second epitaxial layer (a seventh step). Next, the first conductivity type impurity and second conductivity type impurity ion implanted into the first epitaxial layer and second epitaxial layer are diffused by heat treatment, thereby forming a parallel pn-layer formed by the first conductivity type third semiconductor layer and second conductivity type fourth semiconductor layer connected from the first epitaxial layer to the third epitaxial layer being alternately disposed. At this time, along with the formation of the parallel pn-layer, a fifth semiconductor layer is formed connected across the second region of the second epitaxial layer and third epitaxial layer, thereby configuring the isolating structure (an eighth step).

Also, in order to solve the heretofore described problems, and achieve the objects of the invention, a semiconductor device manufacturing method according to the invention is a method of manufacturing a semiconductor device having a first region in which a vertical semiconductor element is disposed and a second region in which a lateral semiconductor element electrically isolated from the vertical semiconductor element by an isolating structure is disposed, and has the following characteristics. Firstly, there is formed by epitaxial growth on a first conductivity type first semiconductor layer a first conductivity type first epitaxial layer with an impurity concentration lower than that of the first semiconductor layer (a first step). Next, a first ion implantation of a first conductivity type impurity is carried out throughout the whole of the first epitaxial layer (a second step). Next, a second ion implantation of a second conductivity type impurity is selectively carried out into the first region of the first epitaxial layer into which the first ion implantation has been carried out (a third step). Next, after the third step, a first conductivity type second epitaxial layer having an impurity concentration the same as that of the first epitaxial layer is formed by epitaxial growth on the first epitaxial layer (a fourth step). Next, a third ion implantation of a first conductivity type impurity is carried out throughout the whole of the second epitaxial layer (a fifth step). Next, after the fifth step, a fourth ion implantation of a second conductivity type impurity is carried out into a region of the second epitaxial layer directly above a place of the second ion implantation (a sixth step). Next, after the sixth step, a first conductivity type third epitaxial layer having an impurity concentration the same as that of the second epitaxial layer is formed by epitaxial growth on the second epitaxial layer (a seventh step). Next, the first conductivity type impurity and second conductivity type impurity ion implanted into the first epitaxial layer and second epitaxial layer are diffused by heat treatment, thereby forming a parallel pn-layer formed by the first conductivity type third semiconductor layer and second conductivity type fourth semiconductor layer connected from the first epitaxial layer to the third epitaxial layer being alternately disposed. At this time, along with the formation of the parallel pn-layer, a fifth semiconductor layer is formed, that is connected from the first semiconductor layer to the third epitaxial layer, thereby configuring the isolating structure (an eighth step).

Also, the semiconductor device manufacturing method according to the invention is characterized in that, in the heretofore described aspect of the invention, the second step to fourth step are repeatedly carried out, thereby increasing the thickness of the parallel pn-layer.

Also, the semiconductor device manufacturing method according to the invention is characterized in that, in the heretofore described aspect of the invention, the fourth step to sixth step are repeatedly carried out, thereby increasing the thickness of the fifth semiconductor layer.

Also, the semiconductor device manufacturing method according to the invention, in the heretofore described aspect of the invention, further has the following characteristics. After the sixth step and before the seventh step, a first conductivity type fourth epitaxial layer is formed by epitaxial growth on the second epitaxial layer (a ninth step). Further, a fifth ion implantation of a first conductivity type impurity is carried out throughout the whole of the first region of the fourth epitaxial layer (a tenth step). Furthermore, after the tenth step, a sixth ion implantation of a second conductivity type impurity is selectively carried out into a region of the fourth epitaxial layer directly above a place of the fourth ion implantation (an eleventh step).

Also, the semiconductor device manufacturing method according to the invention, in the heretofore described aspect of the invention, further has the following characteristics. After the sixth step and before the seventh step, a first conductivity type fourth epitaxial layer is formed by epitaxial growth on the second epitaxial layer (a ninth step). Further, a fifth ion implantation of a first conductivity type impurity is carried out throughout the whole of the first region and into an outer peripheral portion of the second region of the fourth epitaxial layer (a tenth step). Furthermore, after the tenth step, a sixth ion implantation of a second conductivity type impurity is selectively carried out into a region of the fourth epitaxial layer directly above a place of the fourth ion implantation (an eleventh step).

Also, the semiconductor device manufacturing method according to the invention is such that, in the heretofore described aspect of the invention, an element structure of a vertical semiconductor element is formed in the first region of the third epitaxial layer after the eighth step. Also, an isolating portion reaching the fifth semiconductor layer from the surface of the third epitaxial layer is formed in an outer peripheral portion of the second region of the third epitaxial layer, and an element structure of a lateral semiconductor element is formed in a region of the third epitaxial layer bounded by the isolating portion and fifth semiconductor layer.

Also, the semiconductor device manufacturing method according to the invention is characterized in that, in the heretofore described aspect of the invention, the isolating portion is a diffusion layer formed by an impurity ion implanted into the second region of the third epitaxial layer after the eighth step being thermally diffused.

Also, the semiconductor device manufacturing method according to the invention is characterized in that, in the heretofore described aspect of the invention, the isolating portion is configured of a trench formed in the second region of the third epitaxial layer after the eighth step.

According to the invention, by forming a lateral semiconductor element in a region bounded by an isolating structure having a buried isolating layer (the fifth semiconductor layer), it is possible to suppress parasitic action between a lateral semiconductor element and super junction structure vertical semiconductor element formed on the same semiconductor substrate.

Also, according to the invention, along with a multiple of n⁻ epitaxial layers for forming a parallel pn-layer configuring a super junction structure vertical semiconductor element, a buried isolating layer that electrically isolates a lateral semiconductor element and the vertical semiconductor element is formed. Because of this, it is possible to integrate the lateral semiconductor element bounded by the isolating structure and the super junction structure vertical semiconductor element on the same substrate, at a low cost.

According to the semiconductor device and manufacturing method thereof according to the invention, an advantage is achieved in that it is possible to suppress parasitic action between elements formed on the same semiconductor substrate. Also, according to the semiconductor device and manufacturing method thereof according to the invention, an advantage is achieved in that it is possible to reduce cost.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereafter, referring to the attached drawings, a detailed description will be given of preferred embodiments of a semiconductor device and manufacturing method thereof according to the invention. The following description will be given with a first conductivity type as an n-type and a second conductivity type as a p-type, but the first conductivity type may also be a p-type and the second conductivity type an n-type. In the specification and attached drawings, a layer or region being prefixed by n or p indicates that electrons or holes respectively are majority carriers. Also, + or − being affixed to n or p indicates a higher impurity concentration or lower impurity concentration respectively than that of a layer or region to which neither is affixed. In the following description of the embodiments and attached drawings, the same elements are given to identical configurations, and a redundant description is omitted.

Embodiment 1

Figure 1:
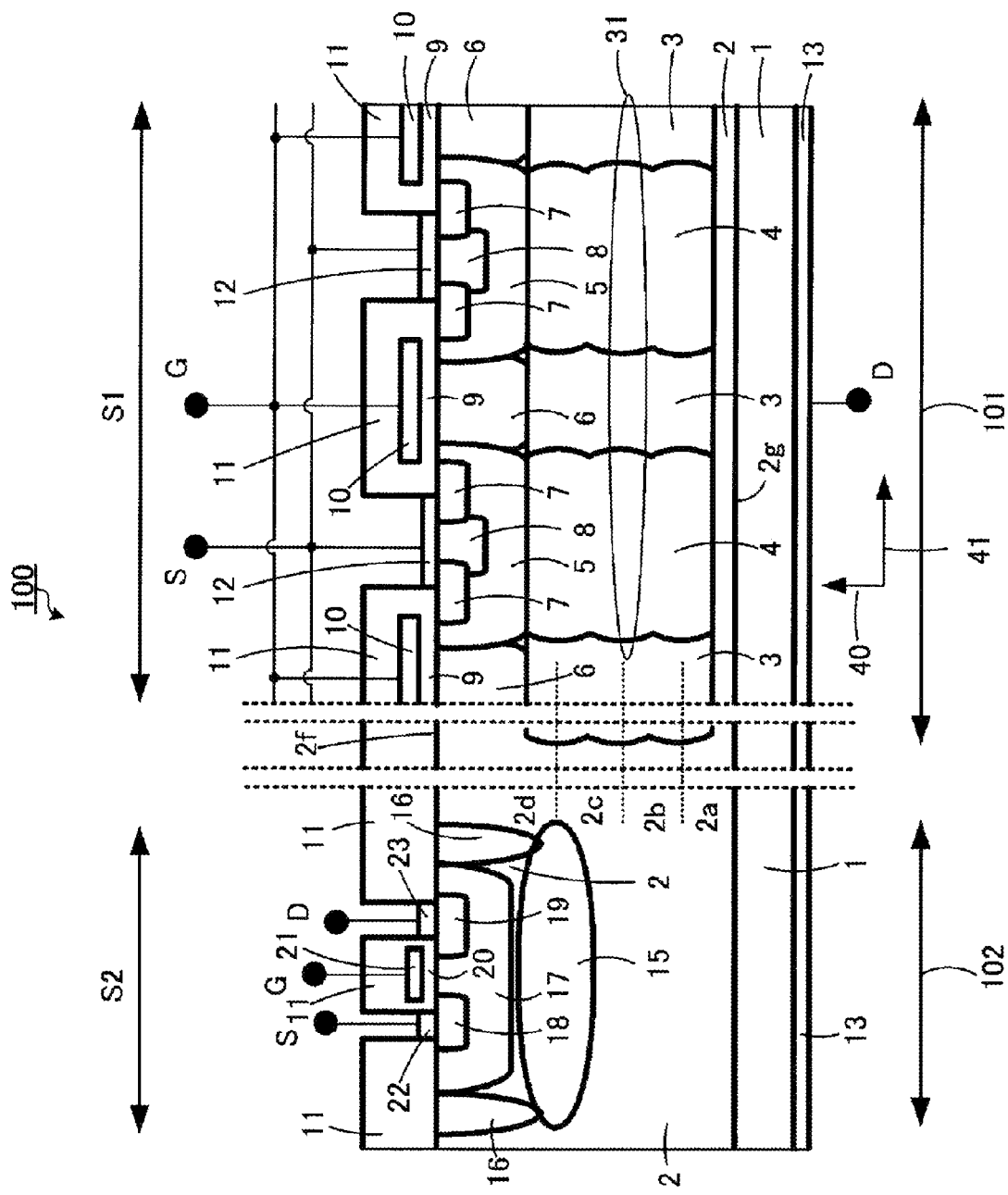
FIG. 1 is a sectional view showing a configuration of a main portion of a semiconductor device according to Embodiment 1 of the invention.

FIG. 1 is a sectional view showing a configuration of a main portion of a semiconductor device according to Embodiment 1 of the invention. As shown in FIG. 1, a semiconductor device 100 is configured of an n$^-$ semiconductor layer (a second semiconductor layer) 2 that configures a semiconductor substrate, a super junction structure vertical MOSFET (a vertical semiconductor element, hereafter assumed to be a vertical super junction MOSFET) 101 formed in a first region S1, and a lateral MOSFET (a lateral semiconductor element) 102 formed in a second region S2. A super junction structure is a structure such that a pn-junction (parallel pn-layers) formed by n-layers and p-layers being repeatedly alternately disposed is formed in a drift layer.

The vertical super junction MOSFET 101 is formed of an n$^+$ semiconductor layer (first semiconductor layer) 1 that forms an n-drain layer, the n$^-$ semiconductor layer 2 in contact with the n$^+$ semiconductor layer 1, and a parallel pn-layer 31 formed inside the n$^-$ semiconductor layer 2. The n$^+$ semiconductor layer 1 is an n$^+$ low resistance layer having an impurity concentration higher than that of the n$^-$ semiconductor layer 2. The n$^-$ semiconductor layer 2 is provided on the surface of the n$^+$ semiconductor layer 1. The n$^-$ semiconductor layer 2 is an n$^-$ high resistance layer having an impurity concentration lower than that of the n$^+$ semiconductor layer 1.

The parallel pn-layer 31 is formed of an n-layer (third semiconductor layer) 3 and p-layer (fourth semiconductor layer) 4 configuring a super junction structure. Specifically, the n-layer 3 is provided inside the n$^-$ semiconductor layer 2. The p-layer 4 is provided in the n-layer 3. The p-layer 4 extends in a vertical direction 40 with respect to main surfaces 2f and 2g of the n$^-$ semiconductor layer 2, penetrating the n-layer 3, and coming into contact with the n$^-$ semiconductor layer 2. Also, the p-layer 4 is disposed in a predetermined cycle in a horizontal direction with respect to the main surfaces 2f and 2g of the n$^-$ semiconductor layer 2.

In this way, the n-layer 3 and p-layer 4 are repeatedly alternately disposed in a horizontal direction 41 with respect to the main surfaces 2f and 2g of the n$^-$ semiconductor layer 2, configuring a super junction structure. The n-layer 3 has an impurity concentration higher than that of the n$^-$ semiconductor layer 2. The p-layer 4 has an impurity concentration higher than that of the n$^-$ semiconductor layer 2. It is preferable that the impurity concentration of the p-layer 4 is practically equivalent to the impurity concentration of the n-layer 3.

The parallel pn-layer 31 is designed so that, when voltage is applied to the vertical super junction MOSFET 101, a depletion layer (not shown) spreads through the whole of the n-layer 3 sandwiched by the p-layer 4 and the p-layer 4. The n$^-$ semiconductor layer 2 is a non-doped epitaxial growth layer. Specifically, the n$^-$ semiconductor layer 2 is an epitaxial growth layer formed by, for example, an n$^-$ semiconductor layer 2a, an n$^-$ semiconductor layer 2b, an n$^-$ semiconductor layer 2c, and an n$^-$ semiconductor layer 2d being stacked.

The n-layer 3 is formed over the whole of the first region 51 of the n$^-$ semiconductor layer 2 in which the vertical super junction MOSFET 101 is formed. The n-layer 3 is a diffusion layer formed by, for example, phosphorus (P) ion implanted throughout the whole of the first region 51 of the n$^-$ semiconductor layer 2 being diffused by heat treatment. The p-layer 4 is a diffusion layer formed by, for example, boron (B) ion implanted in the n-layer 3 being diffused by heat treatment.

A p-well region 5 in contact with the p-layer 4 and an n-drift region 6 in contact with the n-layer 3 are selectively provided in a surface layer on the main surface 2f side on the side opposite to the main surface 2g on the n$^+$ semiconductor layer 1 side of the n$^-$ semiconductor layer 2. The p-well region 5 is in contact with the n-drift region 6. The n-drift region 6 is sandwiched by neighboring p-well regions 5. The n-layer 3 also configures an n-drift layer. An n-source region 7 and a p-contact region 8 are selectively provided in a surface layer of the p-well region 5. A gate electrode 10 is provided across a gate oxide film 9 on the surface of the p-well region 5 sandwiched by the n-source region 7 and n-drift region 6.

An interlayer dielectric 11 covers the gate electrode 10. A source electrode 12 is electrically connected to the n-source region 7. A drain electrode 13 is electrically connected to the n$^+$ semiconductor layer 1, which forms the n-drain layer. The gate electrode 10, source electrode 12, and drain electrode 13 are isolated from each other by the inter layer dielectric 11. In this way, the planar gate structure vertical super junction MOSFET 101 is provided in the first region S1 of the n$^-$ semiconductor layer 2.

An isolating structure formed of an n-buried isolating layer (a fifth semiconductor layer) 15 and an n-diffused isolating layer 16 in contact with the n-buried isolating layer 15 is provided in the second region S2 of the n$^-$ semiconductor layer 2. The n-buried isolating layer 15 is provided inside the n$^-$ semiconductor layer 2. The n-diffused isolating layer 16 is provided so as to reach the n-buried isolating layer 15 from the main surface 2f on the side opposite to the main surface 2g on the n$^+$ semiconductor layer 1 side of the n$^-$ semiconductor layer 2. The n-diffused isolating layer 16 is provided so as to be in contact with, for example, an outer peripheral portion of the n-buried isolating layer 15.

The n-buried isolating layer 15 has an impurity concentration higher than that of the n$^-$ semiconductor layer 2. Also, the n-buried isolating layer 15 has an impurity concentration practically equivalent to that of the n-layer 3 or p-layer 4. The n-diffused isolating layer 16 is a diffusion layer formed by thermal diffusion so as to reach the n-buried isolating layer 15. The n-diffused isolating layer 16 has an impurity concentration higher than that of, for example, the n$^-$ semiconductor layer 2.

The lateral MOSFET 102 is provided in a region of the n$^-$ semiconductor layer 2 bounded by the n-buried isolating layer 15 and n-diffused isolating layer 16. Specifically, a p-well region 17, n-source region 18, and n-drain region 19 configuring the lateral MOSFET 102 are provided in a region of the n$^-$ semiconductor layer 2 bounded by the n-buried isolating layer 15 and n-diffused isolating layer 16.

The n-source region 18 and n-drain region 19 are selectively provided, distanced from each other, in a surface layer of the p-well region 17. A gate electrode 21 is provided across a gate oxide film 20 on the surface of a region of the p-well region 17 sandwiched by the n-source region 18 and n-drain region 19. A source electrode 22 and drain electrode 23 are electrically connected to the n-source region 18 and n-drain region 19 respectively.

The gate electrode 21, source electrode 22, and drain electrode 23 are isolated from each other by the inter layer dielectric 11, which covers the gate electrode 21. In this way, the planar gate structure lateral MOSFET 102 is provided in the second region S2 of the n⁻ semiconductor layer 2. The inter-layer insulating film 11 covers portions of the surface of the n⁻ semiconductor layer 2 including the first and second regions S1 and S2 on which no electrode is formed, from the first region S1 to the second region S2.

As the semiconductor device 100 shown in FIG. 1 is such that the n-buried isolating layer 15 and n-layer 3 are formed simultaneously, it is possible to reduce manufacturing cost. A method of manufacturing the semiconductor device 100 will be described hereafter. Also, the semiconductor device 100 shown in FIG. 1 is such that it is possible to increase freedom of element design. The reason for this is as follows.

Generally, when forming another region in a region doped with an impurity, the impurity concentration of the other region is higher than the region doped with the impurity. Because of this, when forming another region in a region doped with an impurity, the impurity concentration selection range of the other region narrows, and the freedom of element design decreases. As opposed to this, as the semiconductor device 100 shown in FIG. 1 is such that the n-layer 3 and p-well regions 5 and 17 can be formed in the n⁻ semiconductor layer 2 formed without doping, the impurity concentration selection range of the n-layer 3 and p-well regions 5 and 17 widens. Consequently, it is possible to increase the freedom of element design.

Also, the lateral MOSFET 102 is electrically isolated from the vertical super junction MOSFET 101 by the n-buried isolating layer 15 and n-diffused isolating layer 16, whose impurity concentrations are higher than that of the n⁻ semiconductor layer 2. That is, the isolating structure formed of the n-buried isolating layer 15 and n-diffused isolating layer 16, whose impurity concentrations are higher than that of the n⁻ semiconductor layer 2, is provided in the semiconductor device 100. Because of this, it is possible to attempt to suppress malfunction of a parasitic transistor configured by the vertical super junction MOSFET 101 and lateral MOSFET 102, and reduce leakage current in a pn-junction portion of the parasitic transistor.

In the heretofore described example of the semiconductor device 100 shown in FIG. 1, there is configured an integrated circuit wherein only one lateral MOSFET 102 is formed in the same semiconductor substrate (the n⁻ semiconductor layer 2) as the vertical super junction MOSFET 101, but in actuality, the integrated circuit is configured by forming a plurality of lateral MOSFETs 102. When forming a plurality of lateral MOSFETs 102 in the same semiconductor substrate as the vertical super junction MOSFET 101, each of the plurality of lateral MOSFETs 102 is bounded by an isolating structure formed of the n-buried isolating layer 15 and n-diffused isolating layer 16, and is electrically isolated from other elements.

As heretofore described, according to Embodiment 1, the lateral MOSFET 102 is disposed in a region of the n⁻ semiconductor layer 2 configuring the semiconductor substrate bounded by the n-buried isolating layer 15 and n-diffused isolating layer 16. Because of this, the lateral MOSFET 102 is electrically isolated from the vertical super junction MOSFET 101 disposed in the same semiconductor substrate. Consequently, it is possible to suppress parasitic operation between the vertical super junction MOSFET 101 and lateral MOSFET 102 formed in the same semiconductor substrate.

Embodiment 2

Figure 2:
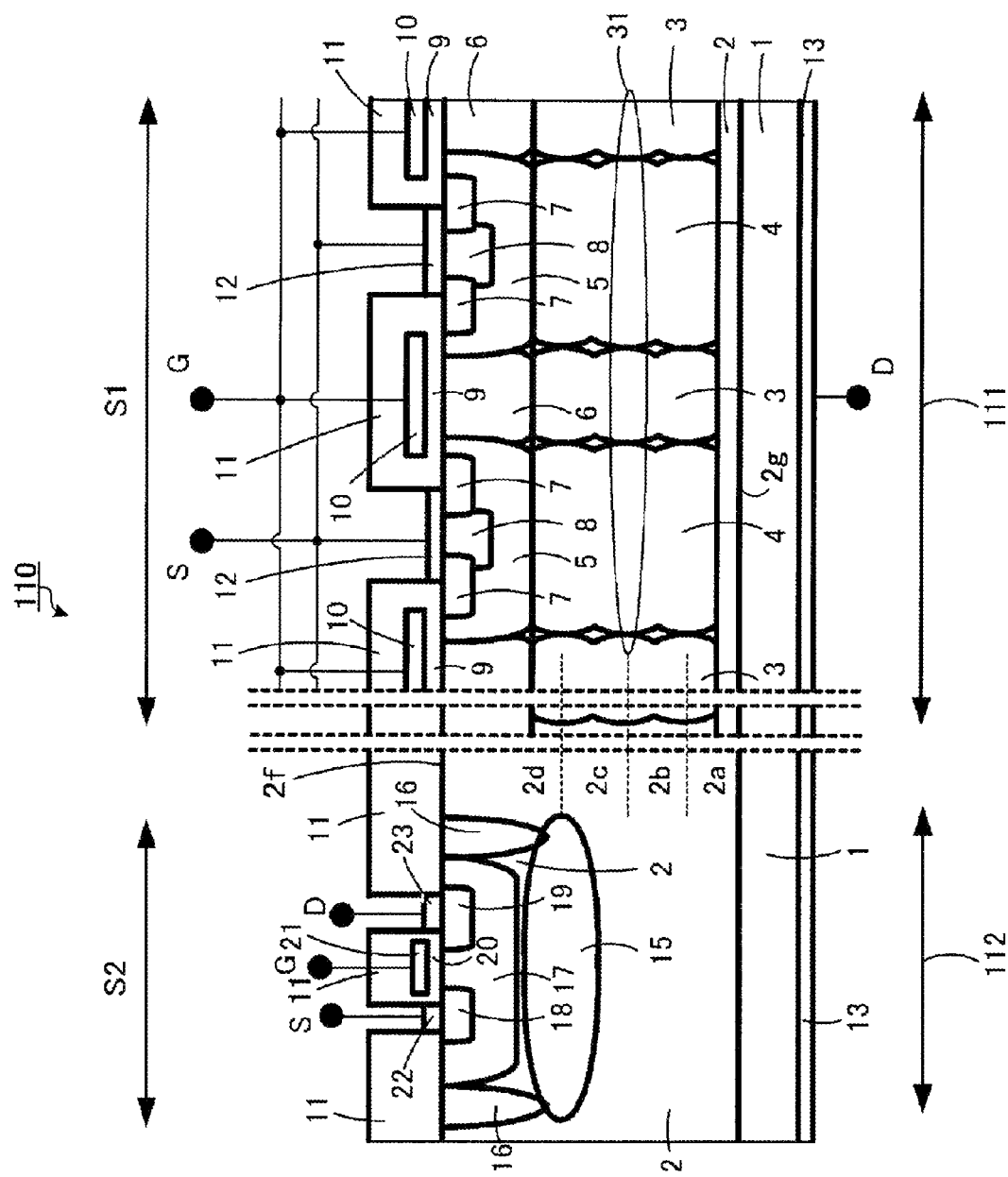
FIG. 2 is a sectional view showing a configuration of a main portion of a semiconductor device according to Embodiment 2 of the invention.

FIG. 2 is a sectional view showing a configuration of a main portion of a semiconductor device according to Embodiment 2 of the invention. As shown in FIG. 2, a semiconductor device 110 is configured of the n⁻ semiconductor layer 2 that configures a semiconductor substrate, a vertical super junction MOSFET 111 formed in the first region S1, and a lateral MOSFET 112 formed in the second region S2.

The vertical super junction MOSFET 111 is formed of the n⁺ semiconductor layer 1 that forms an n-drain layer, the n⁻ semiconductor layer 2 in contact with the n⁺ semiconductor layer 1, and the parallel pn-layer 31 formed inside the n⁻ semiconductor layer 2. The parallel pn-layer 31 is formed of the n-layer 3 and p-layer 4 configuring a super junction structure. Specifically, the n-layer 3 and p-layer 4 extend in a vertical direction with respect to the main surfaces 2f and 2g of the semiconductor substrate (n⁻ semiconductor layer 2), and are repeatedly alternately disposed in a horizontal direction with respect to the main surfaces 2f and 2g of the n⁻ semiconductor layer 2.

The parallel pn-layer 31 is designed so that, when voltage is applied to the vertical super junction MOSFET 111, a depletion layer (not shown) spreads through the whole of the n-layer 3 sandwiched by the p-layer 4 and the p-layer 4. The n⁻ semiconductor layer 2 is a non-doped epitaxial growth layer. Specifically, the n⁻ semiconductor layer 2 is an epitaxial growth layer formed by, for example, the n⁻ semiconductor layer 2a, the n⁻ semiconductor layer 2b, the n⁻ semiconductor layer 2c, and the n⁻ semiconductor layer 2d being sequentially stacked.

The n-layer 3 and p-layer 4 are each selectively formed in the first region S1 of the n⁻ semiconductor layer 2. The n-layer 3 is a diffusion layer formed by, for example, phosphorus ion implanted in the first region S1 of the n⁻ semiconductor layer 2 being diffused by heat treatment. The p-layer 4 is a diffusion layer formed by, for example, boron ion implanted in the first region S1 of the n⁻ semiconductor layer 2 being diffused by heat treatment.

The p-well region 5 in contact with the p-layer 4 and the n-drift region 6 in contact with the n-layer 3 are selectively provided in a surface layer on the main surface 2f side on the side opposite to the main surface 2g on the n⁺ semiconductor layer 1 side of the n⁻ semiconductor layer 2. The p-well region 5 is in contact with the n-drift region 6. The n-drift region 6 is sandwiched by neighboring p-well regions 5. The n-layer 3 also configures an n-drift layer.

The n-source region 7 and p-contact region 8 are selectively provided in a surface layer of the p-well region 5. The gate electrode 10 is provided across the gate oxide film 9 on the surface of the p-well region 5 sandwiched by the n-source region 7 and n-drift region 6.

The inter layer dielectric 11 covers the gate electrode 10. The source electrode 12 is electrically connected to the n-source region 7. The drain electrode 13 is electrically connected to the n⁺ semiconductor layer 1, which forms the n-drain layer. The gate electrode 10, source electrode 12, and drain electrode 13 are isolated from each other by the inter layer dielectric 11. In this way, the planar gate structure vertical super junction MOSFET 111 is provided in the first region S1 of the n⁻ semiconductor layer 2.

An isolating structure formed of the n-buried isolating layer 15 and the n-diffused isolating layer 16 in contact with the n-buried isolating layer 15 is provided in the second region S2 of the n⁻ semiconductor layer 2. The n-buried isolating layer 15 is provided inside the n⁻ semiconductor layer 2. The n-diffused isolating layer 16 is provided so as to reach the n-buried isolating layer 15 from the main surface 2f on the side opposite to the main surface 2g on the n⁺ semiconductor layer 1 side of the n⁻ semiconductor layer 2. The n-diffused isolating layer 16 is provided so as to be in contact with, for example, an outer peripheral portion of the n-buried isolating layer 15.

The lateral MOSFET 112 is provided in a region of the n⁻ semiconductor layer 2 bounded by the n-buried isolating layer 15 and n-diffused isolating layer 16. Specifically, the p-well region 17, n-source region 18, and n-drain region 19 configuring the lateral MOSFET 112 are provided in a region of the n⁻ semiconductor layer 2 bounded by the n-buried isolating layer 15 and n-diffused isolating layer 16. The n-source region 18 and n-drain region 19 are selectively provided, distanced from each other, in a surface layer of the p-well region 17.

The gate electrode 21 is provided across the gate oxide film 20 on the surface of a region of the p-well region 17 sandwiched by the n-source region 18 and n-drain region 19. The source electrode 22 and drain electrode 23 are electrically connected to the n-source region 18 and n-drain region 19 respectively.

The gate electrode 21, source electrode 22, and drain electrode 23 are isolated from each other by the inter layer dielectric 11, which covers the gate electrode 21. In this way, the planar gate structure lateral MOSFET 112 is provided in the second region S2 of the n⁻ semiconductor layer 2. The inter layer dielectric 11 covers portions of the surface of the n⁻ semiconductor layer 2 including the first and second regions S1 and S2 on which no electrode is formed, from the first region S1 to the second region S2.

The impurity concentration of each region of the vertical super junction MOSFET 111 and lateral MOSFET 112 is the same as the impurity concentration of each region of the vertical super junction MOSFET and lateral MOSFET configuring the semiconductor device according to Embodiment 1.

As the semiconductor device 110 shown in FIG. 2 is such that the n-layer 3, p-layer 4, and p-well regions 5 and 17 can be formed in the n⁻ semiconductor layer 2 formed without doping, the impurity concentration selection range of the n-layer 3, p-layer 4, and p-well regions 5 and 17 widens. Consequently, it is possible to increase the freedom of element design.

As heretofore described, according to Embodiment 2, it is possible to obtain the same advantage as with the semiconductor device according to Embodiment 1. Also, as the semiconductor device 110 shown in FIG. 2 is such that each of the n-layer 3 and p-layer 4 is selectively formed in the n⁻ semiconductor layer 2 formed without doping using an epitaxial growth method, it is possible to increase the freedom of element design in comparison with that of the semiconductor device according to Embodiment 1.

Embodiment 3

Figure 3:
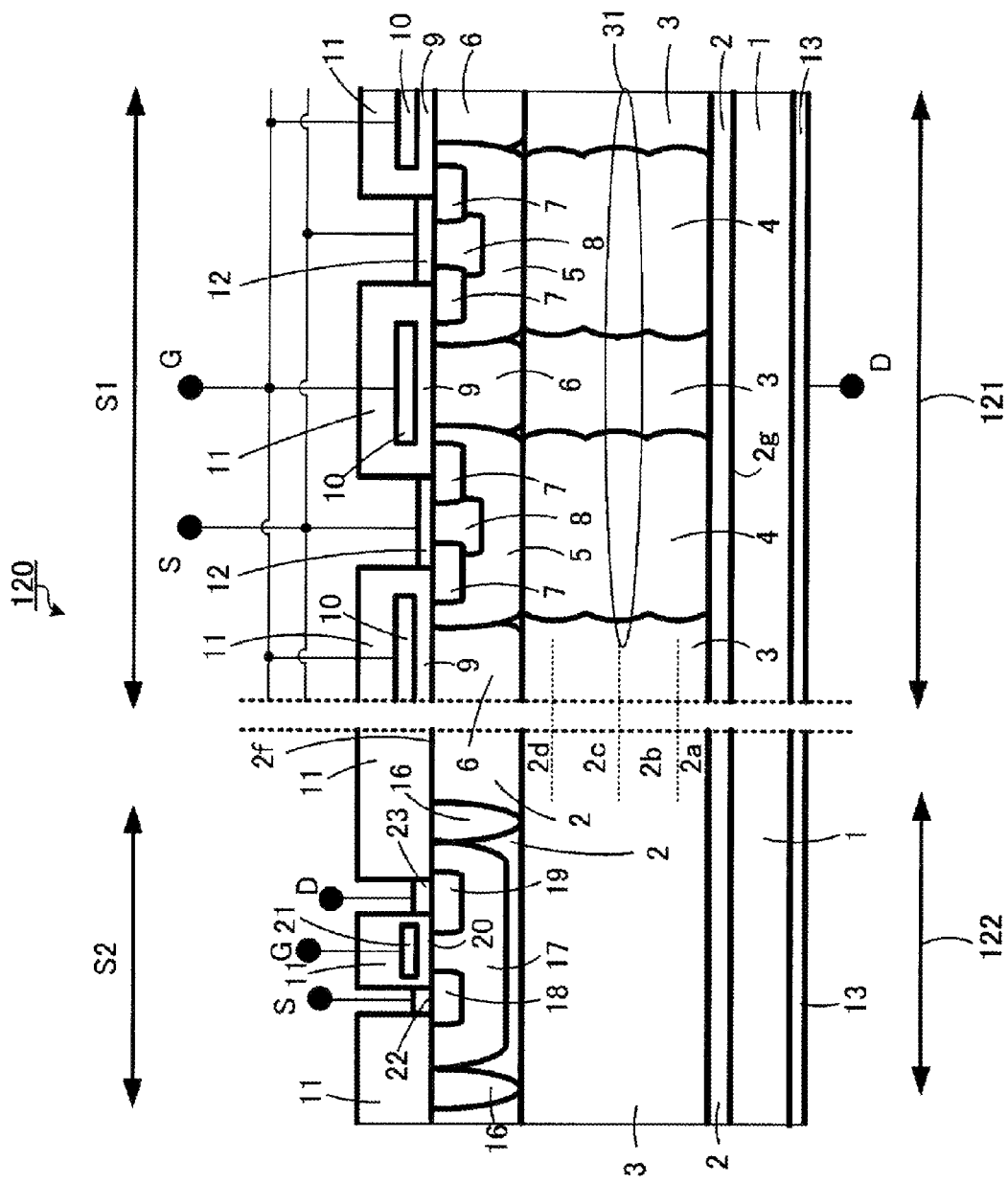
FIG. 3 is a sectional view showing a configuration of a main portion of a semiconductor device according to Embodiment 3 of the invention.

FIG. 3 is a sectional view showing a configuration of a main portion of a semiconductor device according to Embodiment 3 of the invention. As shown in FIG. 3, a semiconductor device 120 is configured of the n⁻ semiconductor layer 2 that configures a semiconductor substrate, a vertical super junction MOSFET 121 formed in the first region S1, and a lateral MOSFET 122 formed in the second region S2.

The vertical super junction MOSFET 121 is formed of the n⁺ semiconductor layer 1 that forms an n-drain layer, the n⁻ semiconductor layer 2 disposed on the surface of the n⁺ semiconductor layer 1, the n-layer 3 disposed inside the n⁻ semiconductor layer 2, and the p-layer 4 disposed penetrating the n-layer 3. The n-layer 3 is provided from the first region S1 to the second region S2 of the n⁻ semiconductor layer 2. The p-layer 4 is provided in the n-layer 3 on the first region S1 side of the n⁻ semiconductor layer 2.

The n-layer 3 and p-layer 4 configure the parallel pn-layer 31, which is a super junction structure. Specifically, the p-layer 4 extends in a vertical direction with respect to the main surfaces 2f and 2g of the semiconductor substrate (n⁻ semiconductor layer 2), penetrating the n-layer 3, and coming into contact with the n⁻ semiconductor layer 2. Also, the p-layer 4 is disposed in a predetermined cycle in a horizontal direction with respect to the main surfaces 2f and 2g of the n⁻ semiconductor layer 2. In this way, the n-layer 3 and p-layer 4 are repeatedly alternately disposed in a horizontal direction with respect to the main surfaces 2f and 2g of the n⁻ semiconductor layer 2, configuring a super junction structure.

The parallel pn-layer 31 is designed so that, when voltage is applied to the vertical super junction MOSFET 121, a depletion layer (not shown) spreads through the whole of the n-layer 3 sandwiched by the p-layer 4 and the p-layer 4. The n⁻ semiconductor layer 2 is a non-doped epitaxial growth layer. Specifically, the n⁻ semiconductor layer 2 is an epitaxial growth layer formed by, for example, the n⁻ semiconductor layer 2a, the n⁻ semiconductor layer 2b, the n⁻ semiconductor layer 2c, and the n⁻ semiconductor layer 2d being sequentially stacked.

The n-layer 3 is a diffusion layer formed by, for example, phosphorus ion implanted throughout the whole of the n⁻ semiconductor layer 2, which is a non-doped epitaxial growth layer, including the first region S1 and second region S2, being diffused by heat treatment. The p-layer 4 is a diffusion layer formed by, for example, boron ion implanted in the n-layer 3 being diffused by heat treatment.

The p-well region 5 in contact with the p-layer 4 and the n-drift region 6 in contact with the n-layer 3 are selectively provided in a surface layer on the main surface 2f side on the side opposite to the main surface 2g on the n⁺ semiconductor layer 1 side of the n⁻ semiconductor layer 2. The p-well region 5 is in contact with the n-drift region 6. The n-drift region 6 is sandwiched by neighboring p-well regions 5. The n-layer 3 also configures an n-drift layer.

The n-source region 7 and p-contact region 8 are selectively provided in a surface layer of the p-well region 5. The gate electrode 10 is provided across the gate oxide film 9 on the surface of the p-well region 5 sandwiched by the n-source region 7 and n-drift region 6.

The inter layer dielectric 11 covers the gate electrode 10. The source electrode 12 is electrically connected to the n-source region 7. The drain electrode 13 is electrically connected to the n⁺ semiconductor layer 1, which forms the n-drain layer. The gate electrode 10, source electrode 12, and drain electrode 13 are isolated from each other by the inter layer dielectric 11. In this way, the planar gate structure vertical super junction MOSFET 121 is provided in the first region 51 of the n⁻ semiconductor layer 2.

An isolating structure formed of the n-layer 3, which forms an n-buried isolating layer, and the n-diffused isolating layer 16 in contact with the n-layer 3 forming the n-buried isolating layer is provided in the second region S2 of the n⁻ semiconductor layer 2. The n-diffused isolating layer 16 is provided so as to reach the n-buried isolating layer from the main surface 2f on the side opposite to the main surface 2g on the n⁺ semiconductor layer 1 side of the n⁻ semiconductor layer 2. The n-diffused isolating layer 16 is formed by thermal diffusion so as to reach the n-layer 3 forming the n-buried isolating layer.

The lateral MOSFET 122 is provided in a region of the n⁻ semiconductor layer 2 bounded by the n-layer 3 forming the n-buried isolating layer and the n-diffused isolating layer 16. Specifically, the p-well region 17, n-source region 18, and n-drain region 19 configuring the lateral MOSFET 122 are provided in a region of the n⁻ semiconductor layer 2 bounded by the n-layer 3 forming the n-buried isolating layer and the n-diffused isolating layer 16.

The n-source region 18 and n-drain region 19 are selectively provided, distanced from each other, in a surface layer of the p-well region 17. The gate electrode 21 is provided across the gate oxide film 20 on the surface of a region of the p-well region 17 sandwiched by the n-source region 18 and n-drain region 19. The source electrode 22 and drain electrode 23 are electrically connected to the n-source region 18 and n-drain region 19 respectively.

The gate electrode 21, source electrode 22, and drain electrode 23 are isolated from each other by the inter layer dielectric 11, which covers the gate electrode 21. The inter layer dielectric 11 covers portions of the surface of the semiconductor substrate (n⁻ semiconductor layer 2) on which no electrode is formed, from the first region 51 to the second region S2. In this way, the planar gate structure lateral MOSFET 122 is provided in the second region S2 of the n⁻ semiconductor layer 2.

The impurity concentration of each region of the vertical super junction MOSFET 121 and lateral MOSFET 122 is the same as the impurity concentration of each region of the vertical super junction MOSFET and lateral MOSFET configuring the semiconductor device according to Embodiment 1.

The semiconductor device 120 shown in FIG. 3 is such that the n-layer 3 functioning as the buried isolating layer is thicker than that in the semiconductor device according to Embodiment 1. Because of this, in comparison with the semiconductor device according to Embodiment 1, it is possible to increase the advantages of suppressing malfunction of a parasitic transistor configured by the vertical super junction MOSFET 121 and lateral MOSFET 122, and reducing leakage current in a pn-junction portion of the parasitic transistor.

As heretofore described, according to Embodiment 3, it is possible to obtain the same advantages as with the semiconductor device according to Embodiment 1.

Embodiment 4

Figure 4:
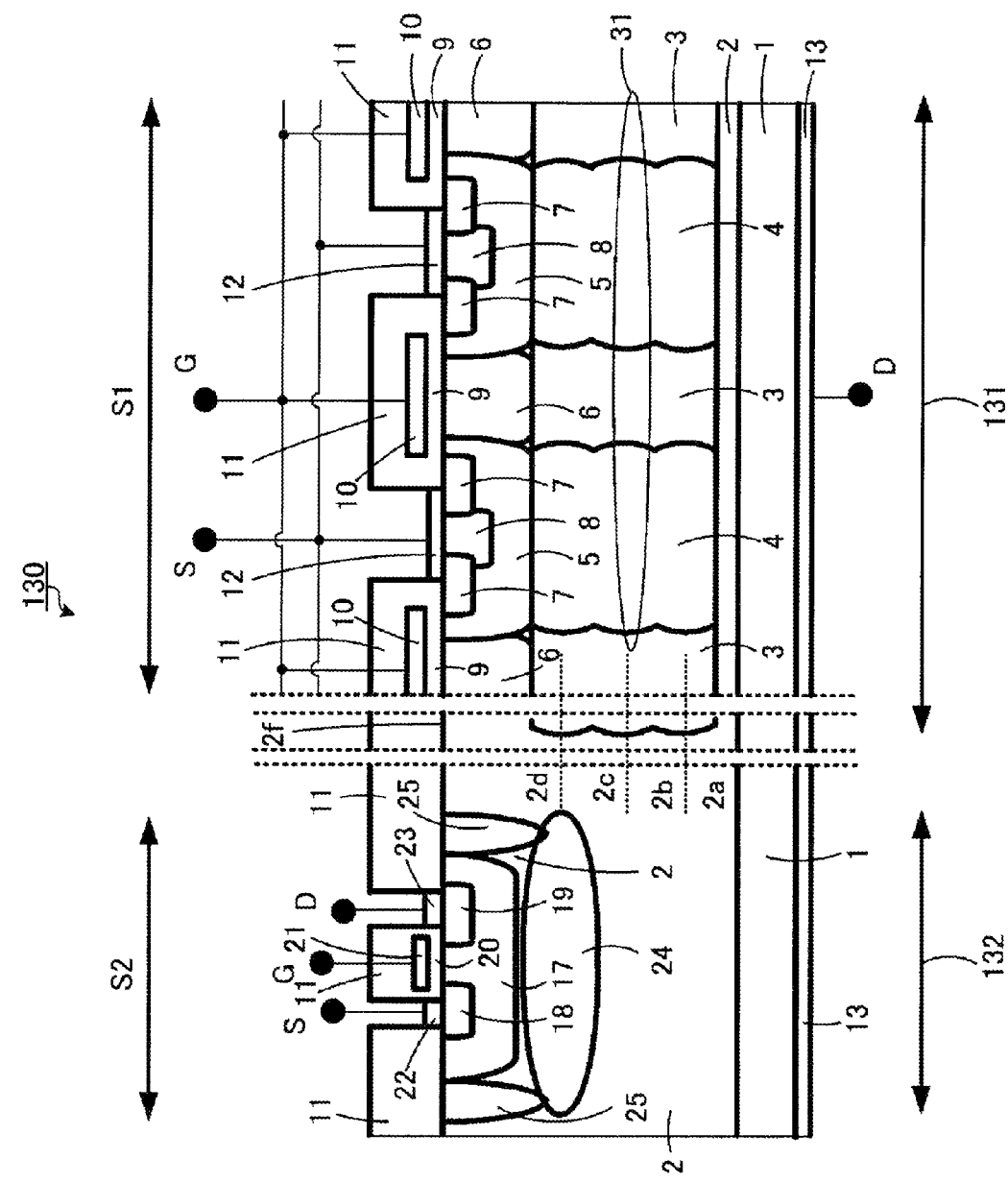
FIG. 4 is a sectional view showing a configuration of a main portion of a semiconductor device according to Embodiment 4 of the invention.

FIG. 4 is a sectional view showing a configuration of a main portion of a semiconductor device according to Embodiment 4 of the invention. A difference between a semiconductor device 130 shown in FIG. 4 and the semiconductor device 100 shown in FIG. 1 is that the n-buried isolating layer 15 and n-diffused isolating layer 16 configuring the isolating structure in the semiconductor device 100 are changed to a p-buried isolating layer 24 and p-diffused isolating layer 25 in the semiconductor device 130.

That is, the semiconductor device 130 is such that a vertical super junction MOSFET 131 and lateral MOSFET 132 are electrically isolated by the lateral MOSFET 132 being bounded by the p-buried isolating layer 24 and p-diffused isolating layer 25, whose conductivity differs from that of the n⁻ semiconductor layer 2. Configurations of the semiconductor device 130 other than the p-buried isolating layer 24 and p-diffused isolating layer 25 are the same as in the semiconductor device 100 shown in FIG. 1.

With the semiconductor device 130 too, it is possible to obtain the advantages of suppressing malfunction of a parasitic transistor configured by the vertical super junction MOSFET 131 and lateral MOSFET 132, and reducing leakage current in a pn-junction portion of the parasitic transistor, in the same way as with the semiconductor device 100 shown in FIG. 1.

The configuration wherein the n-buried isolating layer 15 and n-diffused isolating layer 16 configuring the isolating structure are changed to the p-buried isolating layer 24 and p-diffused isolating layer 25 can also be applied to the semiconductor device 110 shown in FIG. 2, wherein the n-layer 3 and p-layer 4 of the parallel pn-layer 31 are selectively formed in the n⁻ semiconductor layer 2.

Also, the configuration wherein the n-diffused isolating layer 16 configuring the isolating structure is changed to the p-diffused isolating layer 25 can also be applied to the semiconductor device 120 shown in FIG. 3, wherein the n-layer 3 is formed over the whole of the n⁻ semiconductor layer 2.

As heretofore described, according to Embodiment 4, it is possible to obtain the same advantages as with the semiconductor device according to Embodiment 1.

Embodiment 5

Figure 5:
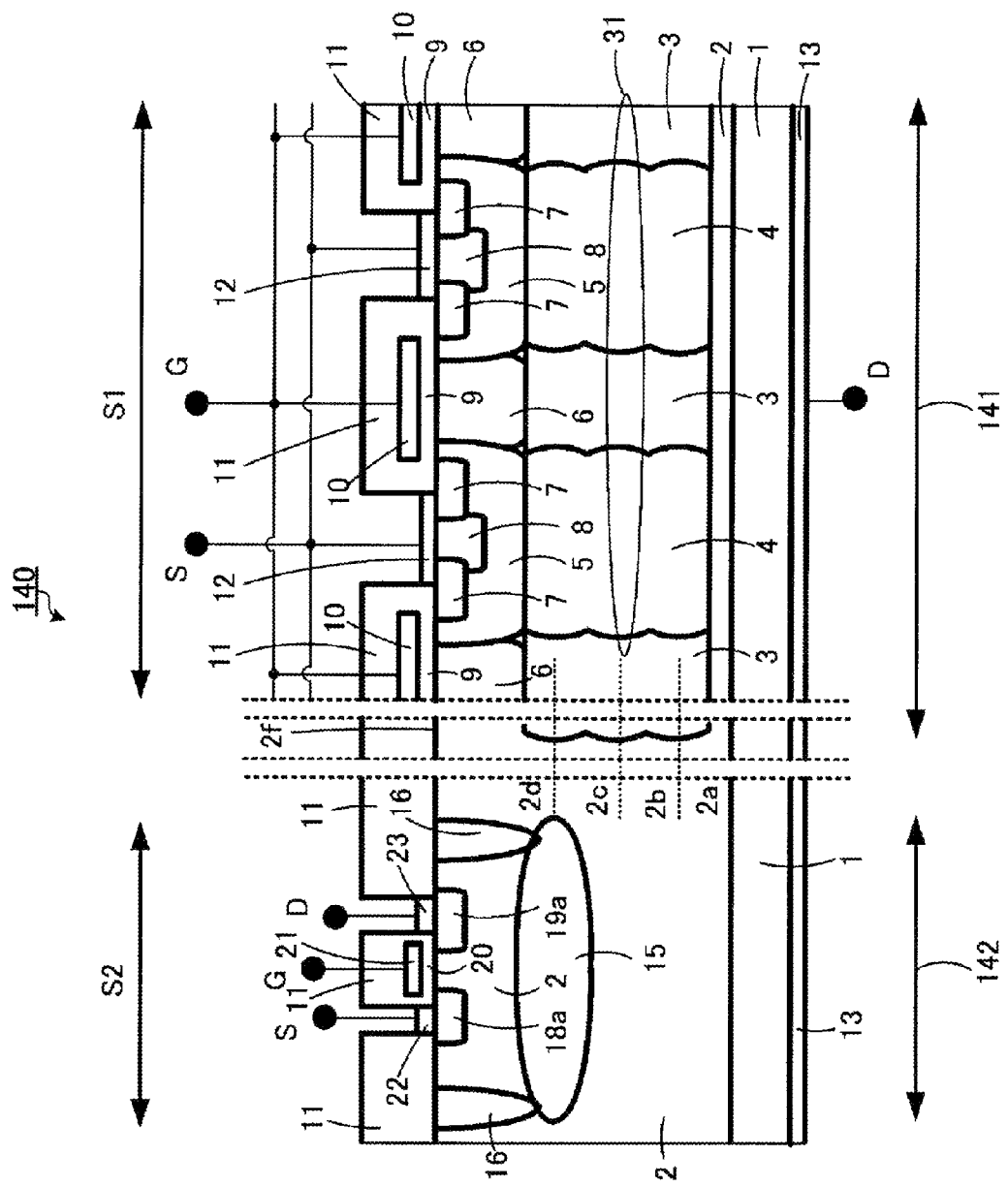
FIG. 5 is a sectional view showing a configuration of a main portion of a semiconductor device according to Embodiment 5 of the invention.

FIG. 5 is a sectional view showing a configuration of a main portion of a semiconductor device according to Embodiment 5 of the invention. A difference between a semiconductor device 140 shown in FIG. 5 and the semiconductor device 100 shown in FIG. 1 is that the lateral MOSFET 102 assumed to be an n-channel type in the semiconductor device 100 is changed to a p-channel type lateral MOSFET 142 in the semiconductor device 140.

In the semiconductor device 140, a reference sign 18a and element 19a are a p-source region and a p-drain region. Also, a region of the n⁻ semiconductor layer 2 bounded by the n-buried isolating layer 15 and n-diffused isolating layer 16 forms an n-well region. The configuration of a vertical super junction MOSFET 141 is the same as that of the vertical super junction MOSFET of the semiconductor device 100 shown in FIG. 1.

The configuration wherein the lateral MOSFET is a p-channel type can also be applied to the semiconductor device 110 shown in FIG. 2, wherein the n-layer 3 and p-layer 4 of the parallel pn-layer 31 are selectively formed in the n⁻ semiconductor layer 2, and to the semiconductor device 120 shown in FIG. 3, wherein the n-layer 3 is formed over the whole of the n⁻ semiconductor layer 2.

As heretofore described, according to Embodiment 5, it is possible to obtain the same advantages as with the semiconductor device according to Embodiment 1.

Embodiment 6

Figure 6:
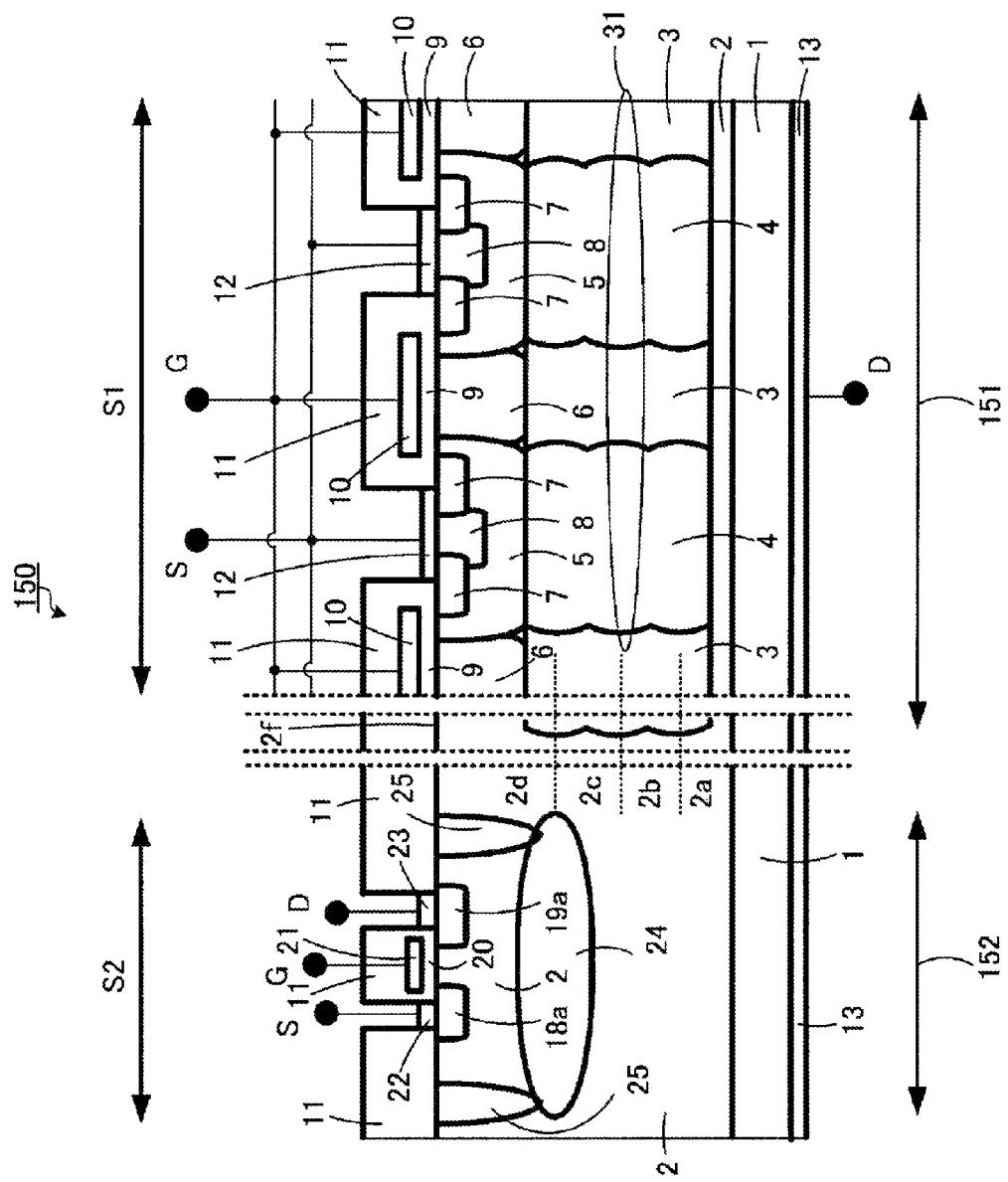
FIG. 6 is a sectional view showing a configuration of a main portion of a semiconductor device according to Embodiment 6 of the invention.

FIG. 6 is a sectional view showing a configuration of a main portion of a semiconductor device according to Embodiment 6 of the invention. A difference between a semiconductor device 150 shown in FIG. 6 and the semiconductor device 140 shown in FIG. 5 is that the n-buried isolating layer 15 and n-diffused isolating layer 16 configuring the isolating structure in the semiconductor device 140 are changed to the p-buried isolating layer 24 and p-diffused isolating layer 25 in the semiconductor device 150.

That is, the semiconductor device 150 is such that a vertical super junction MOSFET 151 and lateral MOSFET 152 are electrically isolated by the lateral MOSFET 152 being bounded by the p-buried isolating layer 24 and p-diffused isolating layer 25, whose conductivity differs from that of the n⁻ semiconductor layer 2. Configurations of the semiconductor device 150 other than the p-buried isolating layer 24 and p-diffused isolating layer 25 are the same as in the semiconductor device 140 shown in FIG. 5.

When changing the region configuring the isolating structure to a p-type in this way too, it is possible to obtain the advantages of suppressing malfunction of a parasitic transistor configured by the vertical super junction MOSFET 151 and lateral MOSFET 152, and reducing leakage current in a pn-junction portion of the parasitic transistor, in the same way as with the semiconductor device 140 shown in FIG. 5.

The configuration wherein the lateral MOSFET is changed from an n-channel type to a p-channel type and the n-buried isolating layer 15 and n-diffused isolating layer 16 configuring the isolating structure are changed to the p-buried isolating layer 24 and p-diffused isolating layer 25 can also be applied to the semiconductor device 110 shown in FIG. 2, wherein the n-layer 3 and p-layer 4 of the parallel pn-layer 31 are selectively formed in the n⁻ semiconductor layer 2.

Also, the configuration wherein the lateral MOSFET is changed from an n-channel type to a p-channel type and the n-diffused isolating layer 16 configuring the isolating structure is changed to the p-diffused isolating layer 25 can also be applied to the semiconductor device 120 shown in FIG. 3, wherein the n-layer 3 is formed over the whole of the n⁻ semiconductor layer 2.

As heretofore described, according to Embodiment 6, it is possible to obtain the same advantages as with the semiconductor device according to Embodiment 5.

Embodiment 7

Figure 7:
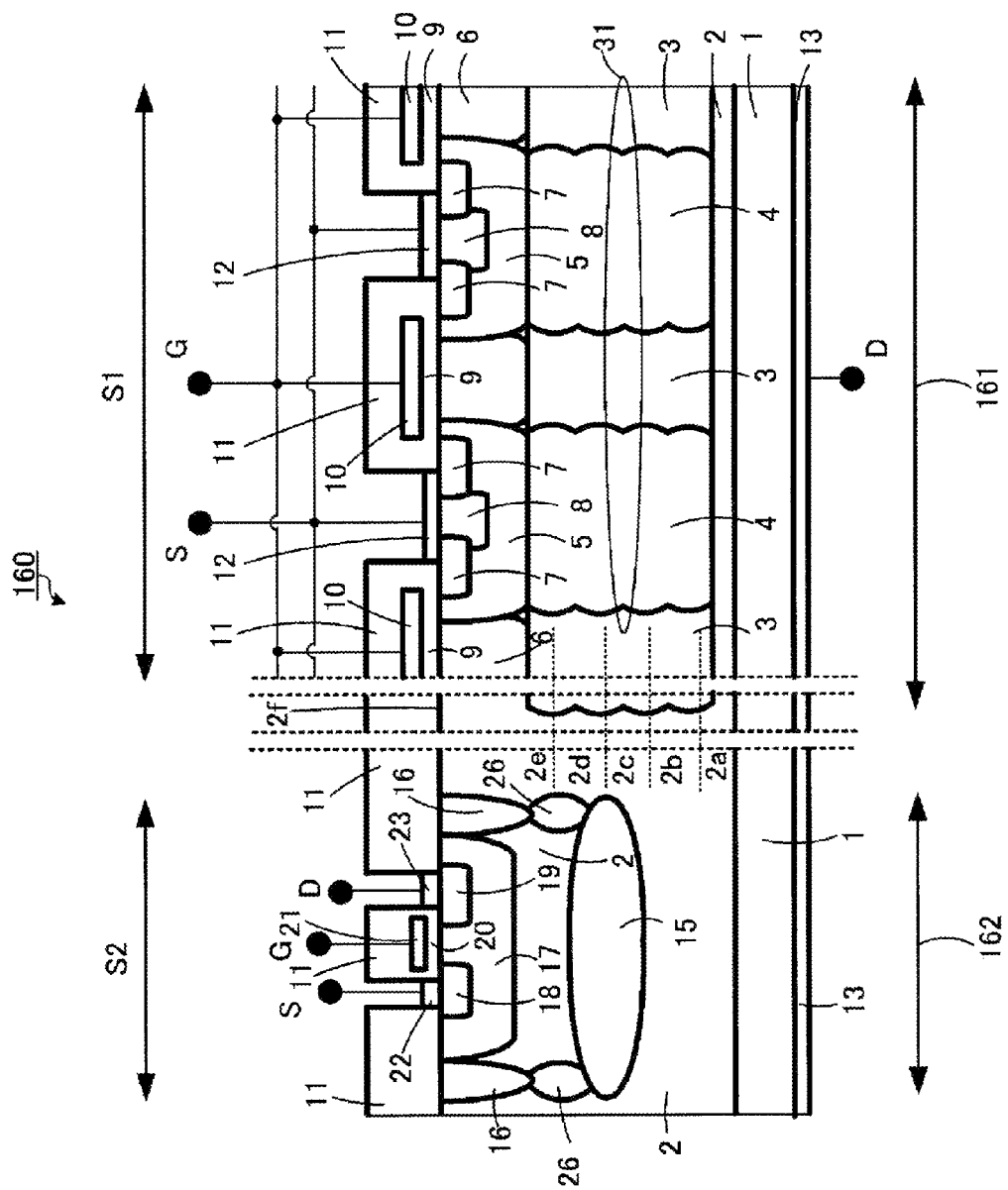
FIG. 7 is a sectional view showing a configuration of a main portion of a semiconductor device according to Embodiment 7 of the invention.

FIG. 7 is a sectional view showing a configuration of a main portion of a semiconductor device according to Embodiment 7 of the invention. A difference between a semiconductor device 160 shown in FIG. 7 and the semiconductor device 100 shown in FIG. 1 is that an n-layer 26 is provided in the semiconductor device 160 as one portion of an isolating structure between the n-buried isolating layer 15 and n-diffused isolating layer 16. The n-layer 26 is formed so as to be in contact with, for example, an outer peripheral portion of the n-buried isolating layer 15. The semiconductor device 160 is such that, by the n-layer 26 being provided as one portion of the isolating structure, the thickness of the n⁻ semiconductor layer 2, which is an n⁻ high resistance layer in contact with the p-well region 17, is greater than that in the semiconductor device 100.

The semiconductor device 160 is such that an isolating structure is configured of the n-diffused isolating layer 16, n-buried isolating layer 15, and n-layer 26, electrically isolating a vertical super junction MOSFET 161 and a lateral MOSFET 162. Configurations of the semiconductor device 160 other than the n-layer 26 are the same as in the semiconductor device 100 shown in FIG. 1.

By adopting the configuration of the semiconductor device 160, the portion of a region of the n⁻ semiconductor layer 2 bounded by the n-diffused isolating layer 16, n-buried isolating layer 15, and n-layer 26 through which a depletion layer spreads increases. Because of this, it is possible to increase the breakdown voltage of the portion bounded by the isolating structure, that is, of the lateral MOSFET 162.

The isolating structure configured of the n-diffused isolating layer 16, n-buried isolating layer 15, and n-layer 26 can also be applied to the semiconductor device 110 shown in FIG. 2, wherein the n-layer 3 and p-layer 4 of the parallel pn-layer 31 are selectively formed in the n⁻ semiconductor layer 2.

Also, although omitted from the drawings, the isolating structure may also be configured of a p-diffused isolating layer, a p-buried isolating layer, and a p-layer. An isolating structure configured of a p-diffused isolating layer, a p-buried isolating layer, and a p-layer can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

As heretofore described, according to Embodiment 7, it is possible to obtain the same advantages as with the semiconductor device according to Embodiment 1.

Embodiment 8

Figure 8:
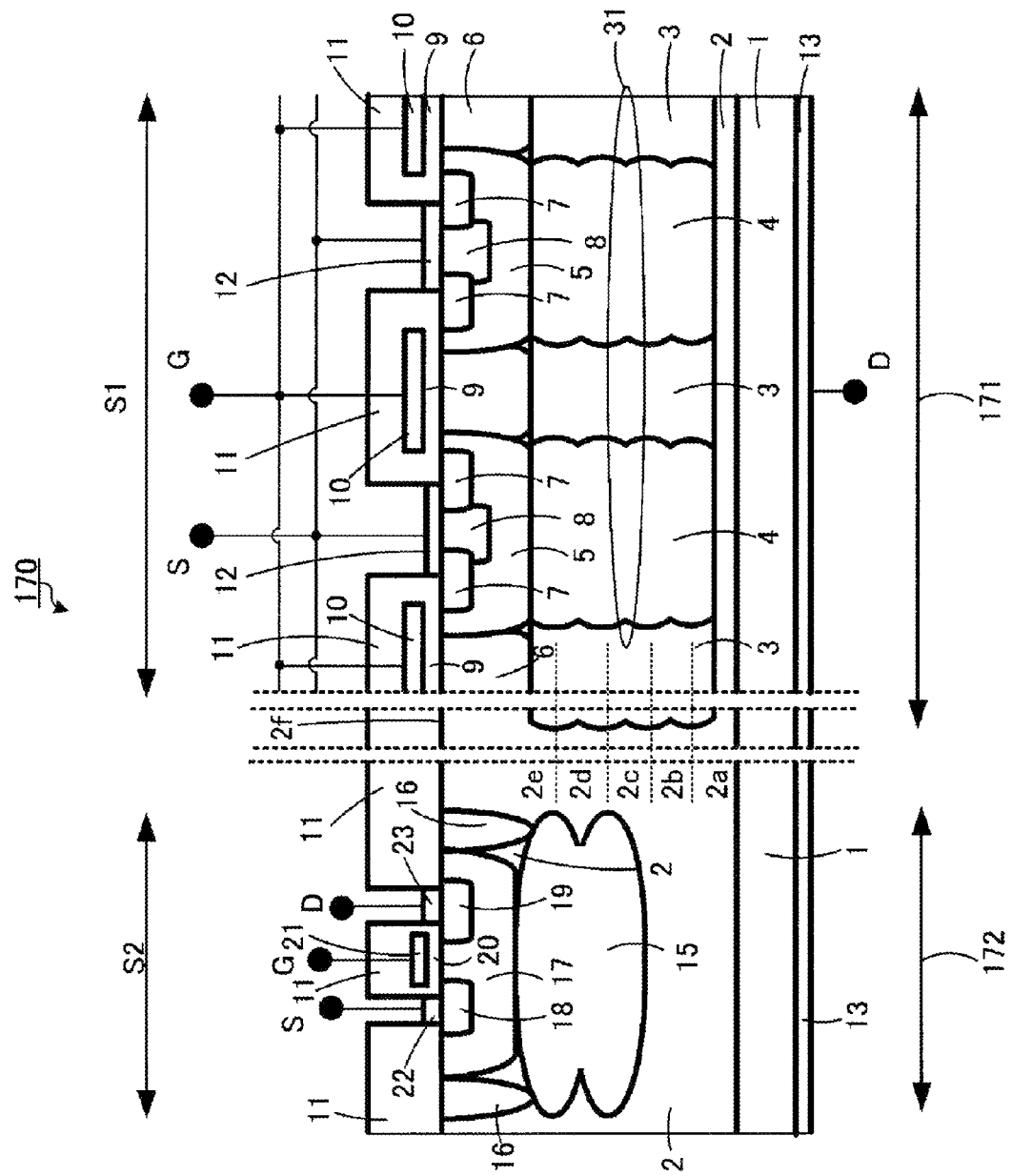
FIG. 8 is a sectional view showing a configuration of a main portion of a semiconductor device according to Embodiment 8 of the invention.

FIG. 8 is a sectional view showing a configuration of a main portion of a semiconductor device according to Embodiment 8 of the invention. A difference between a semiconductor device 170 shown in FIG. 8 and the semiconductor device 100 shown in FIG. 1 is that the n-buried isolating layer 15 in the semiconductor device 170 is formed more thickly than that in the semiconductor device 100. Configurations of the semiconductor device 170 other than the thickness of the n-buried isolating layer 15 are the same as in the semiconductor device 100 shown in FIG. 1.

By the n-buried isolating layer 15 configuring the isolating structure being formed more thickly than that in the semiconductor device 100 shown in FIG. 1, it is possible to increase the advantages of suppressing malfunction of a parasitic transistor formed by a vertical super junction MOSFET 171 and lateral MOSFET 172, and reducing leakage current in a pn-junction portion of the parasitic transistor.

The configuration wherein the n-buried isolating layer 15 configuring an isolating structure is formed more thickly than that in the semiconductor device 100 shown in FIG. 1 can also be applied to the semiconductor device 110 shown in FIG. 2, wherein the n-layer 3 and p-layer 4 of the parallel pn-layer 31 are selectively formed in the n⁻ semiconductor layer 2.

As heretofore described, according to Embodiment 8, it is possible to obtain the same advantages as with the semiconductor device according to Embodiment 1.

Embodiment 9

Figure 9:
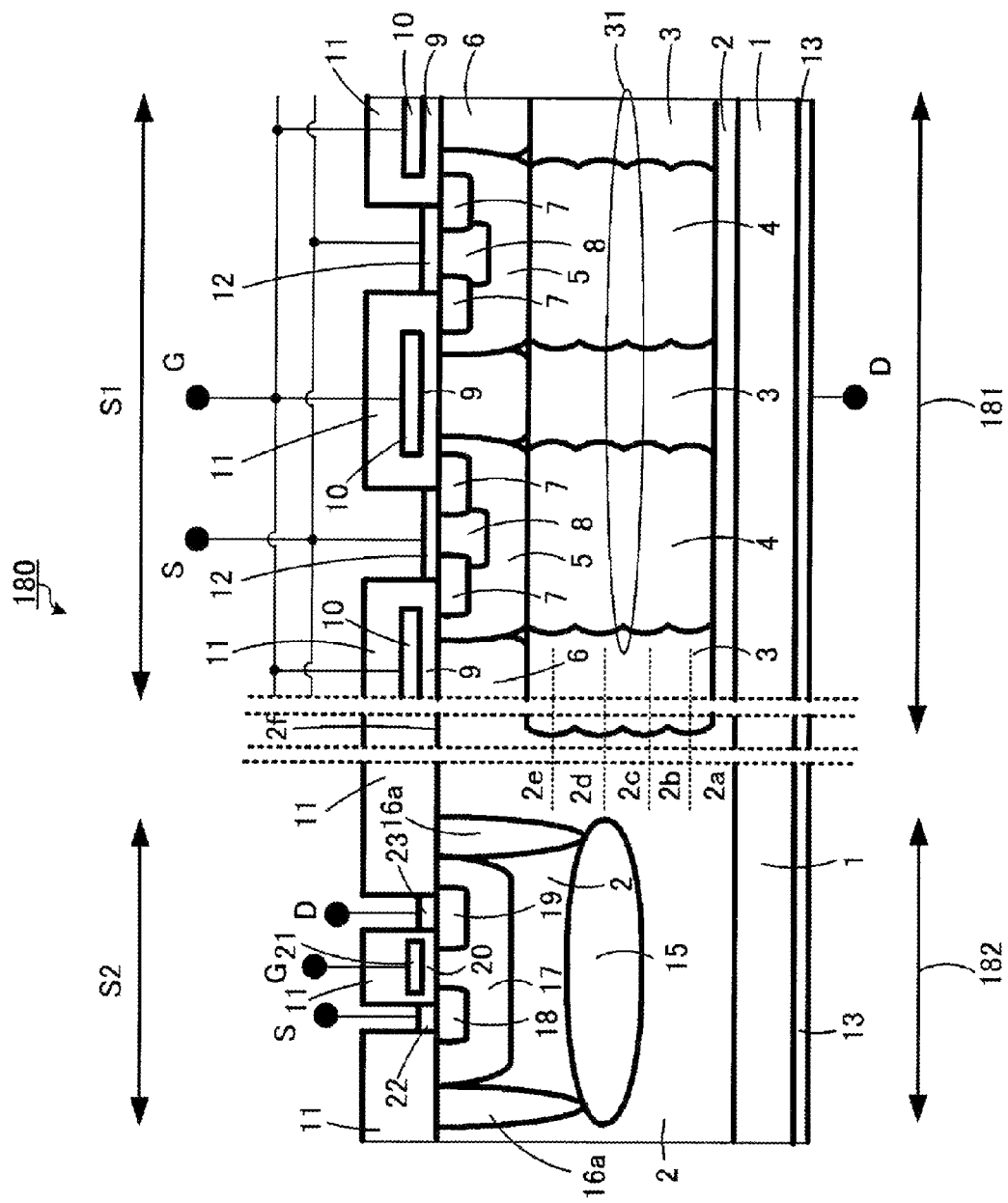
FIG. 9 is a sectional view showing a configuration of a main portion of a semiconductor device according to Embodiment 9 of the invention.

FIG. 9 is a sectional view showing a configuration of a main portion of a semiconductor device according to Embodiment 9 of the invention. A difference between a semiconductor device 180 shown in FIG. 9 and the semiconductor device 160 shown in FIG. 7 is that in the semiconductor device 180, an n-diffused isolating layer 16a is formed deeply so as to reach the n-buried isolating layer 15, without providing the n-layer 26 of the semiconductor device 160.

That is, the semiconductor device 180 is such that an isolating structure is configured of the n-buried isolating layer 15 and n-diffused isolating layer 16a, and the thickness of the n⁻ semiconductor layer 2 in contact with the p-well region 17 is greater than that in the semiconductor device 100 shown in FIG. 1. A vertical super junction MOSFET 181 and lateral MOSFET 182 are electrically isolated by the isolating structure formed of the n-buried isolating layer 15 and n-diffused isolating layer 16a. Configurations of the semiconductor device 180 other than the deepness of the n-diffused isolating layer 16a are the same as in the semiconductor device 160 shown in FIG. 7.

By adopting the configuration of the semiconductor device 180, it is possible to increase the breakdown voltage of the lateral MOSFET 182, in the same way as with the semiconductor device 160 shown in FIG. 7. The configuration wherein the isolating structure is configured of the n-buried isolating layer 15 and n-diffused isolating layer 16a and the thickness of the n⁻ semiconductor layer 2 in contact with the p-well region 17 is formed to be greater than that in the semiconductor device 100 shown in FIG. 1 can also be applied to the semiconductor device 110 shown in FIG. 2, wherein the n-layer 3 and p-layer 4 of the parallel pn-layer 31 are selectively formed in the n⁻ semiconductor layer 2.

Also, although omitted from the drawings, the isolating structure may also be configured of a p-diffused isolating layer, a p-buried isolating layer, and a p-layer. An isolating structure configured of a p-diffused isolating layer, a p-buried isolating layer, and a p-layer can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

As heretofore described, according to Embodiment 9, it is possible to obtain the same advantages as with the semiconductor device according to Embodiment 7.

Embodiment 10

Figure 10:
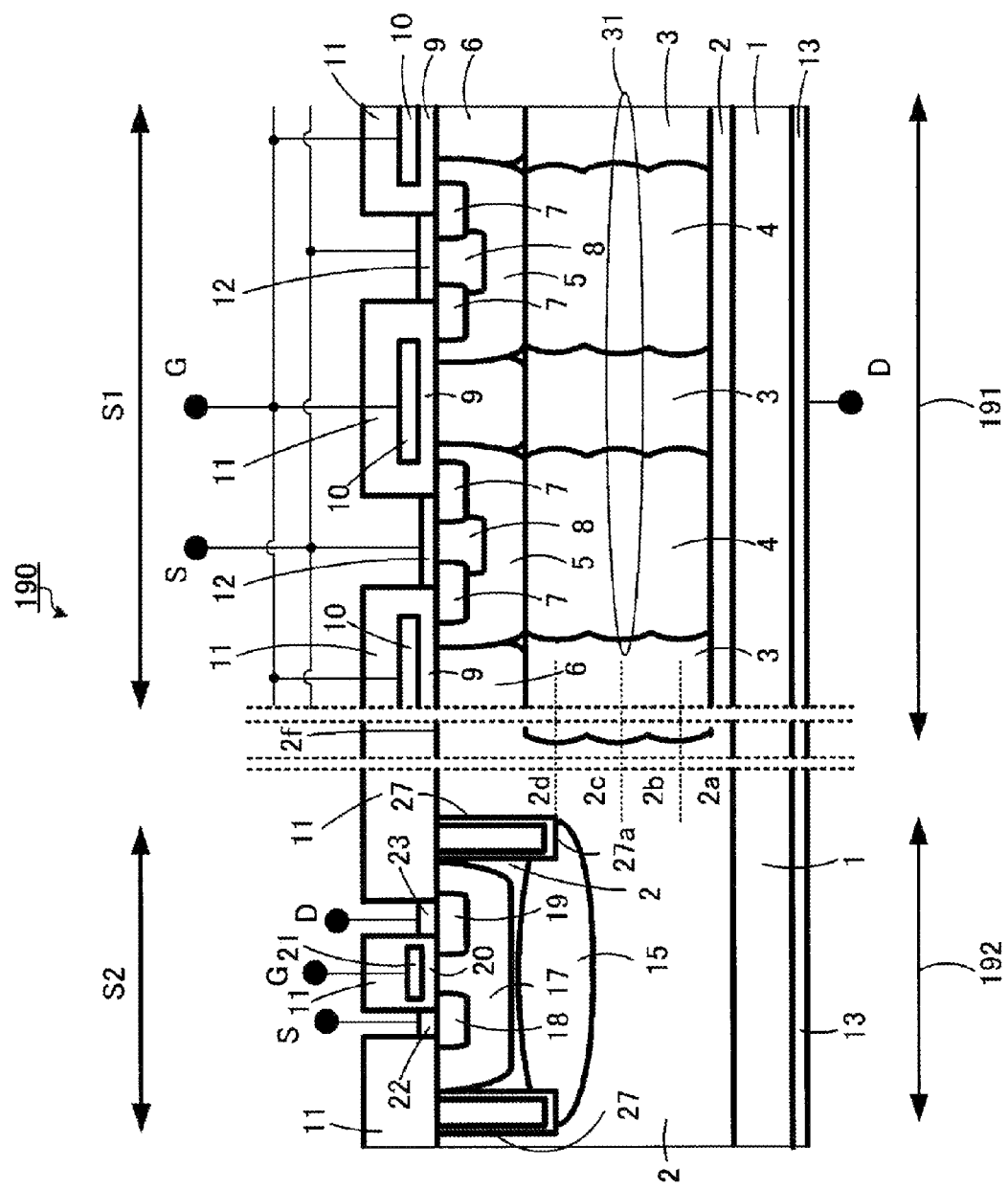
FIG. 10 is a sectional view showing a configuration of a main portion of a semiconductor device according to Embodiment 10 of the invention.

FIG. 10 is a sectional view showing a configuration of a main portion of a semiconductor device according to Embodiment 10 of the invention. A difference between a semiconductor device 190 shown in FIG. 10 and the semiconductor device 100 shown in FIG. 1 is that the n-diffused isolating layer 16 in the semiconductor device 100 is changed to a trench isolating structure 27 in the semiconductor device 190.

In the semiconductor device 190, the trench isolating structure 27 has a configuration wherein an insulating film is formed on the side walls and bottom surface of a trench 27a, and polysilicon is embedded inside the trench 27a across the insulating film. The trench isolating structure 27 is provided to a depth reaching the n-buried isolating layer 15. The trench isolating structure 27 may also be of a configuration wherein the whole of the inside of the trench 27a is filled with an insulating material. Configurations of the semiconductor device 190 other than the trench isolating structure 27 are the same as in the semiconductor device 100 shown in FIG. 1.

By adopting the configuration of the semiconductor device 190, it is possible to obtain the advantages of suppressing malfunction of a parasitic transistor formed by a vertical super junction MOSFET 191 and lateral MOSFET 192, and reducing leakage current in a pn-junction portion of the parasitic transistor, in the same way as with the semiconductor device 100 shown in FIG. 1.

An isolating structure configured of the n-buried isolating layer 15 and trench isolating structure 27 can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

Also, although omitted from the drawings, the isolating structure may also be configured of a p-diffused isolating layer, a p-buried isolating layer, and a p-layer. An isolating structure configured of a p-diffused isolating layer, a p-buried isolating layer, and a p-layer can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

As heretofore described, according to Embodiment 10, it is possible to obtain the same advantages as with the semiconductor device according to Embodiment 1.

Embodiment 11

Figure 11:
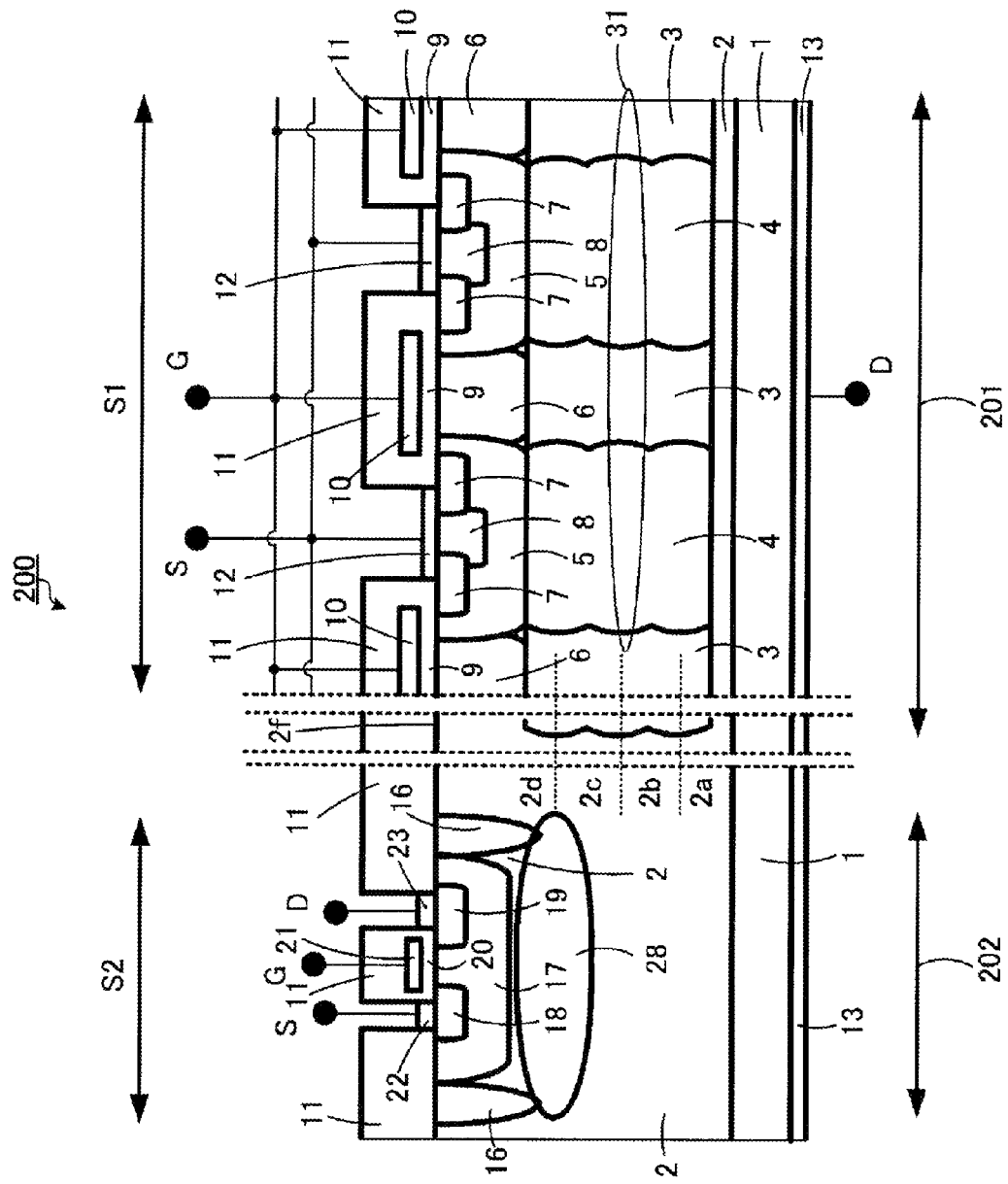
FIG. 11 is a sectional view showing a configuration of a main portion of a semiconductor device according to Embodiment 11 of the invention.

FIG. 11 is a sectional view showing a configuration of a main portion of a semiconductor device according to Embodiment 11 of the invention. A difference between a semiconductor device 200 shown in FIG. 11 and the semiconductor device 100 shown in FIG. 1 is that the impurity concentration of an n-buried isolating layer 28 configuring an isolating structure in the semiconductor device 200 is higher than that of the n-layer 3. Configurations of the semiconductor device 200 other than the impurity concentration of the n-buried isolating layer 28 are the same as in the semiconductor device 100 shown in FIG. 1.

By adopting the configuration of the semiconductor device 200, it is possible to increase the advantages of suppressing malfunction of a parasitic transistor formed by a vertical super junction MOSFET 201 and lateral MOSFET 202, and reducing leakage current in a pn-junction portion of the parasitic transistor.

An isolating structure configured of the n-diffused isolating layer 16 and n-buried isolating layer 28 can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

Also, although omitted from the drawings, the isolating structure may also be configured of a p-diffused isolating layer, a p-buried isolating layer, and a p-layer. An isolating structure configured of a p-diffused isolating layer, a p-buried isolating layer, and a p-layer can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

As heretofore described, according to Embodiment 11, it is possible to obtain the same advantages as with the semiconductor device according to Embodiment 1.

Embodiment 12

Figure 12:
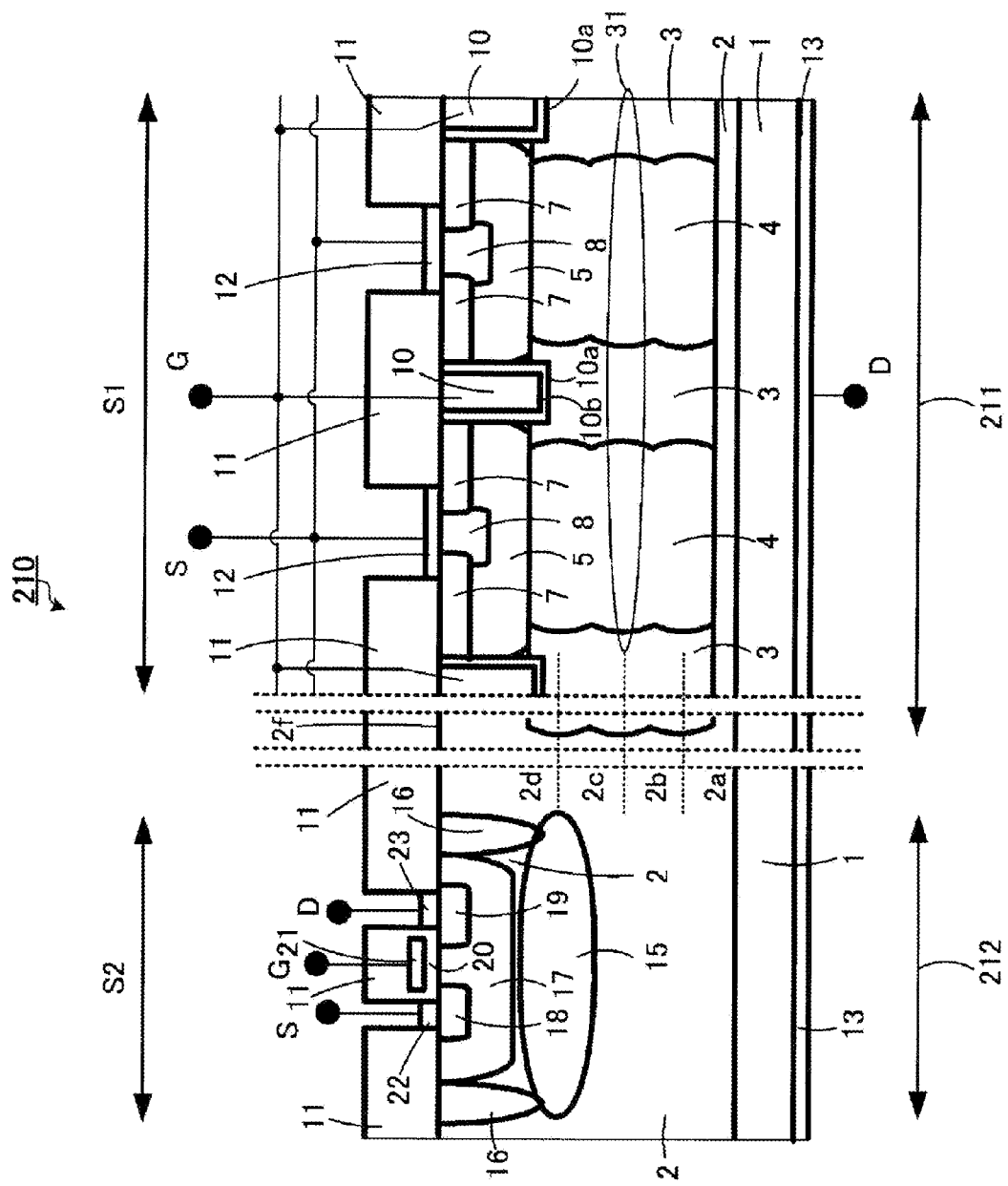
FIG. 12 is a sectional view showing a configuration of a main portion of a semiconductor device according to Embodiment 12 of the invention.

FIG. 12 is a sectional view showing a configuration of a main portion of a semiconductor device according to Embodiment 12 of the invention. A difference between a semiconductor device 210 shown in FIG. 12 and the semiconductor device 100 shown in FIG. 1 is that, in the semiconductor device 210, the gate structure of a vertical super junction MOSFET 211 is changed from a planar gate structure to a trench gate structure.

Element 10a in FIG. 12 is a gate portion trench, while element 10b is a gate oxide film. That is, the semiconductor device 210 is such that the trench 10a is provided between neighboring p-well regions 5, in contact with the p-well regions 5 and reaching the n-layer 3 of the parallel pn-layer 31. Further, the gate electrode 10 is embedded inside the trench 10a, across the gate oxide film 10b. Configurations of the vertical super junction MOSFET 211 other than the gate structure are the same as those of the vertical super junction MOSFET of the semiconductor device 100 shown in FIG. 1. The configuration of a lateral MOSFET 212 is the same as that of the lateral MOSFET of the semiconductor device 100 shown in FIG. 1.

As the configuration of the semiconductor device 210 has no J-FET effect, it has an advantage in that it is possible to attempt a reduction of on-state resistance. The configuration wherein the vertical super junction MOSFET 211 has a trench gate structure can also be applied to the semiconductor device 110 shown in FIG. 2, wherein the n-layer 3 and p-layer 4 of the parallel pn-layer 31 are selectively formed in the n⁻ semiconductor layer 2, or to the semiconductor device 120 shown in FIG. 3, wherein the n-layer 3 is formed over the whole of the n⁻ semiconductor layer 2.

As heretofore described, according to Embodiment 12, it is possible to obtain the same advantages as with the semiconductor device according to Embodiment 1.

Embodiment 13

Figure 13:
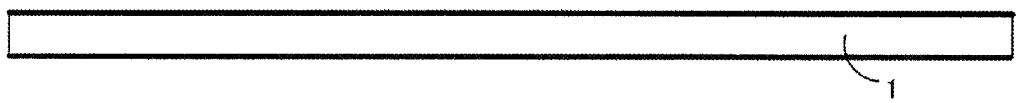
FIGS. 13(a) to 13(d) are sectional views showing, in step order, a semiconductor device manufacturing method according to Embodiment 13 of the invention.
Figure 13:
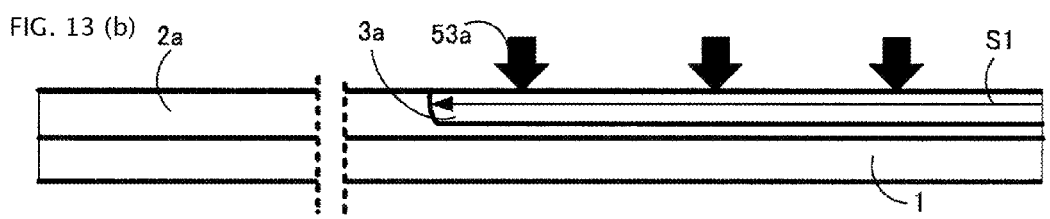
Figure 13:
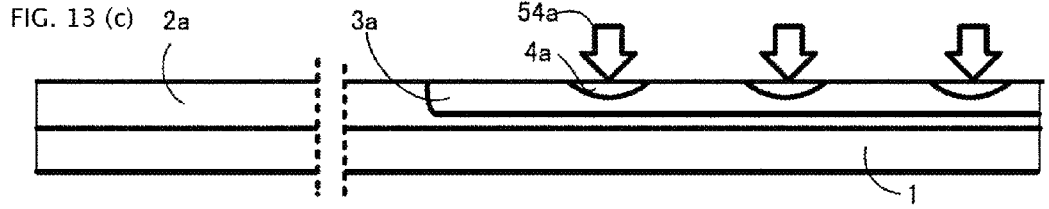
Figure 13:
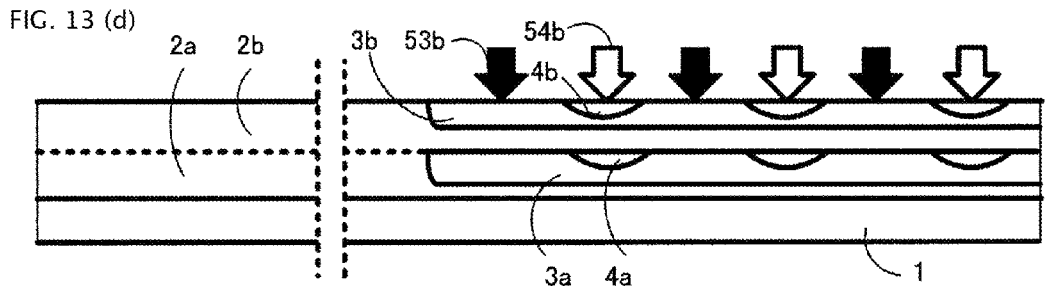
Figure 14:
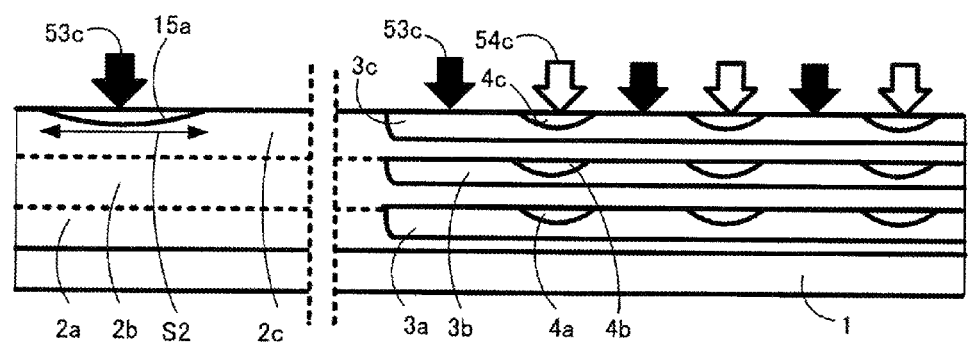
FIGS. 14(e) and 14(f) are sectional views showing, in step order, the semiconductor device manufacturing method according to Embodiment 13 of the invention.
Figure 14:
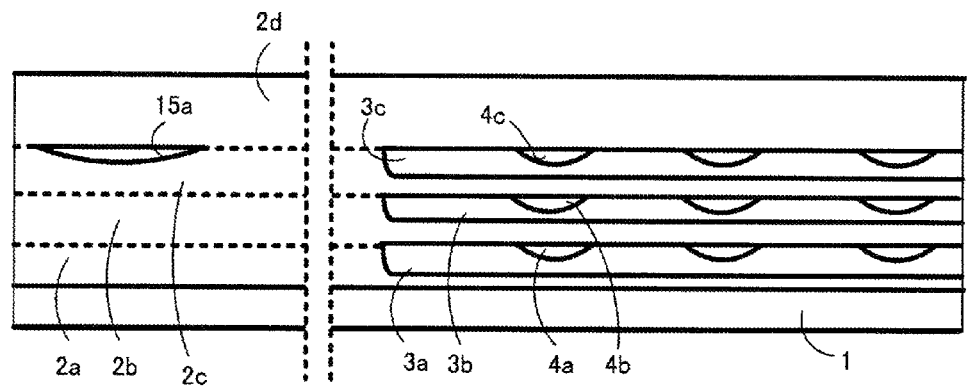
Figure 15:
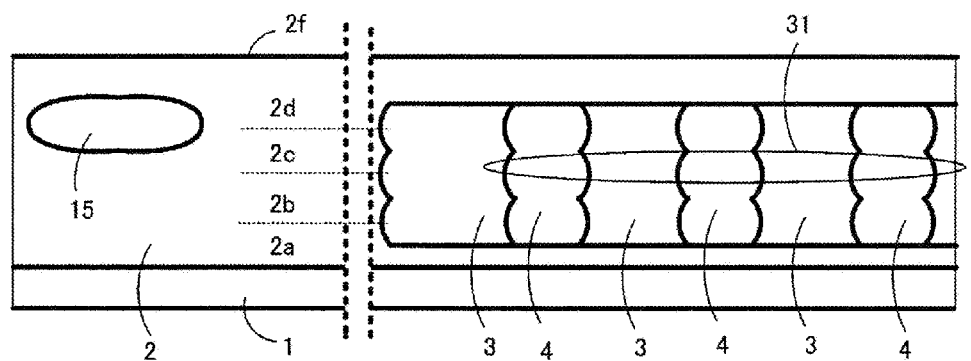
FIGS. 15(g) and 15(h) are sectional views showing, in step order, the semiconductor device manufacturing method according to Embodiment 13 of the invention.
Figure 15:
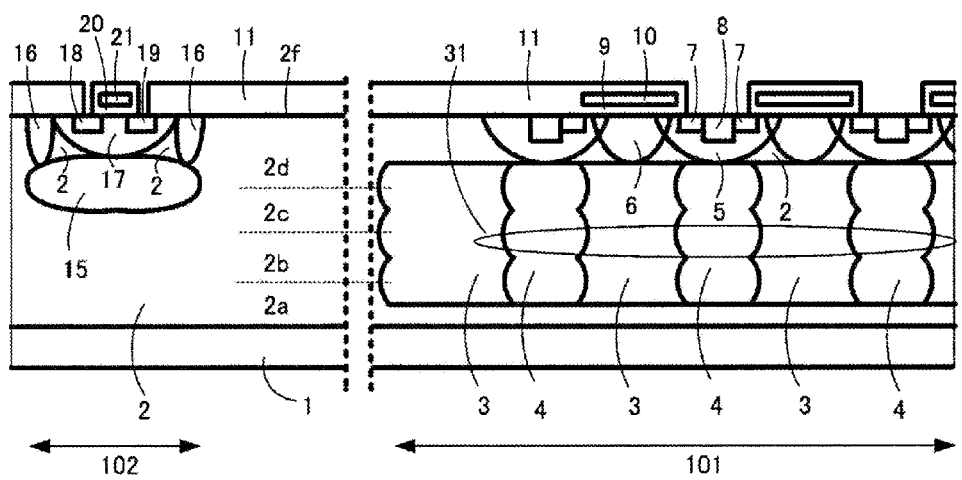

FIG. 13 to FIG. 15 are sectional views showing, in step order, a semiconductor device manufacturing method according to Embodiment 13 of the invention. In Embodiment 13, a description will be given of a method of manufacturing the semiconductor device 100 according to Embodiment 1 shown in FIG. 1. Firstly, a support substrate, which is to form the n+ semiconductor layer 1, is prepared. The n+ semiconductor layer 1 forms the n-drain layer of the vertical super junction MOSFET 101 (FIG. 13(a)).

Next, the n⁻ semiconductor layer 2a is epitaxially grown to a thickness of in the region of, for example, 7 μm, without doping, on the n+ semiconductor layer 1. Next, an n-type impurity (for example, phosphorus or the like) ion implantation 53a is carried out throughout the whole of the first region S1, in which the vertical super junction MOSFET 101 is formed, of the n⁻ semiconductor layer 2a, forming an n-type ion implantation layer 3a in a surface layer of the first region S1 of the n⁻ semiconductor layer 2a (FIG. 13(b)).

The ion implantation 53a into the n⁻ semiconductor layer 2a is carried out, for example, with a resist mask (not shown) having an aperture portion that exposes the whole of the first region S1 of the n⁻ semiconductor layer 2a as a mask. That is, the region of the n⁻ semiconductor layer 2a in which the n-type ion implantation layer 3a is to be formed is exposed in the aperture portion of the resist mask. The resist mask used in the ion implantation 53a is, for example, formed in advance on the surface of the n⁻ semiconductor layer 2a before the ion implantation 53a into the n⁻ semiconductor layer 2a is carried out, and removed before the formation of a resist mask used in a subsequent ion implantation 54a into the n-type ion implantation layer 3a.

Hereafter, although a description and depiction of a resist mask when ions are implanted are omitted, a resist mask is used when an implantation of ions into a semiconductor layer or ion implantation layer is carried out, in the same way as for the ion implantation 53a into the n⁻ semiconductor layer 2a (in Embodiments 14 to 20 too, although a description and depiction are omitted in the same way, a resist mask is used when ions are implanted).

Specifically, when an implantation of ions into a semiconductor layer or ion implantation layer is carried out, a resist mask having an aperture portion that selectively exposes a desired region of the semiconductor layer or ion implantation layer is formed. Then, after the resist mask is used as a mask for ion implantation, it is removed before the formation of a resist mask when ions are next implanted, or before the formation of an epitaxial layer.

Next, a p-type impurity (for example, boron or the like) ion implantation 54a is selectively carried out into the n-type ion implantation layer 3a, forming a plurality of p-type ion implantation layers 4a in a surface layer of the n-type ion implantation layer 3a (FIG. 13(c)). The dose of the p-type impurity of the ion implantation 54a into the n-type ion implantation layer 3a is a dose larger than the dose of the n-type impurity of the ion implantation 53a into the n⁻ semiconductor layer 2a when forming the n-type ion implantation layer 3a.

Next, the n⁻ semiconductor layer 2b is epitaxially grown to a thickness of in the region of, for example, 7 μm, without doping, on the n⁻ semiconductor layer 2a. Next, an n-type impurity ion implantation 53b is carried out throughout the whole of the first region S1 of the n⁻ semiconductor layer 2b, forming an n-type ion implantation layer 3b in a surface layer of the first region S1 of the n⁻ semiconductor layer 2b. Then, a p-type impurity ion implantation 54b is selectively carried out into regions of the n-type ion implantation layer 3b directly above the p-type ion implantation layers 4a, forming a plurality of p-type ion implantation layers 4b in a surface layer of the n-type ion implantation layer 3b (FIG. 13(d)).

The dose of the p-type impurity of the ion implantation 54b into the n-type ion implantation layer 3b is a dose larger than the dose of the n-type impurity of the ion implantation 53b into the n⁻ semiconductor layer 2b when forming the n-type ion implantation layer 3b. Although a depiction is omitted from FIG. 13(d), the steps of forming the n⁻ semiconductor layer 2b, the n-type ion implantation layer 3b, and the p-type ion implantation layer 4b (the steps of FIG. 13(d)) are normally repeated in the region of six or seven times, increasing the thickness of the parallel pn-layer 31 after completion.

Next, the n⁻ semiconductor layer 2c is epitaxially grown to a thickness of in the region of, for example, 7 μm, without doping, on the n⁻ semiconductor layer 2b. Then, an n-type impurity ion implantation 53c is carried out throughout each of the whole of the first region S1 and the whole of the second region S2, in which the n-buried isolating layer 15 is formed, of the n⁻ semiconductor layer 2c. By so doing, an n-type ion implantation layer 3c is formed in a surface layer of the first region S1 of the n⁻ semiconductor layer 2c, and an n-type ion implantation layer 15a is formed in a surface layer of the second region S2 of the n⁻ semiconductor layer 2c.

Next, a p-type impurity ion implantation 54c is selectively carried out into regions of the n-type ion implantation layer 3c directly above the p-type ion implantation layers 4b, forming a plurality of p-type ion implantation layers 4c in a surface layer of the n-type ion implantation layer 3c (FIG. 14(e)). The p-type ion implantation layers 4a to 4c are formed so as to be aligned in a vertical direction with respect to a main surface of the semiconductor substrate formed of the n⁻ semiconductor layers 2a to 2c configuring the n⁻ semiconductor layer 2. The dose of the p-type impurity of the ion implantation 54c into the n-type ion implantation layer 3c is a dose larger than the dose of the n-type impurity of the ion implantation 53c into the n⁻ semiconductor layer 2c when forming the n-type ion implantation layer 3c.

Next, the n⁻ semiconductor layer 2d is epitaxially grown, without doping, on the n⁻ semiconductor layer 2c (FIG. 14(f)). Next, the n-type ion implantation layers 3a to 3c and 15a and the p-type ion implantation layers 4a to 4c formed in the n⁻ semiconductor layers 2a to 2c are activated by heat treatment, thus diffusing the n-type impurity and p-type impurity ion implanted into each of the n⁻ semiconductor layers 2a to 2c.

Because of this, each of the group of n-type ion implantation layers 3a to 3c and the group of p-type ion implantation layers 4a to 4c formed in the first region S1 of each of the n⁻ semiconductor layers 2a to 2c connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2. Also, the n-type ion implantation layer 15a formed in the second region S2 of the n⁻ semiconductor layer 2c diffuses inside the n⁻ semiconductor layers 2c and 2d, whereby the n-buried isolating layer 15 is formed across the n⁻ semiconductor layers 2c and 2d (FIG. 15(g)).

The parallel pn-layer 31 formed in the first region S1 of the n⁻ semiconductor layer 2 is of a super junction structure. It is preferable that the parallel pn-layer 31 is formed so that the impurity concentration thereof is practically equivalent to that of the n-layer 3 and p-layer 4 configuring the parallel pn-layer 31. The reason for this is as follows.

By the impurity concentration of the parallel pn-layer 31 being practically equivalent to that of the n-layer 3 and p-layer 4 configuring the parallel pn-layer 31, a depletion layer spreads throughout the whole of the n-layer 3 and p-layer 4 when voltage is applied. Because of this, by reducing the thickness of the parallel pn-layer 31 in comparison with when the drift layer is formed of only the n-layer, and increasing the impurity concentration of the n-layer 3 in comparison with when the drift layer is formed of only the n-layer, it is possible to improve a trade-off between breakdown voltage and on-state voltage (on-state resistance).

The n-type impurity ion implanted into the second region S2 of the n⁻ semiconductor layers 2c and 2d, by being activated, forms the n-buried isolating layer 15 having an impurity concentration in the region of $2 \times 10^{15}$ cm$^{-3}$ to $7 \times 10^{15}$ cm$^{-3}$. The n-type impurity and p-type impurity ion implanted into each of the n⁻ semiconductor layers 2a to 2c also diffuse inside the n⁻ semiconductor layer 2a, which is the bottommost layer of the n⁻ semiconductor layer 2, and inside the n⁻ semiconductor layer 2d, which is the topmost layer of the n⁻ semiconductor layer 2. That is, the n-layer 3 and p-layer 4 are formed across the n⁻ semiconductor layers 2a to 2d.

Next, the p-well region 5, n-drift region 6, n-source region 7, p-contact region 8, gate oxide film 9, gate electrode 10, inter layer dielectric 11, source electrode (not shown), and the like, of the vertical super junction MOSFET 101 are formed in the first region S1 of the n⁻ semiconductor layer 2d, which is the topmost layer of the n⁻ semiconductor layer 2. That is, the planar gate structure of the vertical super junction MOSFET 101 is formed. Also, the n-diffused isolating layer 16 reaching the n-buried isolating layer 15 is formed in the second region S2 of the n⁻ semiconductor layer 2d.

Then, the p-well region 17, n-source region 18, n-drain region 19, gate oxide film 20, gate electrode 21, source electrode (not shown), drain electrode (not shown), and the like, of the lateral MOSFET 102 are formed in a region of the n⁻ semiconductor layer 2 bounded by the n-buried isolating layer 15 and n-diffused isolating layer 16. That is, the planar gate structure of the lateral MOSFET 102 is formed (FIG. 15(h)). Next, by the drain electrode 13 being formed on the rear surface of the n⁺ semiconductor layer 1, the semiconductor device 100 shown in FIG. 1 is completed.

The n-diffused isolating layer 16 and each region of the lateral MOSFET 102 formed in the second region S2 of the n⁻ semiconductor layer 2d may be formed at the same time as, for example, regions of the same conductivity type of the vertical super junction MOSFET 101 formed in the first region S1 of the n⁻ semiconductor layer 2d (hereafter, in Embodiments 14 to 20 too, in the same way, each region of the vertical super junction MOSFET and lateral MOSFET may be formed at the same time).

By forming the n-buried isolating layer 15 and n-layer 3 at the same time, as heretofore described, it is possible to reduce manufacturing cost.

The n-type impurity ion implantation 53c for forming the n-buried isolating layer 15 and the n-type impurity ion implantation 53c for forming the n-layer 3 may be carried out separately, and the impurity dose for forming the n-buried isolating layer 15 may be larger than the impurity dose for forming the n-layer 3. By carrying out the n-type impurity ion implantation 53c for forming the n-buried isolating layer 15 in this way, it is possible for the impurity concentration of the n-buried isolating layer 15 to be higher than the impurity concentration of the n-layer 3. Because of this, the lateral MOSFET 102 is less likely than the lateral MOSFET of the semiconductor device 100 shown in FIG. 1 to be adversely affected by drain voltage.

The manufacturing method of the semiconductor device 100 shown in FIG. 1 is such that the thickness of the parallel pn-layer 31 can be increased by repeatedly carrying out the steps of forming the n⁻ semiconductor layer 2b, the n-type ion implantation layer 3b, and the p-type ion implantation layer 4b (the steps of FIG. 13(d)).

Also, the manufacturing method of the semiconductor device 100 shown in FIG. 1 is such that it is possible to fabricate the semiconductor device 190 shown in FIG. 10 by forming the trench isolating structure 27 in places in which the n-diffused isolating layer 16 is formed. In this case, for example, the trench isolating structure 27 is formed by, after forming the trench 27a reaching the n-buried isolating layer 15 from the main surface 2f of the n⁻ semiconductor layer 2, which is formed of the n⁻ semiconductor layers 2a to 2b, embedding polysilicon inside the trench 27a across the insulating film.

Although a description has been given of the manufacturing method of the semiconductor device 100 shown in FIG. 1 with the n⁻ semiconductor layer 2 having a configuration wherein the four n⁻ semiconductor layers 2a to 2d are stacked as an example, the number of stacked layers configuring the n⁻ semiconductor layer 2 is not limited to this.

As heretofore described, according to Embodiment 13, the n-type ion implantation layer 15a that forms the n-buried isolating layer 15 and the n-type ion implantation layer 3c that forms the n-layer 3 are formed simultaneously by the ion implantation 53c into the n⁻ semiconductor layer 2c. Because of this, it is possible to form the n-buried isolating layer 15 configuring the isolating structure that electrically isolates the vertical super junction MOSFET 101 and lateral MOSFET 102 in the step for forming the parallel pn-layer 31 of the vertical super junction MOSFET 101. Consequently, it is not necessary to carry out a step solely for forming the n-buried isolating layer 15. Because of this, it is possible to reduce the manufacturing cost.

Embodiment 14

Figure 16:
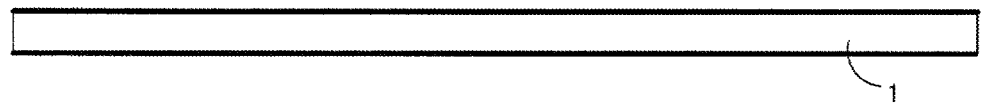
FIGS. 16(a) to 16(d) are sectional views showing, in step order, a semiconductor device manufacturing method according to Embodiment 14 of the invention.
Figure 16:
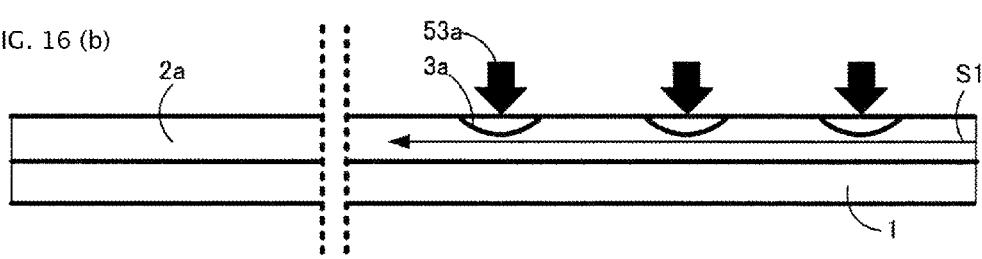
Figure 16:
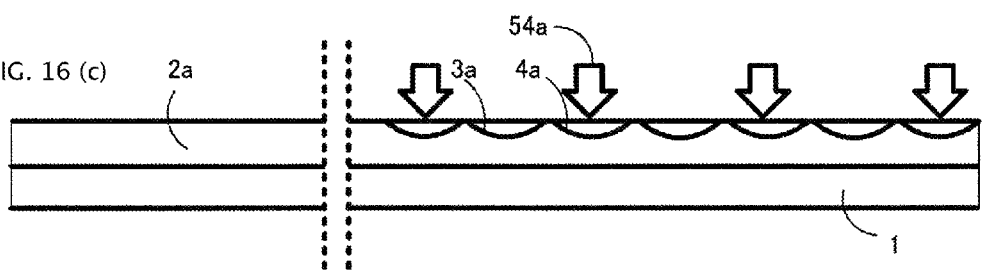
Figure 16:
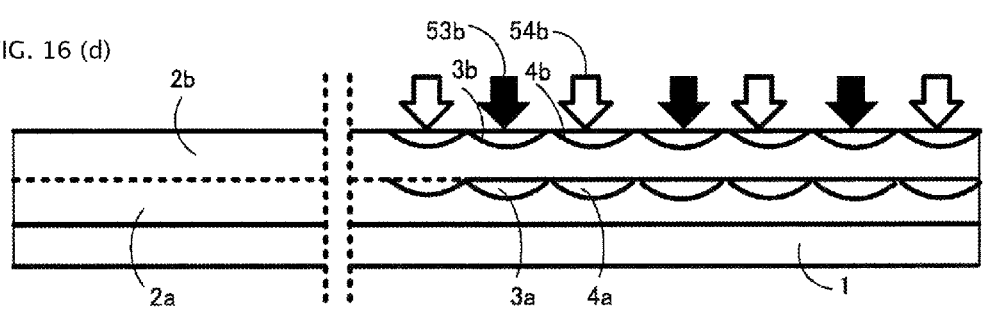
Figure 17:
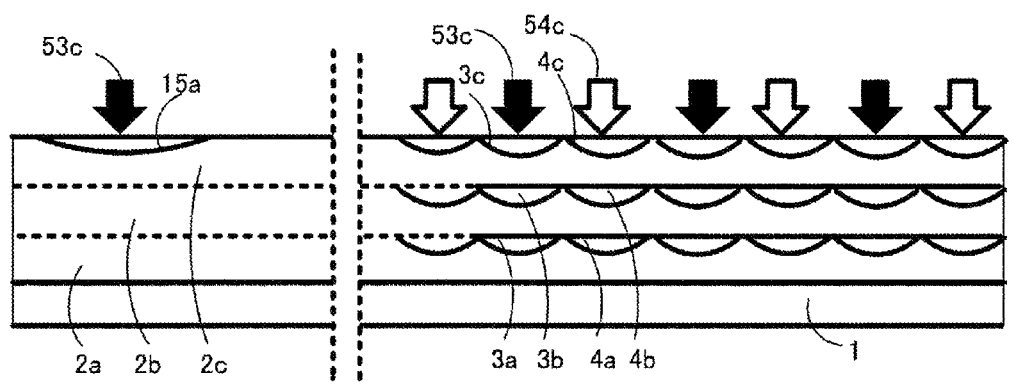
FIGS. 17(e) and 17(f) are sectional views showing, in step order, the semiconductor device manufacturing method according to Embodiment 14 of the invention.
Figure 17:
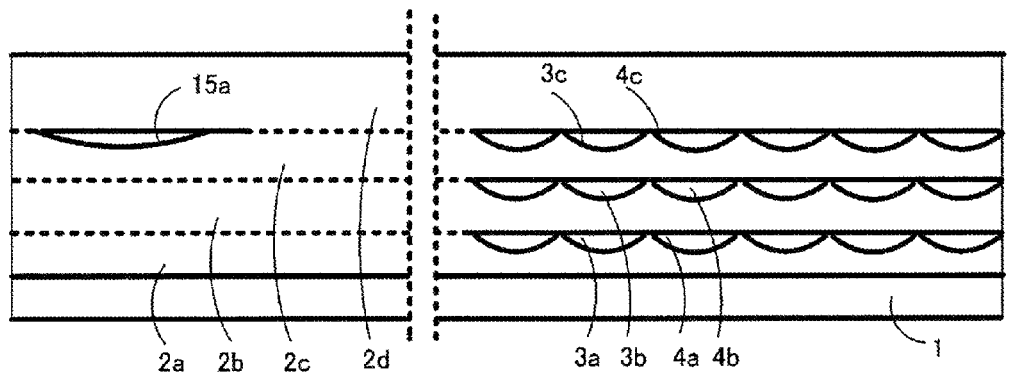
Figure 18:
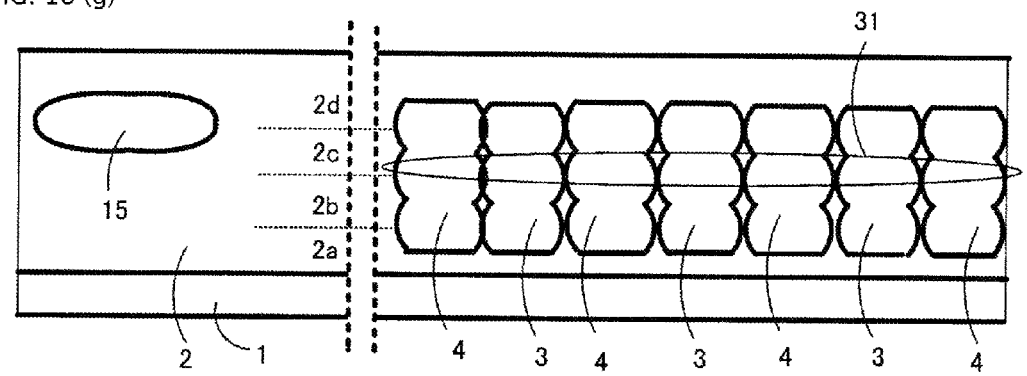
FIGS. 18(g) and 18(h) are sectional views showing, in step order, the semiconductor device manufacturing method according to Embodiment 14 of the invention.
Figure 18:
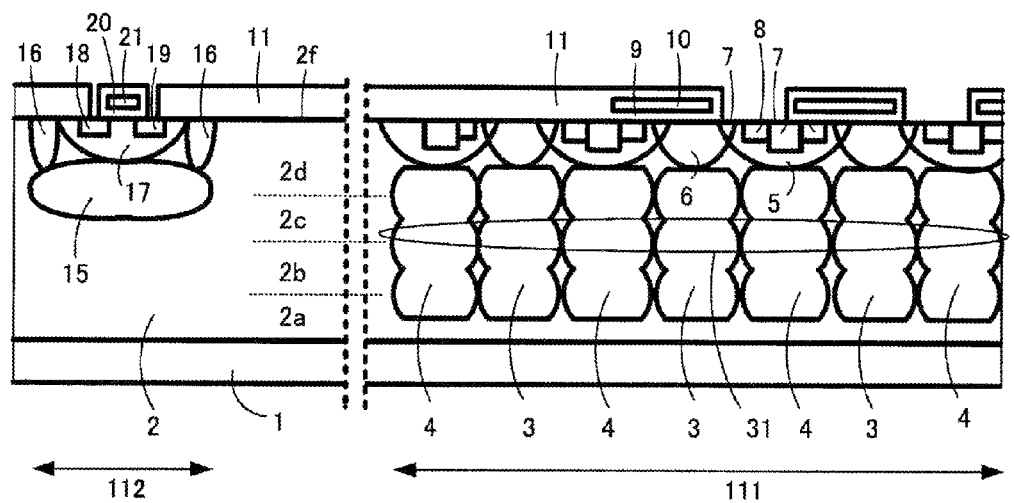

FIG. 16 to FIG. 18 are sectional views showing, in step order, a semiconductor device manufacturing method according to Embodiment 14 of the invention. In Embodiment 14, a description will be given of a method of manufacturing the semiconductor device 110 according to Embodiment 2 shown in FIG. 2. Firstly, a support substrate, which is to form the n⁺ semiconductor layer 1, is prepared. The n⁺ semiconductor layer 1 forms the n-drain layer of the vertical super junction MOSFET 111 (FIG. 16(a)).

Next, the n⁻ semiconductor layer 2a is epitaxially grown to a thickness of in the region of, for example, 7 μm, without doping, on the n⁺ semiconductor layer 1. Next, the n-type impurity (for example, phosphorus or the like) ion implantation 53a is selectively carried out in the first region S1, in which the vertical super junction MOSFET 111 is formed, of the n⁻ semiconductor layer 2a, forming a plurality of n-type ion implantation layers 3a in a surface layer of the first region S1 of the n⁻ semiconductor layer 2a (FIG. 16(b)).

Next, the p-type impurity (for example, boron or the like) ion implantation 54a is selectively carried out adjacent to the n-type ion implantation layers 3a formed in the first region S1 of the n⁻ semiconductor layer 2a, forming a plurality of p-type ion implantation layers 4a in a surface layer of the first region S1 of the n⁻ semiconductor layer 2a (FIG. 16(c)). That is, the p-type ion implantation layers 4a are formed among the n-type ion implantation layers 3a formed in the first region S1 of the n⁻ semiconductor layer 2a, in such a way as to be in contact with the n-type ion implantation layers 3a.

Next, the n⁻ semiconductor layer 2b is epitaxially grown to a thickness of in the region of, for example, 7 μm, without doping, on the n⁻ semiconductor layer 2a. Next, the n-type impurity ion implantation 53b is selectively carried out into regions of the n⁻ semiconductor layer 2b directly above the n-type ion implantation layers 3a, forming a plurality of n-type ion implantation layers 3b in a surface layer of the n⁻ semiconductor layer 2b.

Then, the p-type impurity ion implantation 54b is selectively carried out into regions of the n⁻ ion implantation layer 2b directly above the p-type ion implantation layers 4a, forming a plurality of p-type ion implantation layers 4b in a surface layer of the n⁻ ion implantation layer 2b (FIG. 16(d)). Although a depiction is omitted from FIG. 16(d), the steps of forming the n⁻ semiconductor layer 2b, the n-type ion implantation layer 3b, and the p-type ion implantation layer 4b (the steps of FIG. 16 (d)) are normally repeated in the region of six or seven times, increasing the thickness of the parallel pn-layer 31.

Next, the n⁻ semiconductor layer 2c is epitaxially grown, without doping, on the n⁻ semiconductor layer 2b. Then, the n-type impurity ion implantation 53c is selectively carried into regions of the n⁻ semiconductor layer 2c directly above the n-type ion implantation layers 3b, and throughout the whole of the second region S2 of the n⁻ semiconductor layer 2c. By so doing, a plurality of n-type ion implantation layers 3c are formed in a surface layer of the first region S1 of the n⁻ semiconductor layer 2c, and the n-type ion implantation layer 15a is formed in a surface layer of the second region S2 of the n⁻ semiconductor layer 2c.

Next, the p-type impurity ion implantation 54c is selectively carried out into regions of the n⁻ semiconductor layer 2c directly above the p-type ion implantation layers 4b, forming a plurality of p-type ion implantation layers 4c in a surface layer of the first region S1 of the n⁻ semiconductor layer 2c (FIG. 17(e)). The n-type ion implantation layers 3a to 3c are formed so as to be aligned in a vertical direction with respect to a main surface of the semiconductor substrate formed of the n⁻ semiconductor layers 2a to 2c configuring the n⁻ semiconductor layer 2. The p-type ion implantation layers 4a to 4c are formed so as to be aligned in a vertical direction with respect to a main surface of the semiconductor substrate formed of the n⁻ semiconductor layers 2a to 2c configuring the n⁻ semiconductor layer 2.

Next, the n⁻ semiconductor layer 2d is epitaxially grown, without doping, on the n⁻ semiconductor layer 2c (FIG. 17(f)). Next, the n-type ion implantation layers 3a to 3c and 15a and the p-type ion implantation layers 4a to 4c formed in the n⁻ semiconductor layers 2a to 2c are activated by heat treatment, thus diffusing the n-type impurity and p-type impurity ion implanted into each of the n⁻ semiconductor layers 2a to 2c.

Because of this, each of the group of n-type ion implantation layers 3a to 3c and the group of p-type ion implantation layers 4a to 4c formed in the first region S1 of each of the n⁻ semiconductor layers 2a to 2c connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2. Also, the n-type ion implantation layer 15a formed in the second region S2 of the n⁻ semiconductor layer 2c diffuses inside the n⁻ semiconductor layers 2c and 2d, whereby the n-buried isolating layer 15 is formed across the n⁻ semiconductor layers 2c and 2d.

The parallel pn-layer 31 formed in the first region S1 of the n⁻ semiconductor layer 2 is of a super junction structure. It is preferable that the parallel pn-layer 31 is formed so that the impurity concentration thereof is practically equivalent to that of the n-layer 3 and p-layer 4 configuring the parallel pn-layer 31. The reason for this is as follows. By the impurity concentration of the parallel pn-layer 31 being practically equivalent to that of the n-layer 3 and p-layer 4 configuring the parallel pn-layer 31, a depletion layer spreads throughout the whole of the n-layer 3 and p-layer 4 when voltage is applied. Because of this, by reducing the thickness of the parallel pn-layer 31 in comparison with when the drift layer is formed of only the n-layer, and increasing the impurity concentration of the n-layer 3 in comparison with when the drift layer is formed of only the n-layer, it is possible to improve the trade-off between breakdown voltage and on-state voltage (on-state resistance).

Also, the n-type impurity ion implanted into the second region S2 of the n⁻ semiconductor layers 2c and 2d, by being activated, forms the n-buried isolating layer 15. The n-type impurity and p-type impurity ion implanted into each of the n⁻ semiconductor layers 2a to 2c also diffuse inside the n⁻ semiconductor layer 2a, which is the bottommost layer of the n⁻ semiconductor layer 2, and inside the n⁻ semiconductor layer 2d, which is the topmost layer of the n⁻ semiconductor layer 2. That is, the n-layer 3 and p-layer 4 are formed across the n⁻ semiconductor layers 2a to 2d (FIG. 18(g)).

Next, the p-well region 5, n-drift region 6, n-source region 7, p-contact region 8, gate oxide film 9, gate electrode 10, source electrode (not shown), and the like, of the vertical super junction MOSFET 111 are formed in the first region S1 of the n⁻ semiconductor layer 2d, which is the topmost layer. That is, the planar gate structure of the vertical super junction MOSFET 111 is formed. Also, the n-diffused isolating layer 16 reaching the n-buried isolating layer 15 is formed in the second region S2 of the n⁻ semiconductor layer 2d.

Then, the p-well region 17, n-source region 18, n-drain region 19, gate oxide film 20, gate electrode 21, source electrode (not shown), drain electrode (not shown), and the like, of the lateral MOSFET 112 are formed in a region of the n⁻ semiconductor layer 2 bounded by the n-buried isolating layer 15 and n-diffused isolating layer 16. That is, the planar gate structure of the lateral MOSFET 112 is formed (FIG. 18(h)). Next, by the drain electrode 13 being formed on the rear surface of the n⁺ semiconductor layer 1, the semiconductor device 110 shown in FIG. 2 is completed.

By forming the n-buried isolating layer 15 and n-layer 3 at the same time, as heretofore described, it is possible to reduce manufacturing cost.

Also, as the n-layer 3 and p-layer 4 formed in the first region S1 are each selectively formed, it is possible to set the impurity concentration as desired, improving the freedom of design.

The n-type impurity ion implantation 53c for forming the n-buried isolating layer 15 and the ion implantation for forming the n-layer 3 may be carried out separately, and the impurity dose for forming the n-buried isolating layer 15 may be larger than the impurity dose for forming the n-layer 3. By carrying out the ion implantation 53c for forming the n-buried isolating layer 15 in this way, it is possible for the impurity concentration of the n-buried isolating layer 15 to be higher than the impurity concentration of the n-layer 3. Because of this, the lateral MOSFET 112 is less likely than the lateral MOSFET of the semiconductor device 100 shown in FIG. 1 to be adversely affected by drain voltage.

Also, the manufacturing method of the semiconductor device 110 shown in FIG. 2 is such that it is possible to fabricate the semiconductor device 190 shown in FIG. 10 by forming the trench isolating structure 27 in places in which the n-diffused isolating layer 16 is formed. In this case, for example, the trench isolating structure 27 is formed by, after forming the trench 27a reaching the n-buried isolating layer 15 from the main surface 2f of the n⁻ semiconductor layer 2, which is formed of the n⁻ semiconductor layers 2a to 2b, embedding polysilicon inside the trench 27a across the insulating film.

Although a description has been given of the manufacturing method of the semiconductor device 110 shown in FIG. 2 with the n⁻ semiconductor layer 2 having a configuration wherein the four n⁻ semiconductor layers 2a to 2d are stacked as an example, the number of stacked layers configuring the n⁻ semiconductor layer 2 is not limited to this.

As heretofore described, according to Embodiment 14, it is possible to obtain the same advantages as with the semiconductor device manufacturing method according to Embodiment 13. That is, the number of stacked layers configuring the n⁻ semiconductor layer 2 may be less than four, and may be more than four.

Embodiment 15

Figure 19:
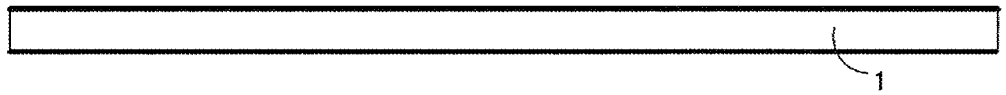
FIGS. 19(a) to 19(d) are sectional views showing, in step order, a semiconductor device manufacturing method according to Embodiment 15 of the invention.
Figure 19:
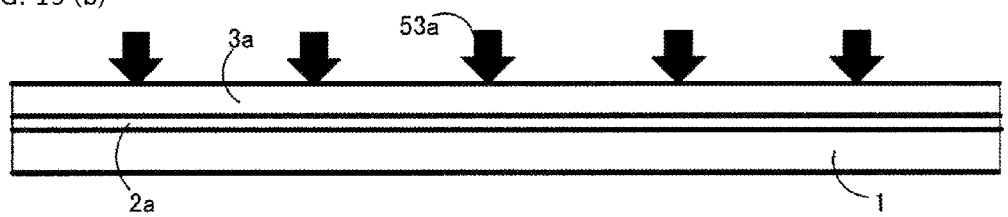
Figure 19:
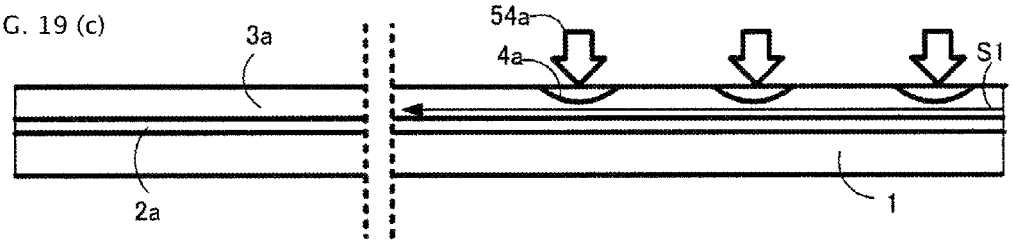
Figure 19:
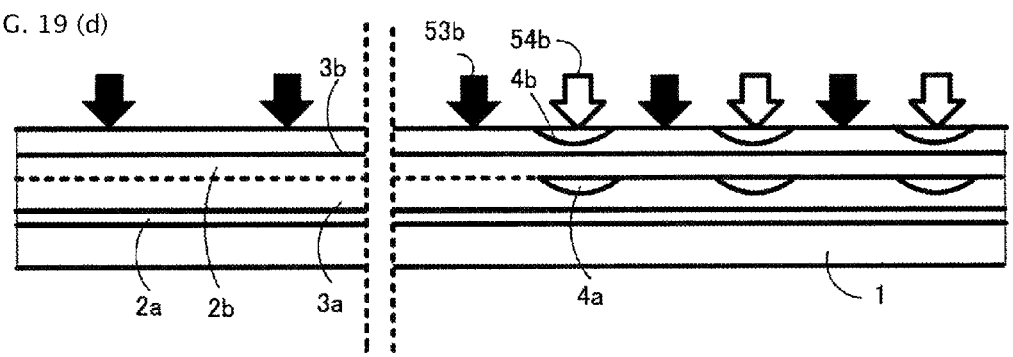
Figure 20:
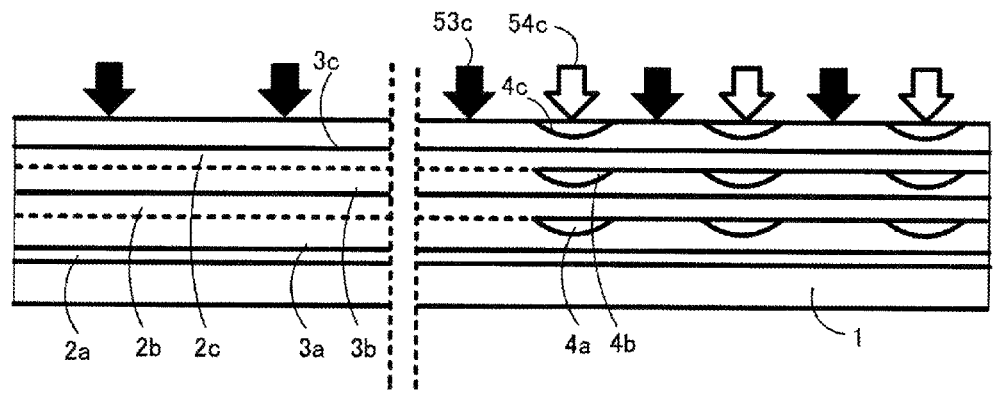
FIGS. 20(e) to 20(f) are sectional views showing, in step order, the semiconductor device manufacturing method according to Embodiment 15 of the invention.
Figure 20:
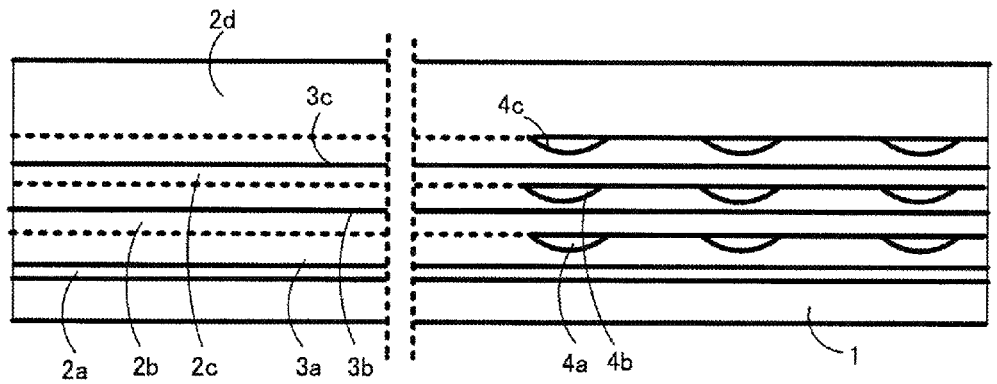
Figure 21:
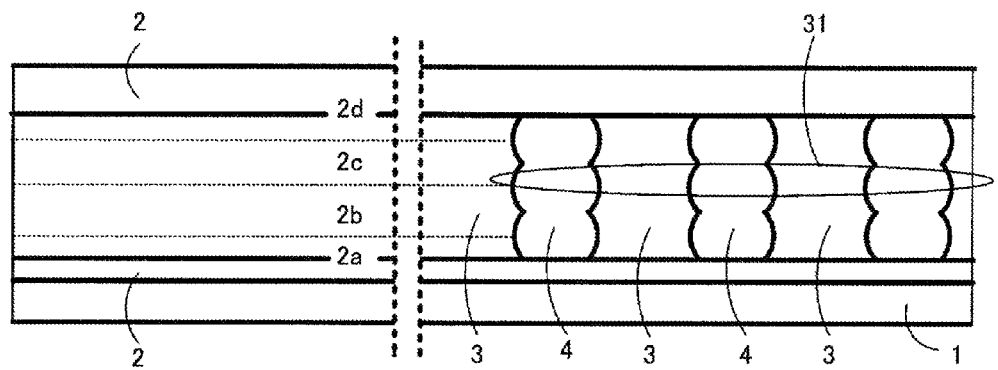
FIGS. 21(g) and 21(h) are sectional views showing, in step order, the semiconductor device manufacturing method according to Embodiment 15 of the invention.
Figure 21:
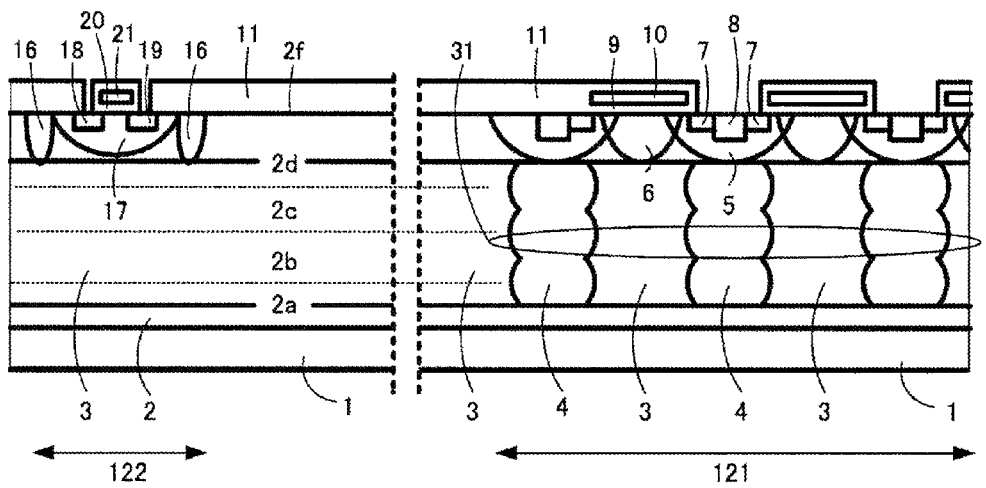

FIG. 19 to FIG. 21 are sectional views showing, in step order, a semiconductor device manufacturing method according to Embodiment 15 of the invention. In Embodiment 15, a description will be given of a method of manufacturing the semiconductor device 120 according to Embodiment 3 shown in FIG. 3. Firstly, a support substrate, which is to form the n⁺ semiconductor layer 1, is prepared. The n⁺ semiconductor layer 1 forms the n-drain layer of the vertical super junction MOSFET 121 (FIG. 19(a)).

Next, the n⁻ semiconductor layer 2a is epitaxially grown to a thickness of in the region of, for example, 7 μm, without doping, on the n⁺ semiconductor layer 1. Next, the n-type impurity (for example, phosphorus or the like) ion implantation 53a is carried out throughout the whole of the n⁻ semiconductor layer 2a, including the first region S1 in which the vertical super junction MOSFET 121 is formed and the second region S2 in which the n-buried isolating layer 15 is formed. By so doing, the n-type ion implantation layer 3a is formed in a surface layer of the n⁻ semiconductor layer 2a over the whole of the n⁻ semiconductor layer 2a (FIG. 19(b)).

Next, the p-type impurity (for example, boron or the like) ion implantation 54a is selectively carried out into the n-type ion implantation layer 3a on the first region S1 side of the n⁻ semiconductor layer 2a, forming a plurality of p-type ion implantation layers 4a in a surface layer of the n-type ion implantation layer 3a on the first region S1 side of the n⁻ semiconductor layer 2a (FIG. 19(c)). The dose of the p-type impurity of the ion implantation 54a into the n-type ion implantation layer 3a is a dose larger than the dose of the n-type impurity of the ion implantation 53a into the n⁻ semiconductor layer 2a when forming the n-type ion implantation layer 3a.

Next, the n⁻ semiconductor layer 2b is epitaxially grown to a thickness of in the region of, for example, 7 μm, without doping, on the n⁻ semiconductor layer 2a. Next, the n-type impurity ion implantation 53b is carried out throughout the whole of the n⁻ semiconductor layer 2b, including the first region S1 and the second region S2. By so doing, the n-type ion implantation layer 3b is formed in a surface layer of the n⁻ semiconductor layer 2b over the whole of the n⁻ semiconductor layer 2b. Then, the p-type impurity ion implantation 54b is selectively carried out into regions of the n-type ion implantation layer 3b directly above the p-type ion implantation layers 4a, forming a plurality of p-type ion implantation layers 4b in a surface layer of the n-type ion implantation layer 3b (FIG. 19(d)).

The dose of the p-type impurity of the ion implantation 54b into the n-type ion implantation layer 3b is a dose larger than the dose of the n-type impurity of the ion implantation 53b into the n⁻ semiconductor layer 2b when forming the n-type ion implantation layer 3b. Although a depiction is omitted from FIG. 19(d), the steps of forming the n⁻ semiconductor layer 2b, the n-type ion implantation layer 3b, and the p-type ion implantation layer 4b (the steps of FIG. 19(d)) are normally repeated in the region of six or seven times, increasing the thickness of the parallel pn-layer 31 after completion.

Next, the n⁻ semiconductor layer 2c is epitaxially grown to a thickness of in the region of, for example, 7 μm, without doping, on the n⁻ semiconductor layer 2b. Next, the n-type impurity ion implantation 53c is carried out throughout the whole of the n⁻ semiconductor layer 2c, including the first region S1 and the second region S2. By so doing, the n-type ion implantation layer 3c is formed in a surface layer of the n⁻ semiconductor layer 2c over the whole of the n⁻ semiconductor layer 2c. Then, the p-type impurity ion implantation 54c is selectively carried out into regions of the n-type ion implantation layer 3c directly above the p-type ion implantation layers 4b, forming a plurality of p-type ion implantation layers 4c in a surface layer of the n-type ion implantation layer 3c (FIG. 20(e)).

The p-type ion implantation layers 4a to 4c are formed so as to be aligned in a vertical direction with respect to a main surface of the semiconductor substrate formed of the n⁻ semiconductor layers 2a to 2c configuring the n⁻ semiconductor layer 2. The dose of the p-type impurity of the ion implantation 54c into the n-type ion implantation layer 3c is a dose larger than the dose of the n-type impurity of the ion implantation 53c into the n⁻ semiconductor layer 2c when forming the n-type ion implantation layer 3c.

Next, the n⁻ semiconductor layer 2d is epitaxially grown, without doping, on the n⁻ semiconductor layer 2c (FIG. 20(f)). Next, the n-type ion implantation layers 3a to 3c and the p-type ion implantation layers 4a to 4c formed in the n⁻ semiconductor layers 2a to 2c are activated by heat treatment, thus diffusing the n-type impurity and p-type impurity ion implanted into each of the n⁻ semiconductor layers 2a to 2c.

Because of this, each of the group of n-type ion implantation layers 3a to 3c and the group of p-type ion implantation layers 4a to 4c formed in the first region S1 of each of the n⁻ semiconductor layers 2a to 2c connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2. Also, in the second region S2 of the n⁻ semiconductor layer 2 too, the group of n-type ion implantation layers 3a to 3c connects in a vertical direction with respect to the main surface of the n⁻ semiconductor layer 2, forming the n-layer 3.

The parallel pn-layer 31 formed in the first region S1 of the n⁻ semiconductor layer 2 is of a super junction structure. It is preferable that the parallel pn-layer 31 is formed so that the impurity concentration thereof is practically equivalent to that of the n-layer 3 and p-layer 4 configuring the parallel pn-layer 31. The reason for this is as follows. By the impurity concentration of the parallel pn-layer 31 being practically equivalent to that of the n-layer 3 and p-layer 4 configuring the parallel pn-layer 31, a depletion layer spreads throughout the whole of the n-layer 3 and p-layer 4 when voltage is applied. Because of this, by reducing the thickness of the parallel pn-layer 31 in comparison with when the drift layer is formed of only the n-layer, and increasing the impurity concentration of the n-layer 3 in comparison with when the drift layer is formed of only the n-layer, it is possible to improve the trade-off between breakdown voltage and on-state voltage (on-state resistance).

Meanwhile, the n-layer 3 formed in the second region S2 of the n⁻ semiconductor layers 2a to 2c forms a thick n-buried isolating layer having the same thickness as that of the parallel pn-layer 31. The n-type impurity and p-type impurity ion implanted into each of the n⁻ semiconductor layers 2a to 2c also diffuse inside the n⁻ semiconductor layer 2a, which is the bottommost layer of the n⁻ semiconductor layer 2, and inside the n⁻ semiconductor layer 2d, which is the topmost layer of the n⁻ semiconductor layer 2. That is, the n-layer 3 and p-layer 4 are formed across the n⁻ semiconductor layers 2a to 2d (FIG. 21(g)).

Next, the p-well region 5, n-drift region 6, n-source region 7, p-contact region 8, gate oxide film 9, gate electrode 10, source electrode (not shown), and the like, of the vertical super junction MOSFET 121 are formed in the first region S1 of the n⁻ semiconductor layer 2d, which is the topmost layer. That is, the planar gate structure of the vertical super junction MOSFET 121 is formed. Also, the n-diffused isolating layer 16 reaching the n-layer 3 is formed in the second region S2 of the n⁻ semiconductor layer 2d.

Then, the p-well region 17, n-source region 18, n-drain region 19, gate oxide film 20, gate electrode 21, source electrode (not shown), drain electrode (not shown), and the like, of the lateral MOSFET 122 are formed in a region of the n⁻ semiconductor layer 2 bounded by the n-layer 3, which forms an n-buried isolating layer, and the n-diffused isolating layer 16. That is, the planar gate structure of the lateral MOSFET 122 is formed (FIG. 21(h)). Next, by the drain electrode 13 being formed on the rear surface of the n⁺ semiconductor layer 1, the semiconductor device 120 shown in FIG. 3 is completed.

As heretofore described, by forming an n-buried isolating layer with the n-layer 3, and integrally forming the n-buried isolating layer and the n-layer 3 configuring the parallel pn-layer 31, it is possible to form a thick n-buried isolating layer having the same thickness as that of the parallel pn-layer 31. By so doing, it is possible to attempt to suppress malfunction of the parasitic transistor, and reduce leakage current in a pn-junction portion of the parasitic transistor.

Also, it is preferable that the n⁻ semiconductor layer 2d, which is the topmost layer of the n⁻ semiconductor layer 2 and in which the p-well region and n-source region are formed, is formed more thickly than the n⁻ semiconductor layer 2a, which is the bottommost layer of the n⁻ semiconductor layer 2.

As heretofore described, according to Embodiment 15, it is possible to obtain the same advantages as with the semiconductor device manufacturing method according to Embodiment 13.

Embodiment 16

Figure 22:
FIGS. 22(a) to 22(d) are sectional views showing, in step order, a semiconductor device manufacturing method according to Embodiment 16 of the invention.
Figure 22:
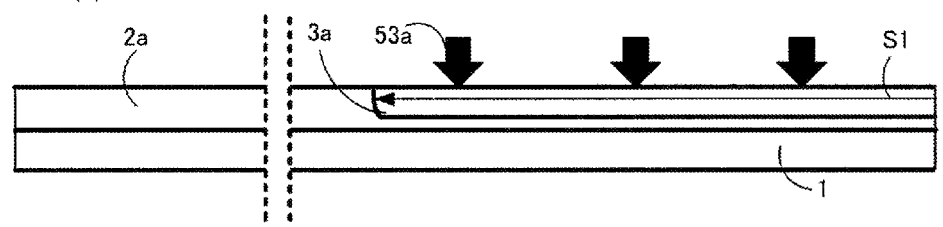
Figure 22:
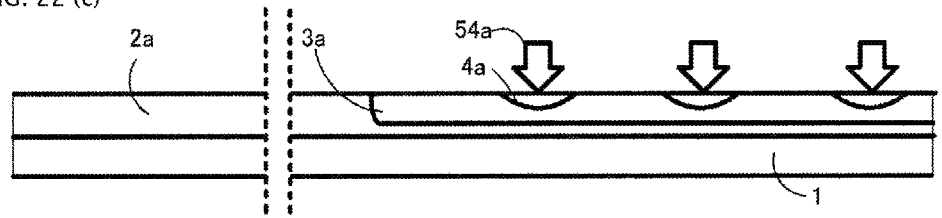
Figure 22:
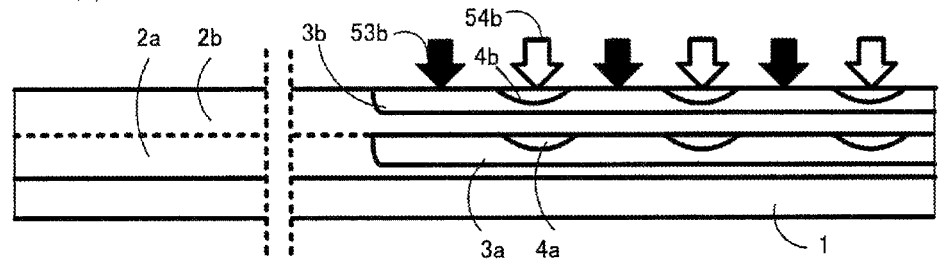
Figure 23:
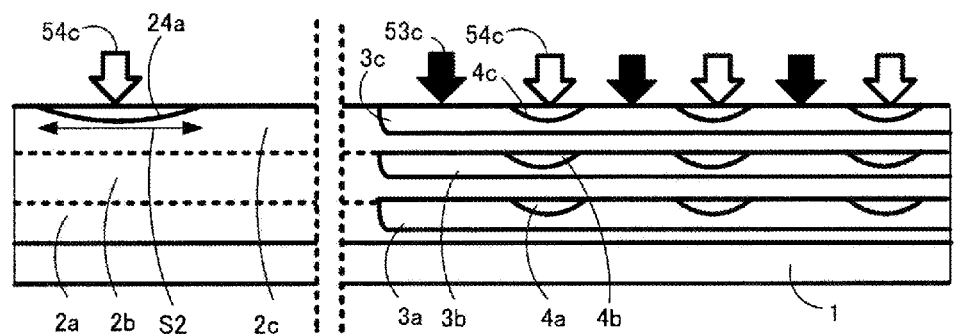
FIGS. 23(e) and 23(f) are sectional views showing, in step order, the semiconductor device manufacturing method according to Embodiment 16 of the invention.
Figure 23:
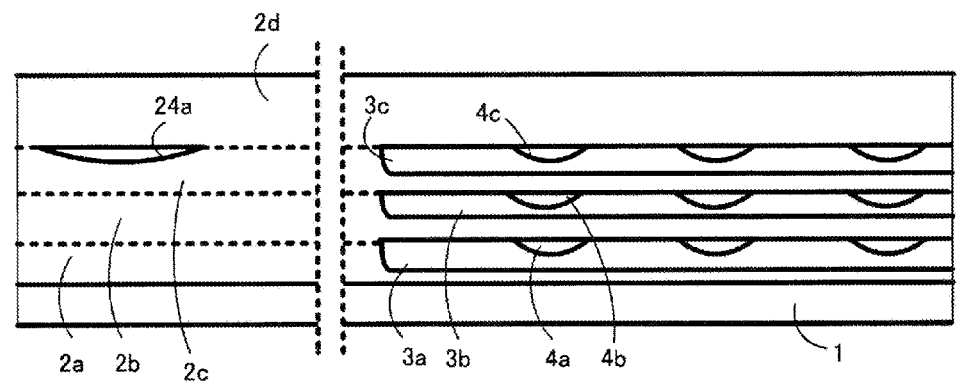
Figure 24:
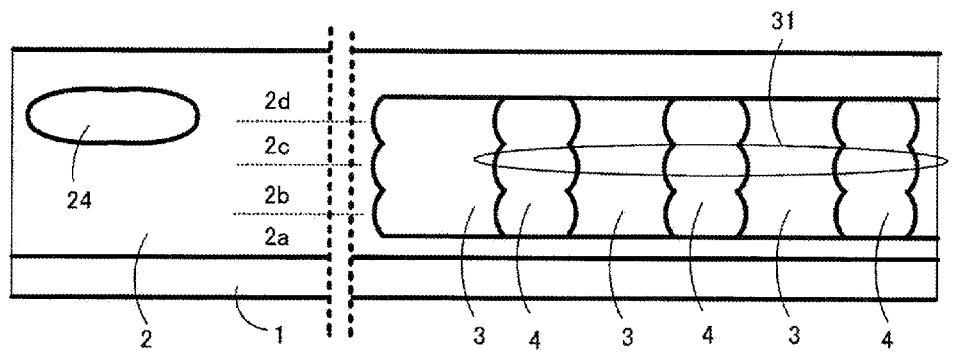
FIGS. 24(g) and 24(h) are sectional views showing, in step order, the semiconductor device manufacturing method according to Embodiment 16 of the invention.
Figure 24:
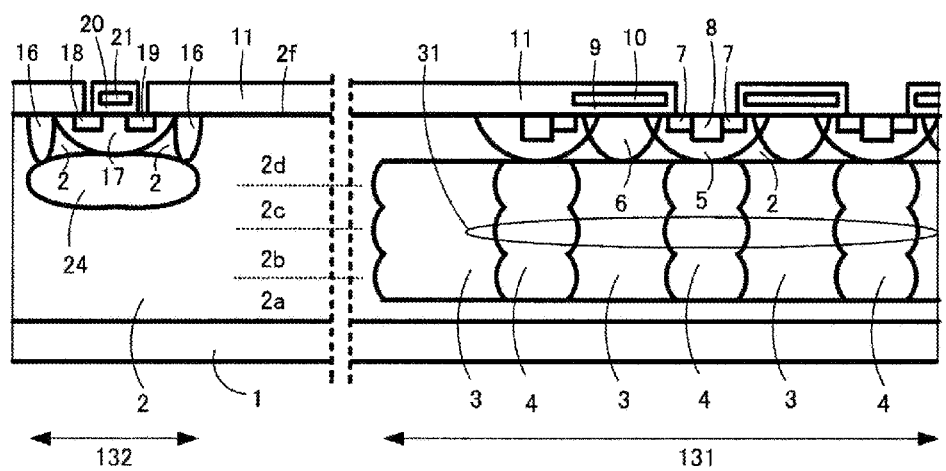

FIG. 22 to FIG. 24 are sectional views showing, in step order, a semiconductor device manufacturing method according to Embodiment 16 of the invention. In Embodiment 16, a description will be given of a method of manufacturing the semiconductor device 130 according to Embodiment 4 shown in FIG. 4. Firstly, the n⁺ semiconductor layer 1 is prepared. The n⁺ semiconductor layer 1 forms the n-drain layer of the vertical super junction MOSFET 131 (FIG. 22(a)).

Next, the n⁻ semiconductor layer 2a is epitaxially grown to a thickness of in the region of, for example, 7 μm, without doping, on the n⁺ semiconductor layer 1. Next, the n-type impurity (for example, phosphorus or the like) ion implantation 53a is carried out throughout the whole of the first region S1, in which the vertical super junction MOSFET 131 is formed, of the n⁻ semiconductor layer 2a, forming the n-type ion implantation layer 3a in a surface layer of the first region S1 of the n⁻ semiconductor layer 2a (FIG. 22(b)).

Next, the p-type impurity (for example, boron or the like) ion implantation 54a is selectively carried out into the n-type ion implantation layer 3a, forming a plurality of p-type ion implantation layers 4a in a surface layer of the n-type ion implantation layer 3a (FIG. 22(c)). The dose of the p-type impurity of the ion implantation 54a into the n-type ion implantation layer 3a is a dose larger than the dose of the n-type impurity of the ion implantation 53a into the n⁻ semiconductor layer 2a when forming the n-type ion implantation layer 3a.

Next, the n⁻ semiconductor layer 2b is epitaxially grown to a thickness of in the region of, for example, 7 μm, without doping, on the n⁻ semiconductor layer 2a. Next, the n-type impurity ion implantation 53b is carried out throughout the whole of the first region S1 of the n⁻ semiconductor layer 2b, forming the n-type ion implantation layer 3b in a surface layer of the first region S1 of the n⁻ semiconductor layer 2b. Then, the p-type impurity ion implantation 54b is selectively carried out into regions of the n-type ion implantation layer 3b directly above the p-type ion implantation layers 4a, forming a plurality of p-type ion implantation layers 4b in a surface layer of the n-type ion implantation layer 3b (FIG. 22(d)).

The dose of the p-type impurity of the ion implantation 54b into the n-type ion implantation layer 3b is a dose larger than the dose of the n-type impurity of the ion implantation 53b into the n⁻ semiconductor layer 2b when forming the n-type ion implantation layer 3b. Although a depiction is omitted from FIG. 22(d), the steps of forming the n⁻ semiconductor layer 2b, the n-type ion implantation layer 3b, and the p-type ion implantation layer 4b (the steps of FIG. 22 (d)) are normally repeated in the region of six or seven times, increasing the thickness of the parallel pn-layer 31 after completion.

Next, the n⁻ semiconductor layer 2c is epitaxially grown, without doping, on the n⁻ semiconductor layer 2b. Next, the n-type impurity ion implantation 53c is carried out throughout the whole of the first region S1 of the n⁻ semiconductor layer 2c. By so doing, the n-type ion implantation layer 3c is formed in a surface layer of the n⁻ semiconductor layer 2c across the whole of the first region S1 of the n⁻ semiconductor layer 2c.

Then, the p-type impurity ion implantation 54c is carried out into regions of the n-type ion implantation layer 3c directly above the p-type ion implantation layers 4b, and throughout the whole of the second region S2 of the n⁻ semiconductor layer 2c. Because of this, a plurality of p-type ion implantation layers 4c are formed in a surface layer of the n-type ion implantation layer 3c, and a p-type ion implantation layer 24a is formed in a surface layer of the second region S2 of the n⁻ semiconductor layer 2c (FIG. 23(e)). The dose of the p-type impurity of the ion implantation 54c into the n-type ion implantation layer 3c and n⁻ semiconductor layer 2c is a dose larger than the dose of the n-type impurity of the ion implantation 53c into the n⁻ semiconductor layer 2c when forming the n-type ion implantation layer 3c.

Next, the n⁻ semiconductor layer 2d is epitaxially grown, without doping, on the n⁻ semiconductor layer 2c (FIG. 23(f)). Next, the n-type ion implantation layers 3a to 3c and the p-type ion implantation layers 4a to 4c and 24a formed in the n⁻ semiconductor layers 2a to 2c are activated by heat treatment, thus diffusing the n-type impurity and p-type impurity ion implanted into each of the n⁻ semiconductor layers 2a to 2c.

Because of this, each of the group of n-type ion implantation layers 3a to 3c and the group of p-type ion implantation layers 4a to 4c formed in the first region S1 of each of the n⁻ semiconductor layers 2a to 2c connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2. Also, the p-type ion implantation layer 24a formed in the second region S2 of the n⁻ semiconductor layer 2c diffuses inside the n⁻ semiconductor layers 2c and 2d, whereby the p-buried isolating layer 24 is formed across the n⁻ semiconductor layers 2c and 2d.

The parallel pn-layer 31 formed in the first region S1 of the n⁻ semiconductor layer 2 is of a super junction structure. It is preferable that the parallel pn-layer 31 is formed so that the impurity concentration thereof is practically equivalent to that of the n-layer 3 and p-layer 4 configuring the parallel pn-layer 31. The reason for this is as follows. By the impurity concentration of the parallel pn-layer 31 being practically equivalent to that of the n-layer 3 and p-layer 4 configuring the parallel pn-layer 31, a depletion layer spreads throughout the whole of the n-layer 3 and p-layer 4 when voltage is applied. Because of this, by reducing the thickness of the parallel pn-layer 31 in comparison with when the drift layer is formed of only the n-layer, and increasing the impurity concentration of the n-layer 3 in comparison with when the drift layer is formed of only the n-layer, it is possible to improve the trade-off between breakdown voltage and on-state voltage (on-state resistance).

The n-type impurity and p-type impurity ion implanted into each of the n⁻ semiconductor layers 2a to 2c also diffuse inside the n⁻ semiconductor layer 2a, which is the bottommost layer, and inside the n⁻ semiconductor layer 2d, which is the topmost layer. That is, the n-layer 3 and p-layer 4 are formed across the n⁻ semiconductor layers 2a to 2d (FIG. 24(g)).

Next, the p-well region 5, n-drift region 6, n-source region 7, p-contact region 8, gate oxide film 9, gate electrode 10, inter layer dielectric 11, source electrode (not shown), and the like, of the vertical super junction MOSFET 131 are formed in the first region S1 of the n⁻ semiconductor layer 2d, which is the topmost layer. That is, the planar gate structure of the vertical super junction MOSFET 131 is formed. Also, the p-diffused isolating layer 25 reaching the p-buried isolating layer 24 is formed in the second region S2 of the n⁻ semiconductor layer 2d.

Then, the p-well region 17, n-source region 18, n-drain region 19, gate oxide film 20, gate electrode 21, source electrode (not shown), drain electrode (not shown), and the like, of the lateral MOSFET 132 are formed in the n⁻ semiconductor layer 2 bounded by the p-buried isolating layer 24 and n-diffused isolating layer 16 of the n⁻ semiconductor layer 2. That is, the planar gate structure of the lateral MOSFET 132 is formed (FIG. 24(h)). Next, by the drain electrode 13 being formed on the rear surface of the n⁺ semiconductor layer 1, the semiconductor device 130 shown in FIG. 4 is completed.

As heretofore described, the p-type ion implantation layer 24a that forms the p-buried isolating layer 24 and the p-type ion implantation layer 4c that forms the p-layer 4 are formed simultaneously by the ion implantation 54c when forming the p-type ion implantation layer 4c that forms the p-layer 4. Because of this, it is possible to form the p-buried isolating layer 24 and p-layer 4 simultaneously, and thus possible to reduce manufacturing cost in the same way as with the semiconductor device manufacturing method according to Embodiment 13.

Also, the p-type impurity ion implantation 54c for forming the p-buried isolating layer 24 and the ion implantation 54c for forming the p-layer 4 may be carried out separately, and the impurity dose for forming the p-buried isolating layer 24 may be larger than the impurity dose for forming the p-layer 4. By carrying out the ion implantation 54c for forming the p-buried isolating layer 24 in this way, it is possible for the impurity concentration of the p-buried isolating layer 24 to be higher than the impurity concentration of the p-layer 4. Because of this, it is possible to increase the advantages of suppressing malfunction of the parasitic transistor and reducing leakage current in the pn-junction portion of the parasitic transistor.

As heretofore described, according to Embodiment 16, it is possible to obtain the same advantages as with the semiconductor device manufacturing method according to Embodiment 13.

Embodiment 17

Figure 25:
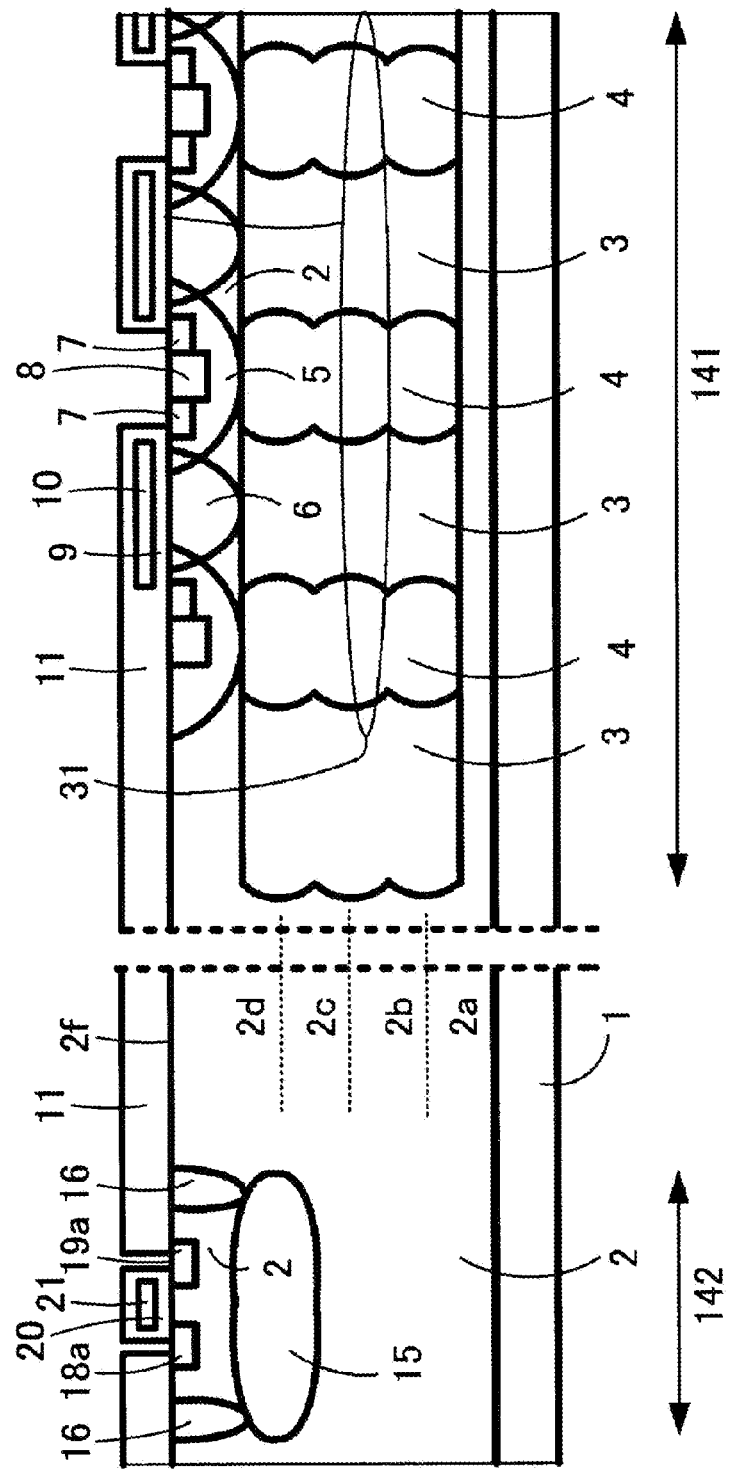
FIG. 25 is a sectional view showing a semiconductor device manufacturing method according to Embodiment 17 of the invention.

FIG. 25 is a sectional view showing a semiconductor device manufacturing method according to Embodiment 17 of the invention. In Embodiment 17, a description will be given of a method of manufacturing the semiconductor device 140 according to Embodiment 5 shown in FIG. 5.

Firstly, the semiconductor device manufacturing method according to Embodiment 13 is carried out as far as the step of diffusing the n-type impurity and p-type impurity by heat treatment, thereby forming the parallel pn-layer 31 and n-buried isolating layer 15 (refer to FIG. 13(a) to FIG. 15(g)).

Next, continuing from the step of forming the parallel pn-layer 31 and n-buried isolating layer 15 (the step of FIG. 15(g)), the p-well region 5, n-drift region 6, n-source region 7, p-contact region 8, gate oxide film 9, gate electrode 10, inter layer dielectric 11, source electrode (not shown), and the like, of the vertical super junction MOSFET 141 are formed in the first region S1 of the n⁻ semiconductor layer 2d, which is the topmost layer of the n⁻ semiconductor layer 2. That is, the planar gate structure of the vertical super junction MOSFET 141 is formed. Also, the n-diffused isolating layer 16 reaching the n-buried isolating layer 15 is formed in the second region S2 of the n⁻ semiconductor layer 2d.

Then, the p-source region 18a, p-drain region 19a, gate oxide film 20, gate electrode 21, source electrode (not shown), drain electrode, and the like, of the lateral MOSFET 142 are formed, with the n⁻ semiconductor layer 2 bounded by the n-buried isolating layer 15 and n-diffused isolating layer 16 of the n⁻ semiconductor layer 2 as an n-well region. That is, the planar gate structure of the lateral MOSFET 142 is formed (FIG. 25). Next, by the drain electrode 13 being formed on the rear surface of the n⁺ semiconductor layer 1, the semiconductor device 140 shown in FIG. 5 is completed.

As heretofore described, according to Embodiment 17, it is possible to obtain the same advantages as with the semiconductor device manufacturing method according to Embodiment 13.

Embodiment 18

Figure 26:
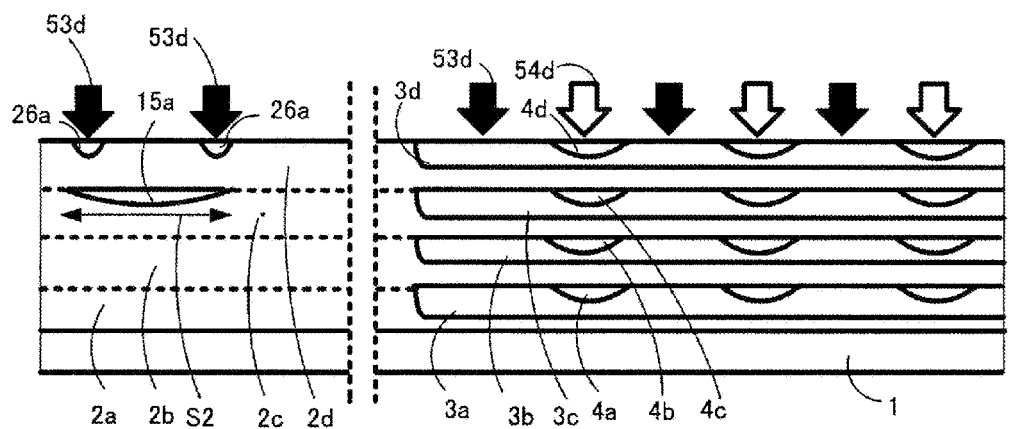
FIGS. 26(a) and 26(b) are sectional views showing, in step order, a semiconductor device manufacturing method according to Embodiment 18 of the invention.
Figure 26:
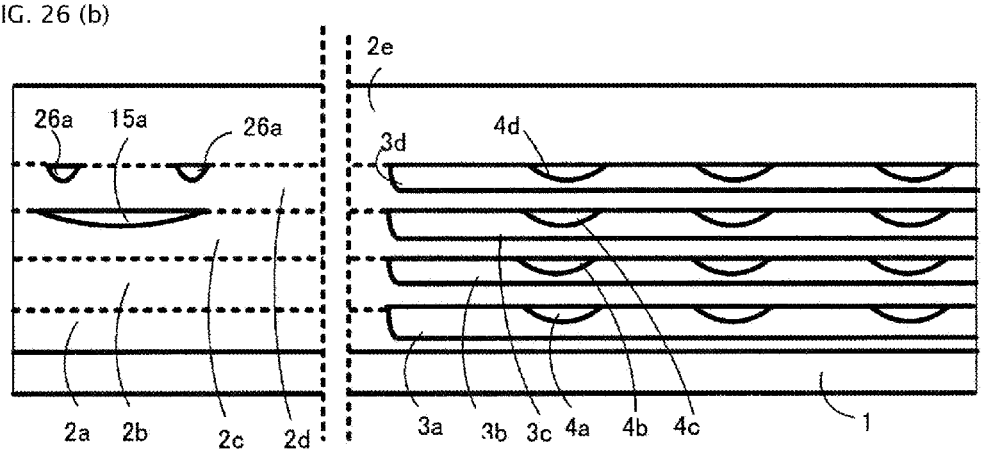
Figure 27:
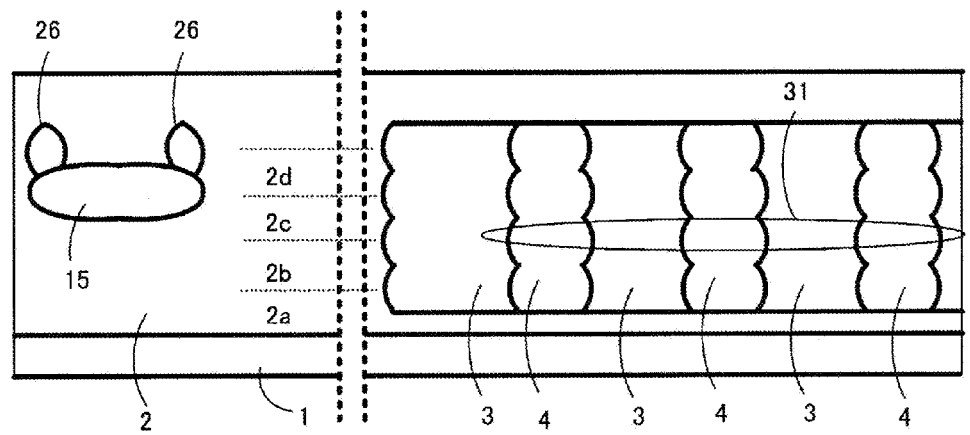
FIGS. 27(c) and 27(d) are sectional views showing, in step order, the semiconductor device manufacturing method according to Embodiment 18 of the invention.
Figure 27:
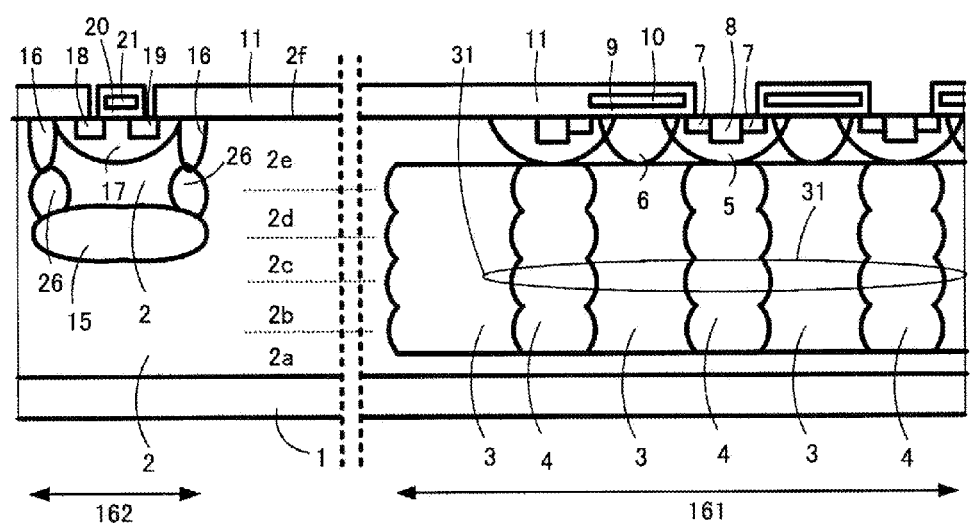

FIG. 26 and FIG. 27 are sectional views showing, in step order, a semiconductor device manufacturing method according to Embodiment 18 of the invention. In Embodiment 18, a description will be given of a method of manufacturing the semiconductor device according to Embodiment 7 shown in FIG. 7.

Firstly, the semiconductor device manufacturing method according to Embodiment 13 is carried out as far as the step of forming the n⁻ semiconductor layer 2d (refer to FIG. 13(a) to FIG. 14(f)). Next, continuing from the step of forming the n⁻ semiconductor layer 2d (the step of FIG. 14(f)), an n-type impurity ion implantation 53d is carried out throughout the whole of the first region S1 of the n⁻ semiconductor layer 2d, and into a region of the second region S2 of the n⁻ semiconductor layer 2d in which the n-layer 26 is to be formed.

The ion implantation 53d into the second region S2 of the n⁻ semiconductor layer 2d is, for example, carried out into a region corresponding to an outer peripheral portion of the n-type ion implantation layer 15a provided in a surface layer of the n⁻ semiconductor layer 2c. Because of this, an n-type ion implantation layer 3d is formed in a surface layer of the first region S1 of the n⁻ semiconductor layer 2d, and an n-type ion implantation layer 26a is selectively formed in the second region S2 of the n⁻ semiconductor layer 2d.

Then, a p-type impurity ion implantation 54d is selectively carried out into regions of the n-type ion implantation layer 3d directly above the p-type ion implantation layers 4c, forming a plurality of p-type ion implantation layers 4d in a surface layer of the n-type ion implantation layer 3d (FIG. 26(a)). The dose of the p-type impurity of the ion implantation 54d into the n-type ion implantation layer 3d is a dose larger than the dose of the n-type impurity of the ion implantation 53d into the n⁻ semiconductor layer 2d when forming the n-type ion implantation layer 3d.

Next, an n⁻ semiconductor layer 2e is epitaxially grown, without doping, on the n⁻ semiconductor layer 2d (FIG. 26(b)). Next, the n-type ion implantation layers 3a to 3d, 15a, and 26a and the p-type ion implantation layers 4a to 4d formed in the n⁻ semiconductor layers 2a to 2d are activated by heat treatment, thus diffusing the n-type impurity and p-type impurity ion implanted into each of the n⁻ semiconductor layers 2a to 2d (FIG. 27(c)).

Because of this, each of the group of n-type ion implantation layers 3a to 3d and the group of p-type ion implantation layers 4a to 4d formed in the first region S1 of each of the n⁻ semiconductor layers 2a to 2d connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2.

The parallel pn-layer 31 formed in the first region S1 of the n⁻ semiconductor layer 2 is of a super junction structure. It is preferable that the parallel pn-layer 31 is formed so that the impurity concentration thereof is practically equivalent to that of the n-layer 3 and p-layer 4 configuring the parallel pn-layer 31. The reason for this is as follows. By the impurity concentration of the parallel pn-layer 31 being practically equivalent to that of the n-layer 3 and p-layer 4 configuring the parallel pn-layer 31, a depletion layer spreads throughout the whole of the n-layer 3 and p-layer 4 when voltage is applied. Because of this, by reducing the thickness of the parallel pn-layer 31 in comparison with when the drift layer is formed of only the n-layer, and increasing the impurity concentration of the n-layer 3 in comparison with when the drift layer is formed of only the n-layer, it is possible to improve the trade-off between breakdown voltage and on-state voltage (on-state resistance).

Also, owing to the heat treatment by which the parallel pn-layer 31 is formed, the n-type ion implantation layer 15a formed in the second region S2 of the n⁻ semiconductor layer 2c diffuses inside the n⁻ semiconductor layers 2c and 2d, whereby the n-buried isolating layer 15 is formed across the n⁻ semiconductor layers 2c and 2d. Furthermore, the n-type ion implantation layer 26a formed in the second region S2 of the n⁻ semiconductor layer 2d is activated, thereby forming the n-buried isolating layer 15 and the n-layer 26 in contact with an outer peripheral portion of the n-buried isolating layer 15.

The n-type impurity and p-type impurity ion implanted into each of the n⁻ semiconductor layers 2a to 2d also diffuse to the n⁻ semiconductor layer 2a, which is the bottommost layer of the n⁻ semiconductor layer 2, and to the n⁻ semiconductor layer 2e, which is the topmost layer of the n⁻ semiconductor layer 2. That is, the n-layer 3 and p-layer 4 are formed across the n⁻ semiconductor layers 2a to 2d.

Next, the p-well region 5, n-drift region 6, n-source region 7, p-contact region 8, gate oxide film 9, gate electrode 10, inter layer dielectric 11, source electrode (not shown), and the like, of the vertical super junction MOSFET 161 are formed in the first region S1 of the n⁻ semiconductor layer 2e, which is the topmost layer of the n⁻ semiconductor layer 2. That is, the planar gate structure of the vertical super junction MOSFET 161 is formed. Also, the n-diffused isolating layer 16 in contact with the n-layer 26 is formed in the second region S2 of the n⁻ semiconductor layer 2e.

Then, the p-well region 17, n-source region 18, n-drain region 19, gate oxide film 20, gate electrode 21, source electrode (not shown), drain electrode (not shown), and the like, of the lateral MOSFET 162 are formed in a region of the n⁻ semiconductor layer 2 bounded by the n-layer 26, n-buried isolating layer 15, and n-diffused isolating layer 16. That is, the planar gate structure of the lateral MOSFET 162 is formed (FIG. 27(d)). Next, by the drain electrode 13 being formed on the rear surface of the n⁺ semiconductor layer 1, the semiconductor device 160 shown in FIG. 7 is completed.

As heretofore described, according to Embodiment 18, it is possible to obtain the same advantages as with the semiconductor device manufacturing method according to Embodiment 13.

Embodiment 19

Figure 28:
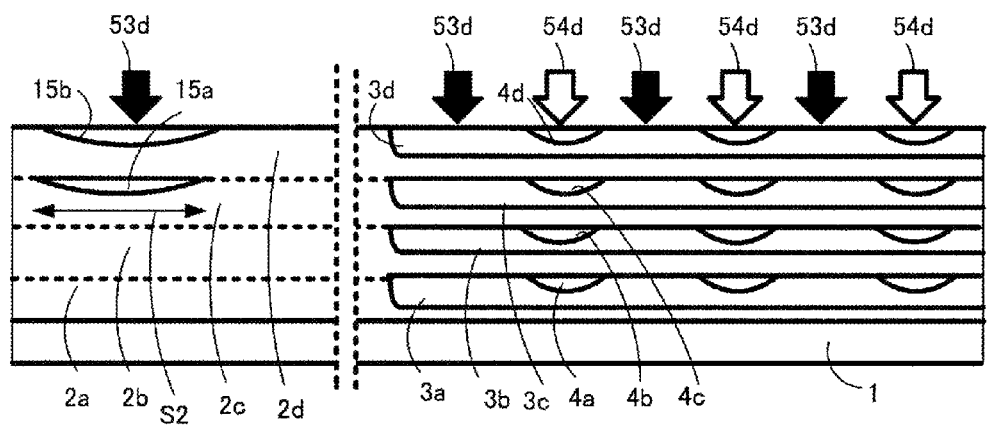
FIGS. 28(a) and 28(b) are sectional views showing, in step order, a semiconductor device manufacturing method according to Embodiment 19 of the invention.
Figure 28:
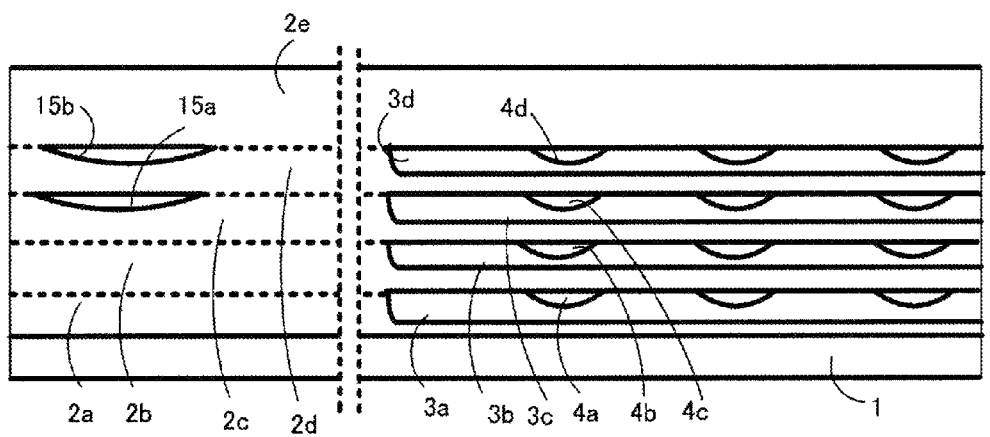
Figure 29:
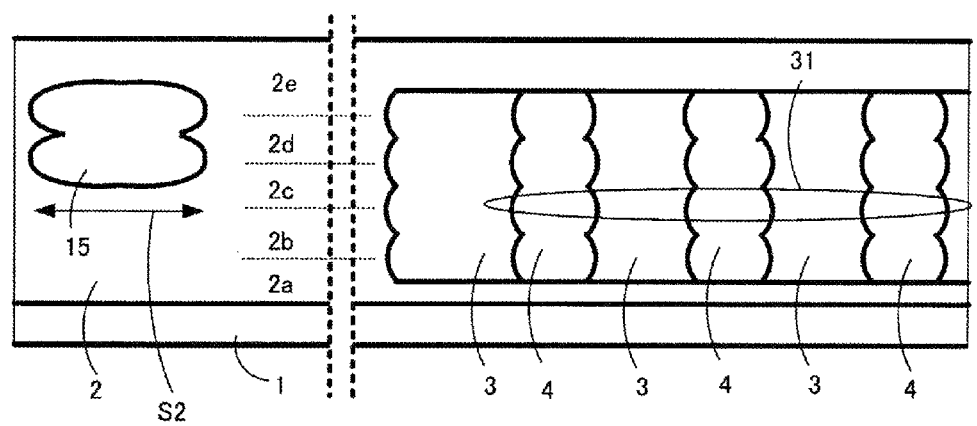
FIGS. 29(c) and 29(d) are sectional views showing, in step order, the semiconductor device manufacturing method according to Embodiment 19 of the invention.
Figure 29:
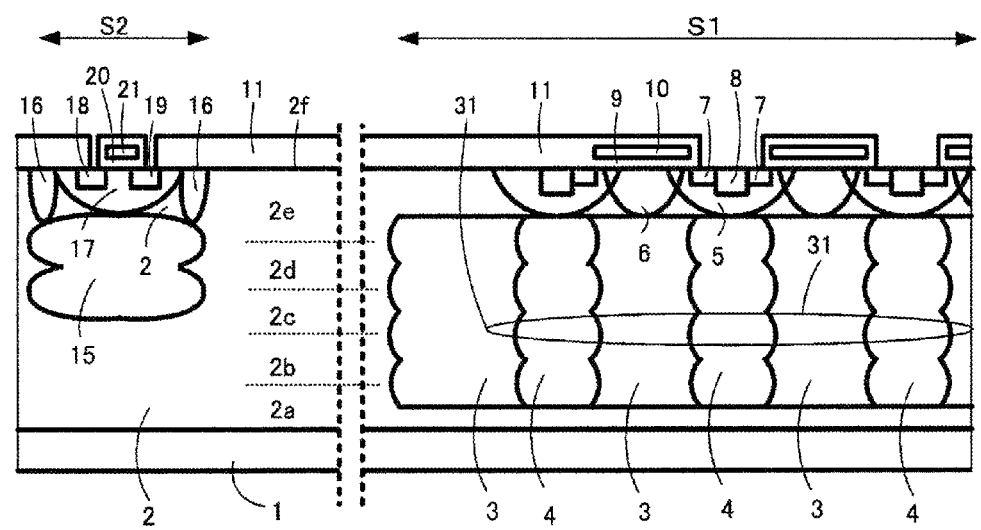

FIG. 28 and FIG. 29 are sectional views showing, in step order, a semiconductor device manufacturing method according to Embodiment 19 of the invention. In Embodiment 19, a description will be given of a method of manufacturing the semiconductor device 170 according to Embodiment 8 shown in FIG. 8.

Firstly, the semiconductor device manufacturing method according to Embodiment 13 is carried out as far as the step of forming the n⁻ semiconductor layer 2d (refer to FIG. 13(a) to FIG. 14(f)). Next, continuing from the step of forming the n⁻ semiconductor layer 2d (the step of FIG. 14(f)), the n-type impurity ion implantation 53d is carried out throughout the whole of the first region S1 of the n⁻ semiconductor layer 2d, and throughout the whole of the second region S2, in which the n-buried isolating layer 15 is to be formed. Because of this, the n-type ion implantation layer 3d is formed in a surface layer of the first region S1 of the n⁻ semiconductor layer 2d, and an n-type ion implantation layer 15b is formed in a surface layer of the second region S2 of the n⁻ semiconductor layer 2d.

Then, the p-type impurity ion implantation 54d is selectively carried out into regions of the n-type ion implantation layer 3d directly above the p-type ion implantation layers 4c, forming a plurality of p-type ion implantation layers 4d in a surface layer of the n-type ion implantation layer 3d (FIG. 28(a)). The p-type ion implantation layers 4a to 4d are formed so as to be aligned in a vertical direction with respect to a main surface of the semiconductor substrate formed of the n⁻ semiconductor layers 2a to 2c configuring the n⁻ semiconductor layer 2. The dose of the p-type impurity of the ion implantation 54d into the n-type ion implantation layer 3d is a dose larger than the dose of the n-type impurity of the ion implantation 53d into the n⁻ semiconductor layer 2d when forming the n-type ion implantation layer 3d.

Next, the n⁻ semiconductor layer 2e is epitaxially grown, without doping, on the n⁻ semiconductor layer 2d (FIG. 28(b)). Next, the n-type ion implantation layers 3a to 3d, 15a, and 15b and the p-type ion implantation layers 4a to 4d formed in the n⁻ semiconductor layers 2a to 2d are activated by heat treatment, thus diffusing the n-type impurity and p-type impurity ion implanted into each of the n⁻ semiconductor layers 2a to 2d.

Because of this, each of the group of n-type ion implantation layers 3a to 3d and the group of p-type ion implantation layers 4a to 4d formed in the first region S1 of each of the n⁻ semiconductor layers 2a to 2d connects in a vertical direction with respect to the main surface of the n⁻ semiconductor layer 2, forming the n-layer 3 and p-layer 4 respectively. Consequently, the parallel pn-layer 31 formed by the n-layer 3 and p-layer 4 being repeatedly alternately disposed is formed in the first region S1 of the n⁻ semiconductor layer 2.

Also, the n-type ion implantation layers 15a and 15b formed in the second region S2 of the n⁻ semiconductor layers 2c and 2d diffuse and connect inside the n⁻ semiconductor layers 2c to 2e, whereby the n-buried isolating layer 15 is formed across the n⁻ semiconductor layers 2c to 2e (FIG. 29(c)). The n-type impurity and p-type impurity ion implanted into each of the n⁻ semiconductor layers 2a to 2d also diffuse to the n⁻ semiconductor layer 2a, which is the bottommost layer of the n⁻ semiconductor layer 2, and to the n⁻ semiconductor layer 2e, which is the topmost layer of the n⁻ semiconductor layer 2. That is, the n-layer 3 and p-layer 4 are formed across the n⁻ semiconductor layers 2a to 2e.

Next, the p-well region 5, n-drift region 6, n-source region 7, p-contact region 8, gate oxide film 9, gate electrode 10, inter layer dielectric 11, source electrode (not shown), and the like, of the vertical super junction MOSFET 171 are formed in the first region S1 of the n⁻ semiconductor layer 2e, which is the topmost layer of the n⁻ semiconductor layer 2. That is, the planar gate structure of the vertical super junction MOSFET 171 is formed. Also, the n-diffused isolating layer 16 reaching the n-buried isolating layer 15 is formed in the second region S2 of the n⁻ semiconductor layer 2e.

Then, the p-well region 17, n-source region 18, n-drain region 19, gate oxide film 20, gate electrode 21, source electrode (not shown), drain electrode (not shown), and the like, of the lateral MOSFET 172 are formed in a region of the n⁻ semiconductor layer 2 bounded by the n-buried isolating layer 15 and n-diffused isolating layer 16. That is, the planar gate structure of the lateral MOSFET 172 is formed (FIG. 29(d)). Next, by the drain electrode 13 being formed on the rear surface of the n⁺ semiconductor layer 1, the semiconductor device 170 shown in FIG. 8 is completed.

As heretofore described, according to Embodiment 19, it is possible to obtain the same advantages as with the semiconductor device manufacturing method according to Embodiment 13.

Embodiment 20

Figure 30:
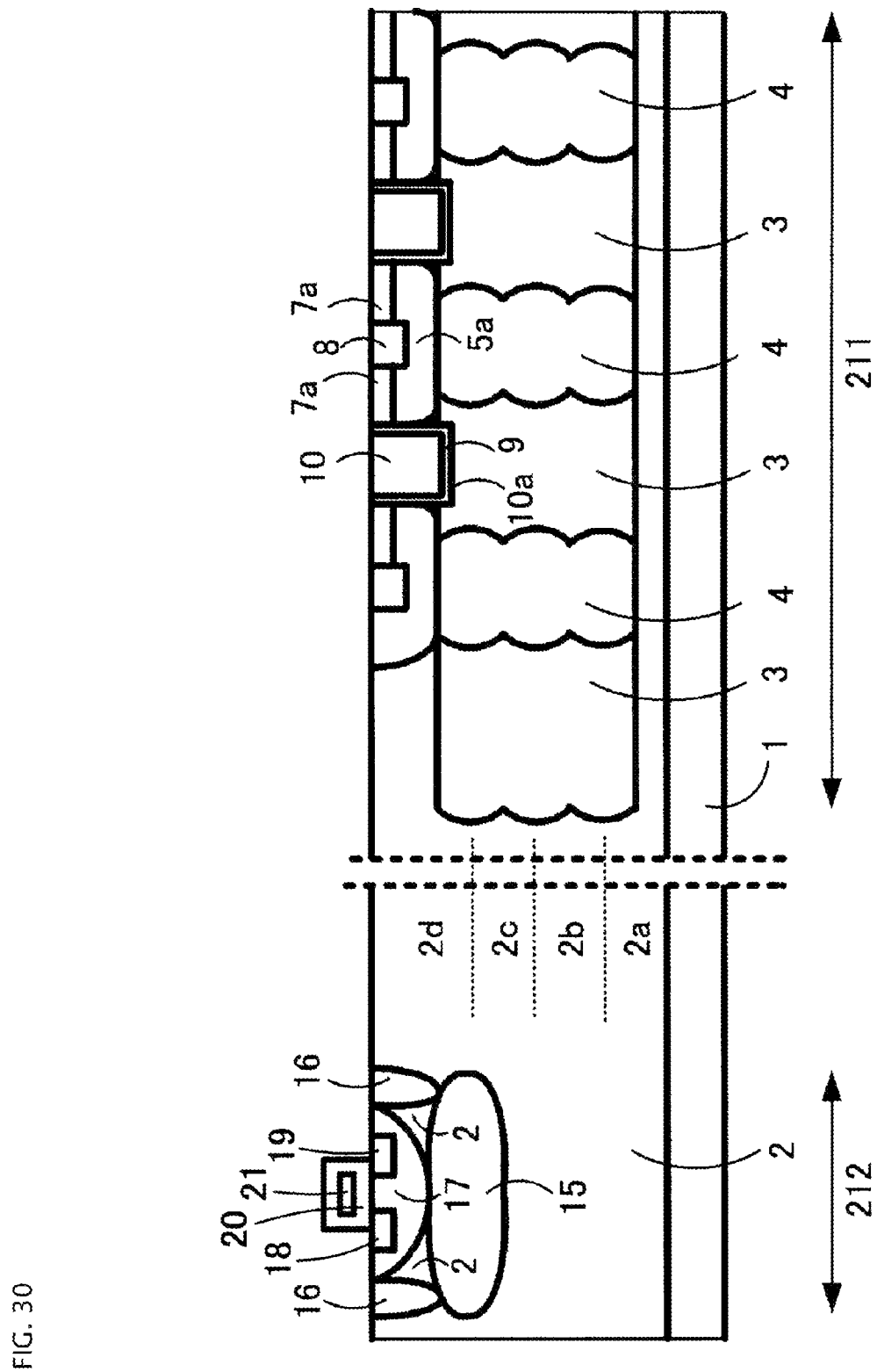
FIG. 30 is a sectional view showing a semiconductor device manufacturing method according to Embodiment 20 of the invention.
Figure 31:
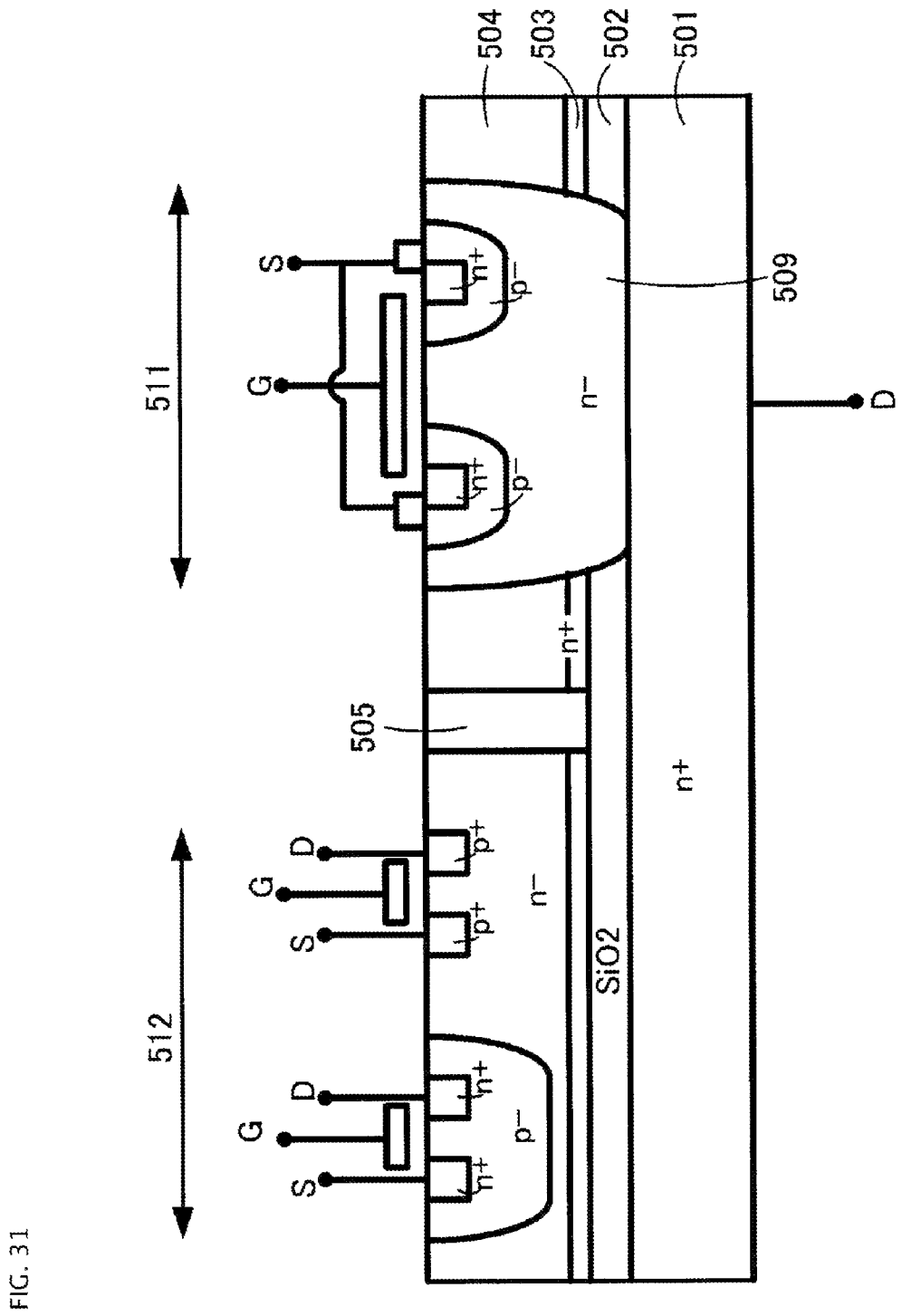
FIG. 31 is a sectional view showing a configuration of a main portion of a heretofore known intelligent switching device using dielectric isolating technology.
Figure 32:
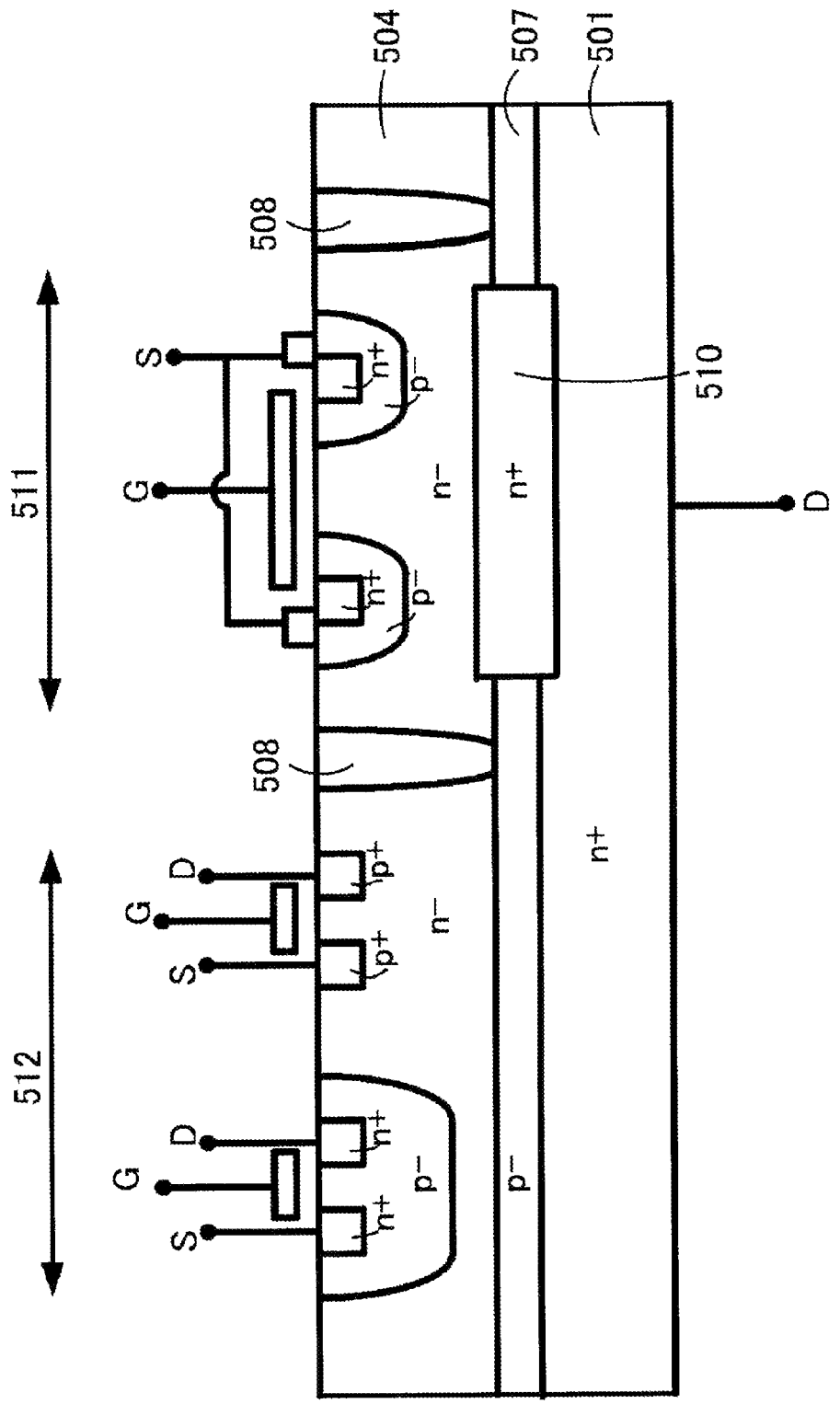
FIG. 32 is a sectional view showing a configuration of a main portion of a heretofore known intelligent switching device using pn-junction isolating technology.
Figure 33:
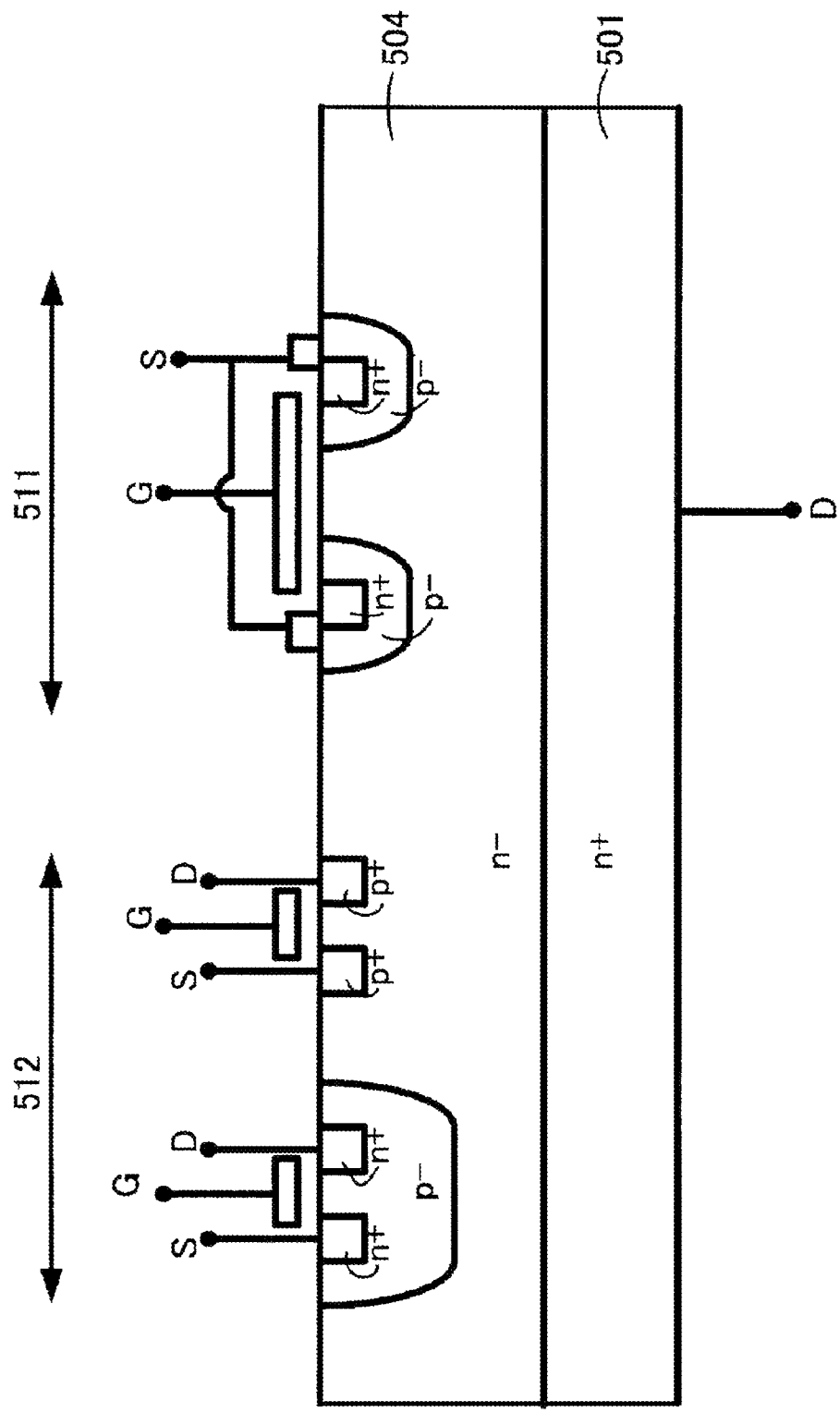
FIG. 33 is a sectional view showing a configuration of a main portion of another heretofore known intelligent switching device using pn-junction isolating technology.

FIG. 30 is a sectional view showing a semiconductor device manufacturing method according to Embodiment 20 of the invention. In Embodiment 20, a description will be given of a method of manufacturing the semiconductor device 210 according to Embodiment 12 shown in FIG. 12.

Firstly, the semiconductor device manufacturing method according to Embodiment 13 is carried out as far as the step of diffusing the n-type impurity and p-type impurity by heat treatment, thereby forming the parallel pn-layer 31 and n-buried isolating layer 15 (refer to FIG. 13(a) to FIG. 15(g)).

Next, continuing from the step of forming the parallel pn-layer 31 and n-buried isolating layer 15 (the step of FIG. 15(g)), a p-well region 5a of the vertical super junction MOSFET 211 is formed in a surface layer of the first region S1 of the n⁻ semiconductor layer 2d, which is the topmost layer of the n⁻ semiconductor layer 2. The p-well region 5a is formed directly above the p-layer 4 so as to be in contact with the p-layer 4. Next, an n-source region 7a is selectively formed in a surface layer of the p-well region 5a.

Next, the trench 10a reaching the n-layer 3 is formed in the first region S1 of the n⁻ semiconductor layer 2. Next, the gate electrode 10 is embedded in the trench 10a across the gate oxide film 9, thereby forming a trench gate structure. That is, the trench gate structure of the vertical super junction MOSFET 211 is formed. Next, the n-diffused isolating layer 16 in contact with the n-buried isolating layer 15 is formed in the second region S2 of the n⁻ semiconductor layer 2.

Then, the p-well region 17, n-source region 18, n-drain region 19, gate oxide film 20, gate electrode 21, source electrode (not shown), drain electrode (not shown), and the like, of the lateral MOSFET 212 are formed in a region of the n⁻ semiconductor layer 2 bounded by the n-buried isolating layer 15 and n-diffused isolating layer 16. That is, the planar gate structure of the lateral MOSFET 212 is formed (FIG. 30). Next, by the drain electrode 13 being formed on the rear surface of the n⁺ semiconductor layer 1, the semiconductor device 210 shown in FIG. 12 is completed.

As heretofore described, according to Embodiment 20, it is possible to obtain the same advantages as with the semiconductor device manufacturing method according to Embodiment 13.

In each of the heretofore described embodiments, the edge termination structure of the vertical super junction MOSFET is formed on the outer side of the first region S1 of the n⁻ semiconductor layer 2 so as to surround the first region S1. Heretofore known technology can be used as appropriate for the configuration of the edge termination structure and the method of manufacturing the edge termination structure.

With the semiconductor devices 100 to 210 according to Embodiment 1 to Embodiment 12, it is possible to realize an intelligent super junction semiconductor element wherein a vertical super junction element and a control integrated circuit are integrated on the same semiconductor substrate.

Heretofore, a description of the invention has been given using as an example a semiconductor device wherein one lateral MOSFET is formed on a semiconductor substrate on which a vertical super junction MOSFET is formed but, not being limited to the heretofore described embodiments, the invention can also be applied to a semiconductor device wherein a vertical super junction MOSFET and a plurality of lateral MOSFETs are formed on the same semiconductor substrate.

Industrial Applicability

As heretofore described, the semiconductor device and manufacturing method thereof according to the invention are useful in a semiconductor device wherein a lateral semiconductor element and a super junction vertical semiconductor element are formed on the same substrate.

Thus, a semiconductor device and method manufacturing have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

REFERENCE NUMBER LIST 1 n⁺ semiconductor layer
2, 2a, 2b, 2c, 2d, 2e n⁻ semiconductor layer
2f, 2g Main surface
3, 26 n-layer
3a, 3b, 3c, 3d, 15a, 15b, 26a n-type ion implantation layer
4 p-layer
4a, 4b, 4c, 4d p-type ion implantation layer
5, 5a, 17 p-well region
6 n-drift region
7, 7a, 18 n-source region
8 p-contact region 9, 10b, 20 Gate oxide film
10, 21 Gate electrode
10a, 27a Trench
11 Inter layer dielectric
12, 22 Source electrode
13, 23 Drain electrode
15, 28 n-buried isolating layer
16, 16a n-diffused isolating layer
18a p-source region
19a p-drain region
19 n-drain region
24 p-buried isolating layer
25 p-diffused isolating layer
27 Trench isolating structure
27a Trench
31 Parallel pn-layer
40 Vertical direction with respect to main surface
41 Horizontal direction with respect to main surface
53a, 53b, 53c, 53d n-type impurity ion implantation
54a, 54b, 54c, 54d p-type impurity ion implantation
100, 110, 120, 130, 140, 150, 160, 170, 180, 190, 200, 210 Semiconductor device
101, 111, 121, 131, 141, 151, 161, 171, 181, 191, 201, 211 Vertical super junction MOSFET
102, 112, 122, 132, 142, 152, 162, 172, 182, 192, 202, 212 Lateral MOSFET
S1 First region
S2 Second region

What is claimed is:

1. A semiconductor device having a first region in which a vertical semiconductor element is disposed and a second region in which a lateral semiconductor element electrically isolated from the vertical semiconductor element by an isolating structure is disposed, the semiconductor device comprising:
   a first conductivity type first semiconductor layer;
   a first conductivity type second semiconductor layer, provided on a surface of the first semiconductor layer, with an impurity concentration lower than that of the first semiconductor layer;
   a parallel pn-layer, provided in a first region of the second semiconductor layer, formed by a first conductivity type third semiconductor layer with an impurity concentration higher than that of the second semiconductor layer and a second conductivity type fourth semiconductor layer with an impurity concentration higher than that of the second semiconductor layer being alternately disposed in a horizontal direction with respect to a main surface of the second semiconductor layer; and
   an isolating structure comprising a buried isolating layer provided in a second region of the second semiconductor layer and having an impurity concentration the same as that of either the third semiconductor layer or fourth semiconductor layer.

2. The semiconductor device according to claim 1, wherein
   the third semiconductor layer is a diffusion layer selectively provided in the second semiconductor layer,
   the fourth semiconductor layer is a diffusion layer selectively provided in the third semiconductor layer, and
   the isolating structure is a diffusion layer having an impurity concentration the same as that of either the third semiconductor layer or fourth semiconductor layer.

3. The semiconductor device according to claim 1, wherein
   the third semiconductor layer and fourth semiconductor layer are diffusion layers selectively provided in the second semiconductor layer, and
   the isolating structure is a diffusion layer having an impurity concentration the same as that of either the third semiconductor layer or fourth semiconductor layer.

4. The semiconductor device according to claim 1, wherein
   the third semiconductor layer and isolating structure are formed in the same layer, which is an epitaxial layer, and
   the fourth semiconductor layer is a diffusion layer, selectively provided in the third semiconductor layer, with an impurity concentration higher than that of the third semiconductor layer.

5. The semiconductor device according to claim 1, wherein the vertical semiconductor element is an insulated gate field effect transistor having either a planar gate structure or a trench gate structure.

6. The semiconductor device according to claim 1, wherein an edge termination structure of the vertical semiconductor element is provided on an outer edge of the first region and surrounds the first region.

* * * * *